(12) United States Patent
Tsutsumi et al.

(10) Patent No.: US 8,080,852 B2
(45) Date of Patent: *Dec. 20, 2011

(54) SEMICONDUCTOR DEVICE AND METHOD OF MANUFACTURING THE SAME

(75) Inventors: Tomohiko Tsutsumi, Kawasaki (JP); Taiji Ema, Kawasaki (JP); Hideyuki Kojima, Kawasaki (JP); Toru Anezaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/965,422

(22) Filed: Dec. 10, 2010

(65) Prior Publication Data

US 2011/0073950 A1  Mar. 31, 2011

Related U.S. Application Data

(63) Continuation of application No. 11/944,073, filed on Nov. 21, 2007, now Pat. No. 7,888,740, which is a continuation of application No. PCT/JP2005/009348, filed on May 23, 2005.

(51) Int. Cl.
*H01L 23/62* (2006.01)

(52) U.S. Cl. .................. 257/358; 257/360; 257/E27.016; 257/379

(58) Field of Classification Search ................. 257/358, 257/360, 363, 379, E27.016
See application file for complete search history.

(56) References Cited

U.S. PATENT DOCUMENTS

| | | | | |
|---|---|---|---|---|
| 5,239,195 A | * | 8/1993 | Compagne | 257/360 |
| 5,498,892 A | * | 3/1996 | Walker et al. | 257/336 |
| 6,100,127 A | * | 8/2000 | Wu | 438/238 |
| 6,111,304 A | | 8/2000 | Sonoda | |
| 6,646,324 B1 | * | 11/2003 | Dabral et al. | 257/540 |
| 6,891,210 B2 | | 5/2005 | Akiyama | |
| 7,119,405 B2 | * | 10/2006 | Chen et al. | 257/391 |
| 2003/0081363 A1 | | 5/2003 | Kawashima et al. | |
| 2004/0004229 A1 | | 1/2004 | Akiyama | |

FOREIGN PATENT DOCUMENTS

| | | | |
|---|---|---|---|
| JP | 10-074894 A | | 3/1998 |
| JP | 2000-31295 | | 1/2000 |
| JP | 2002-134630 | | 5/2002 |
| JP | 2002134630 A | * | 5/2002 |

(Continued)

OTHER PUBLICATIONS

"Korean Office Action", mailed by KPO and corresponding to Korean application No. 10-2010-7015979 on Oct. 15, 2010, with English translation.

(Continued)

*Primary Examiner* — Victor A Mandala
*Assistant Examiner* — Scott Stowe
(74) *Attorney, Agent, or Firm* — Fujitsu Patent Center

(57) ABSTRACT

The semiconductor device includes a first MIS transistor including a gate insulating film 92, a gate electrode 108 formed on the gate insulating film 92 and source/drain regions 154, a second MIS transistor including a gate insulating film 96 thicker than the gate insulating film 92, a gate electrode 108 formed on the gate insulating film 96, source/drain regions 154 and a ballast resistor 120 connected to one of the source/drain regions 154, a salicide block insulating film 146 formed on the ballast resistor 120 with an insulating film 92 thinner than the gate insulating film 96 interposed therebetween, and a silicide film 156 formed on the source/drain regions 154.

5 Claims, 40 Drawing Sheets

FOREIGN PATENT DOCUMENTS

| | | |
|---|---|---|
| JP | 2003-133433 | 5/2003 |
| JP | 2004-039775 A | 2/2004 |

OTHER PUBLICATIONS

International Search Report of PCT/JP2005/009348, date of mailing Aug. 23, 2005.

USPTO, (STOWE) Notice of Allowance and Notice of Allowability, Nov. 1, 2010, in U.S. Appl. No. 11/944,073 [now allowed].

USPTO, (STOWE) Final Rejection, Mar. 25, 2010, in U.S. Appl. No. 11/944,073 [now allowed].

USPTO, (STOWE) Non-Final Rejection, Aug. 27, 2009, in U.S. Appl. No. 11/944,073 [now allowed].

USPTO, (STOWE) Restriction Requirement, Jun. 18, 2009, in U.S. Appl. No. 11/944,073 [now allowed].

Japanese Office Action mailed Jul. 12, 2011 for corresponding Japanese Application No. 2007-517677 (in Japanese language).

\* cited by examiner

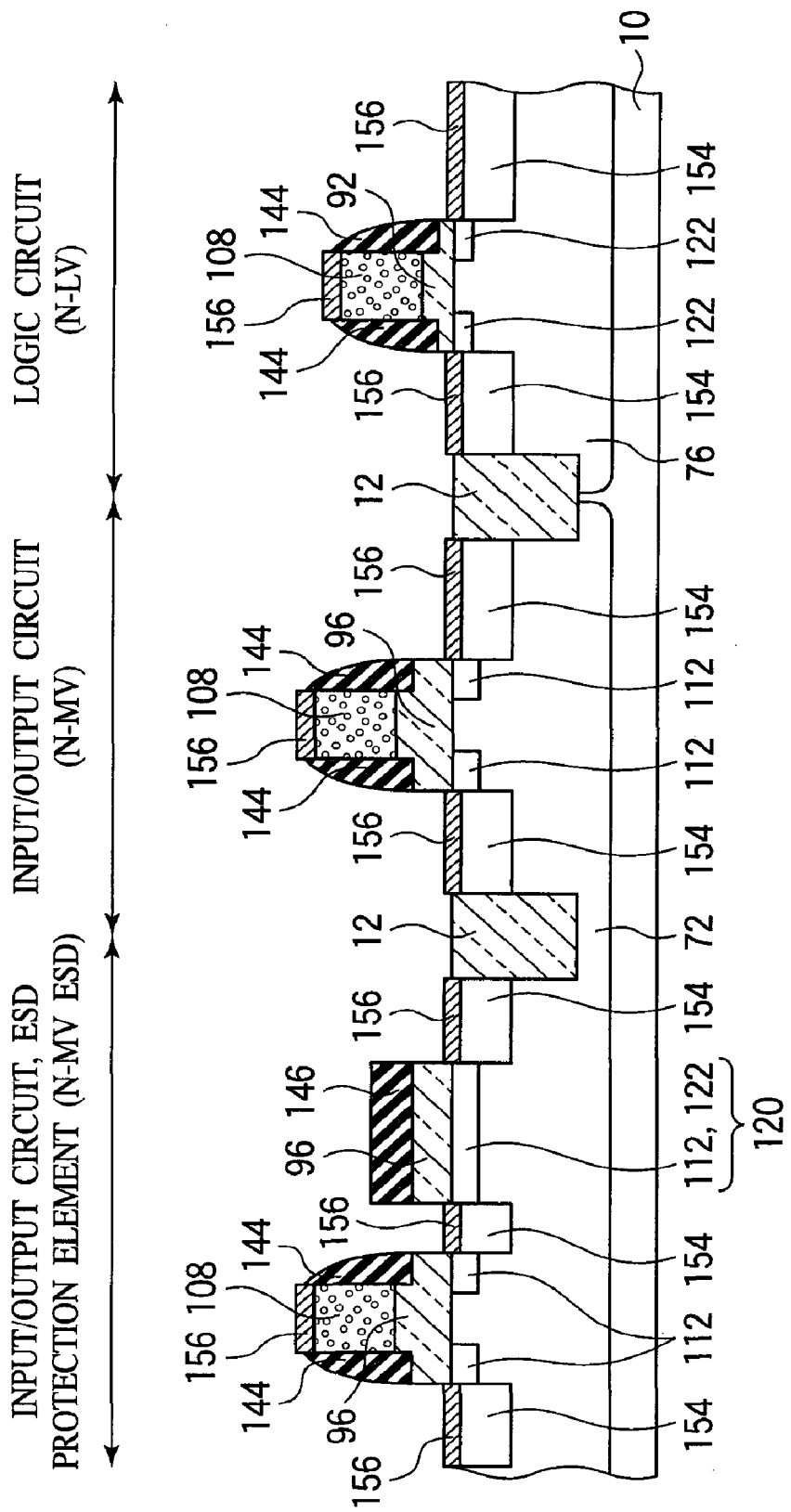

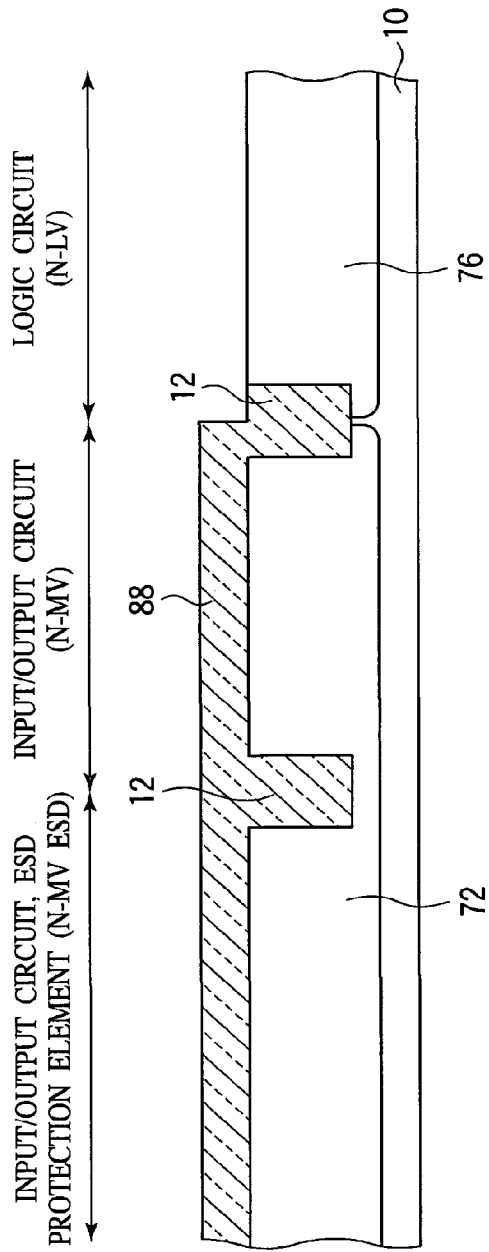
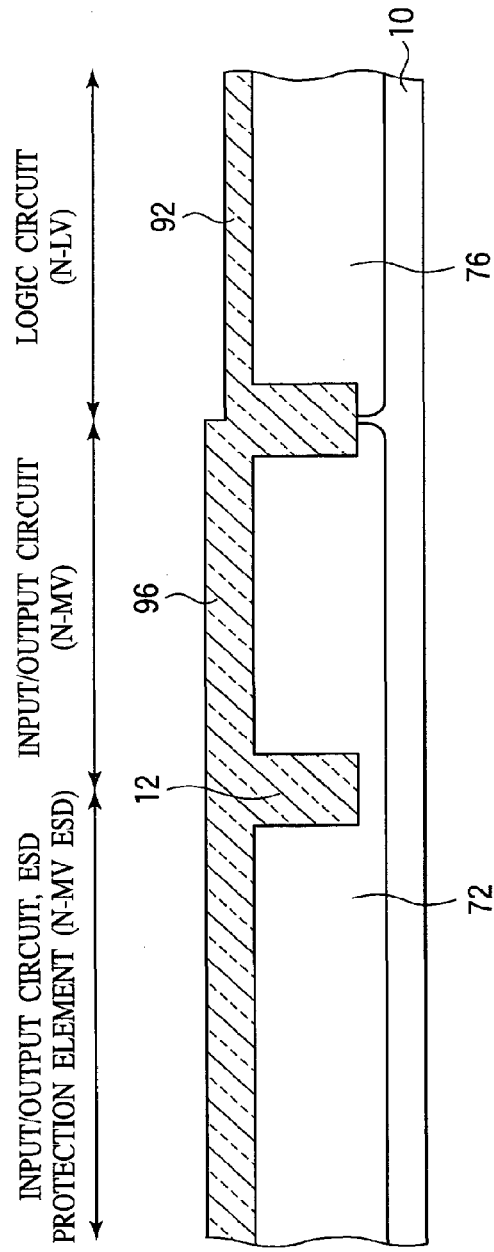
FIG. 4A
FIG. 4B

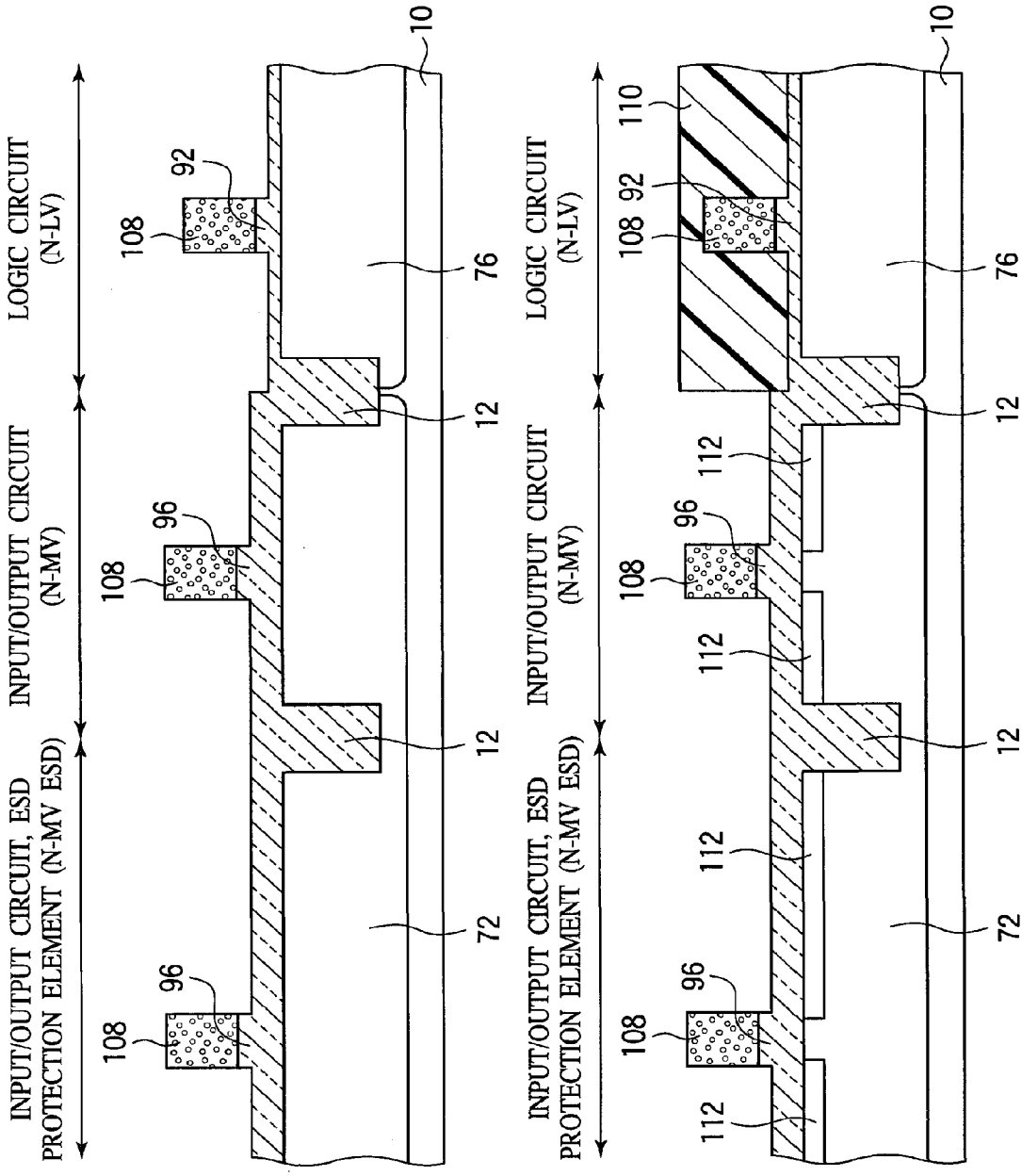

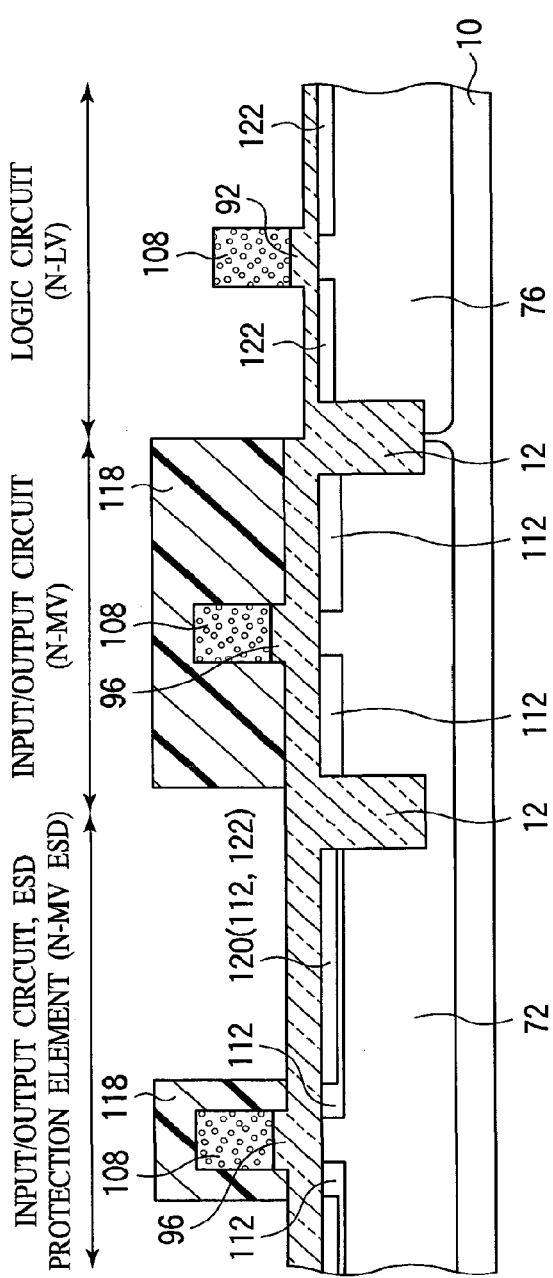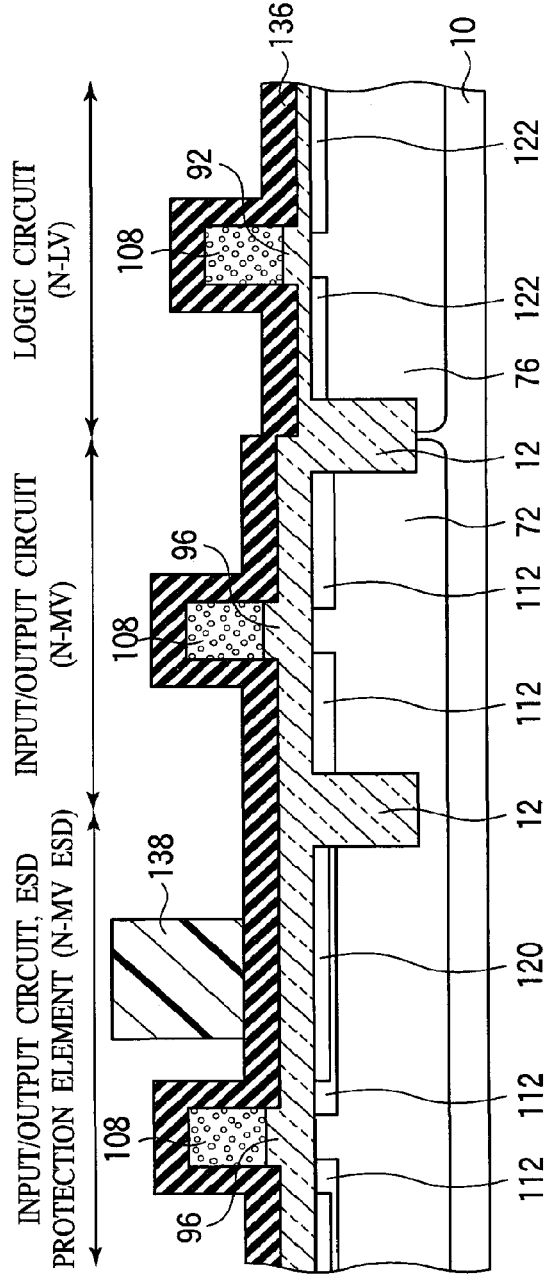

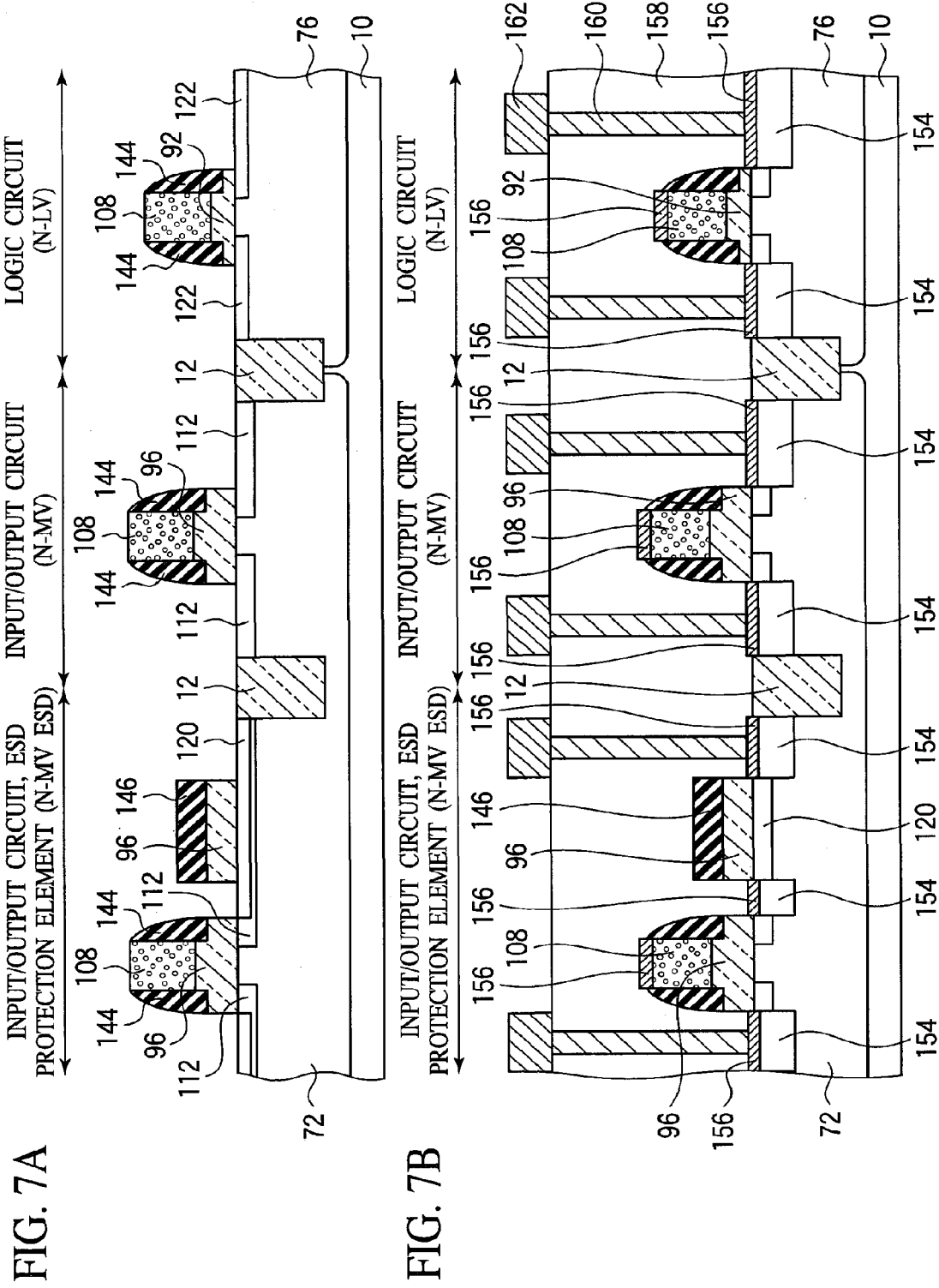

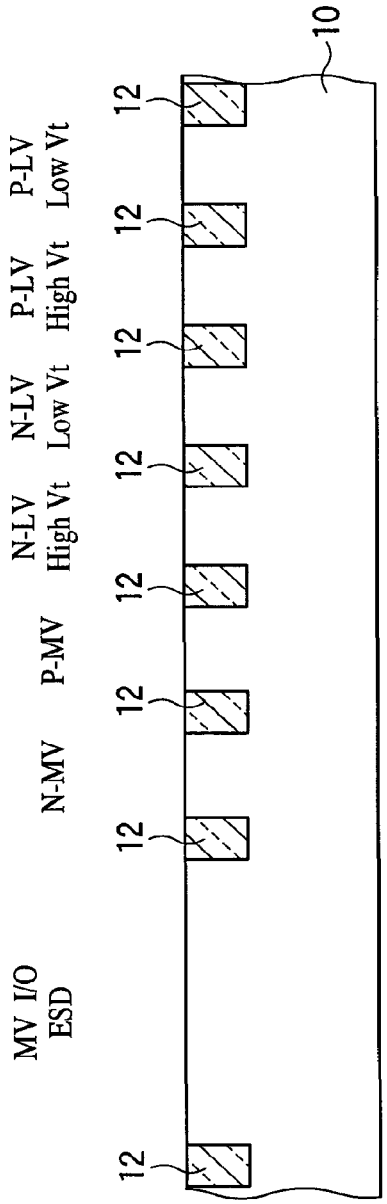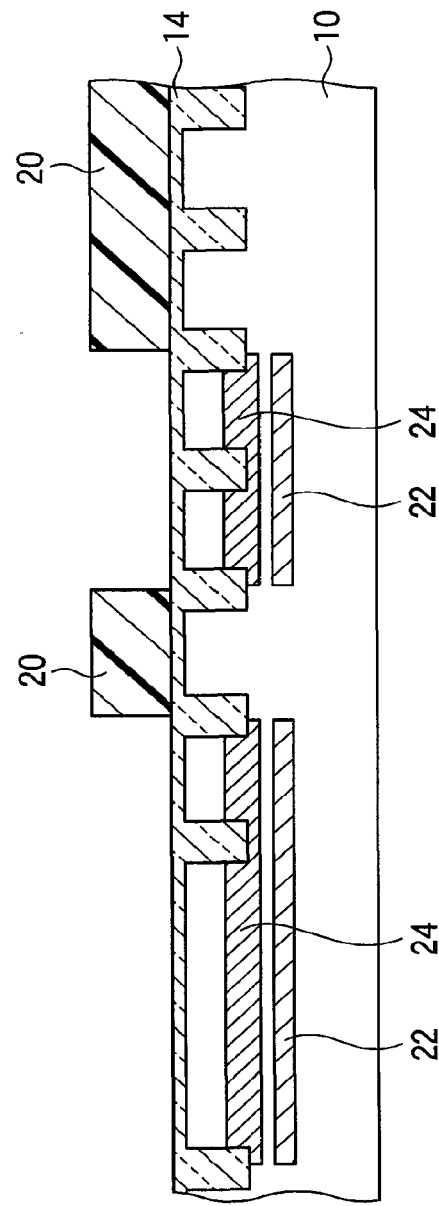
FIG. 10A
FIG. 10B

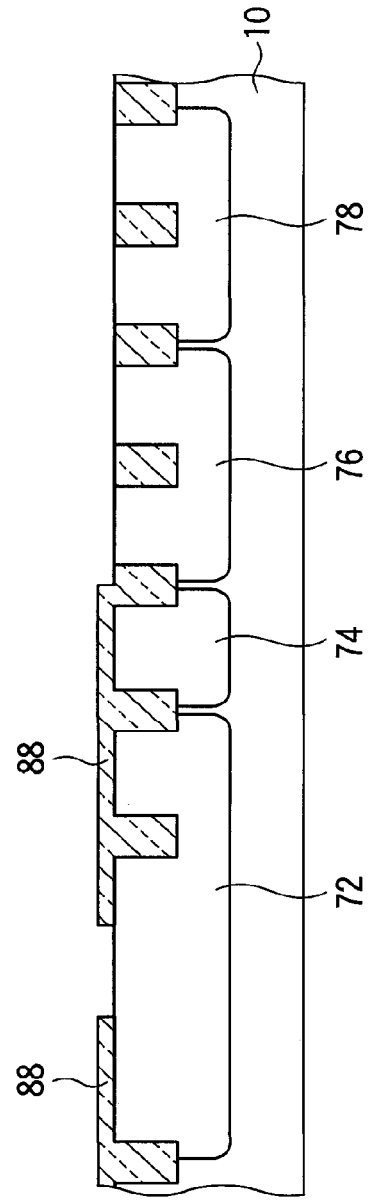
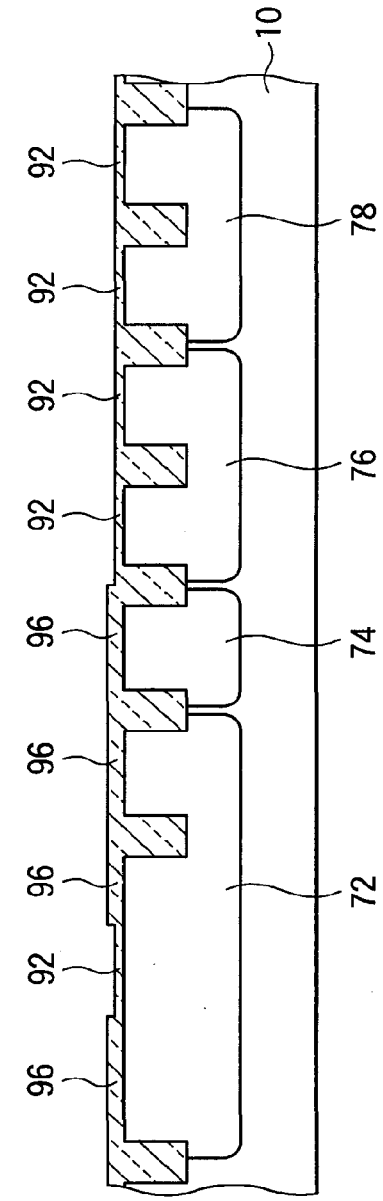
FIG. 15A
FIG. 15B

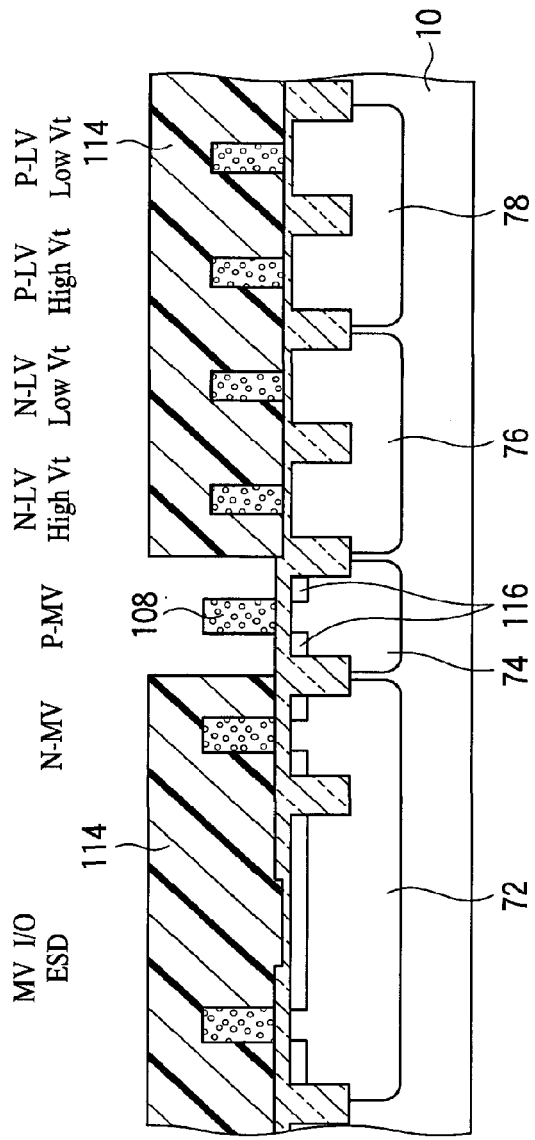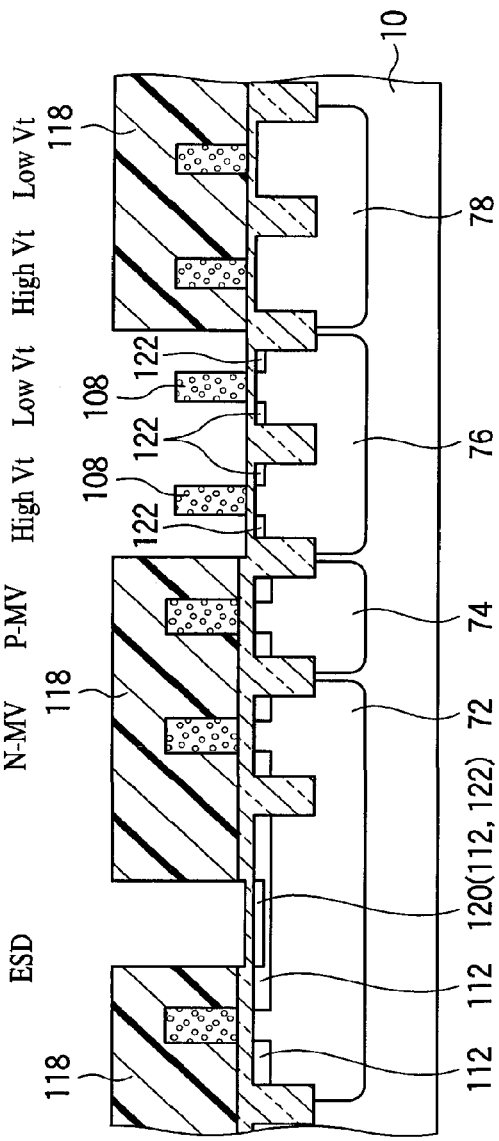

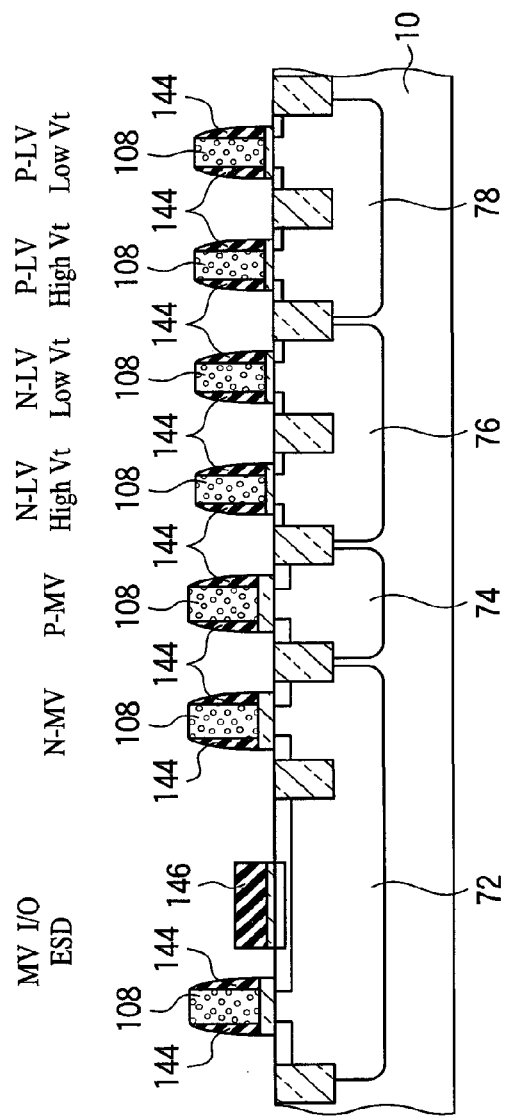
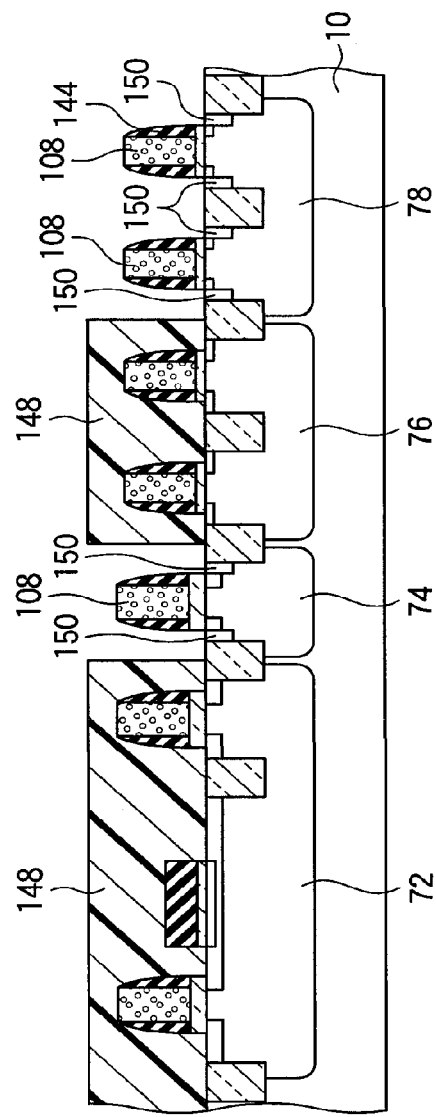
FIG. 19A
FIG. 19B

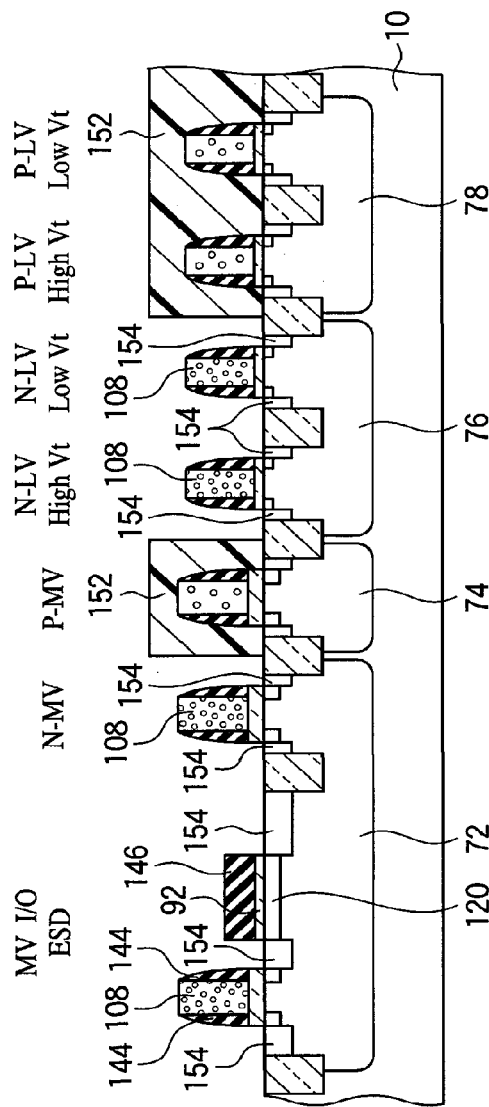
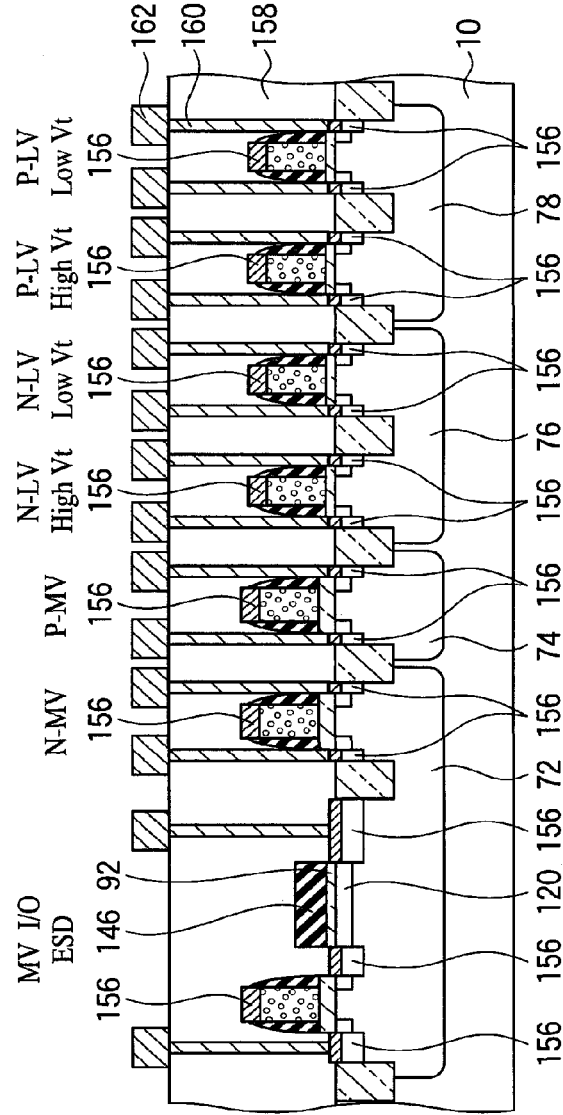
FIG. 20A
FIG. 20B

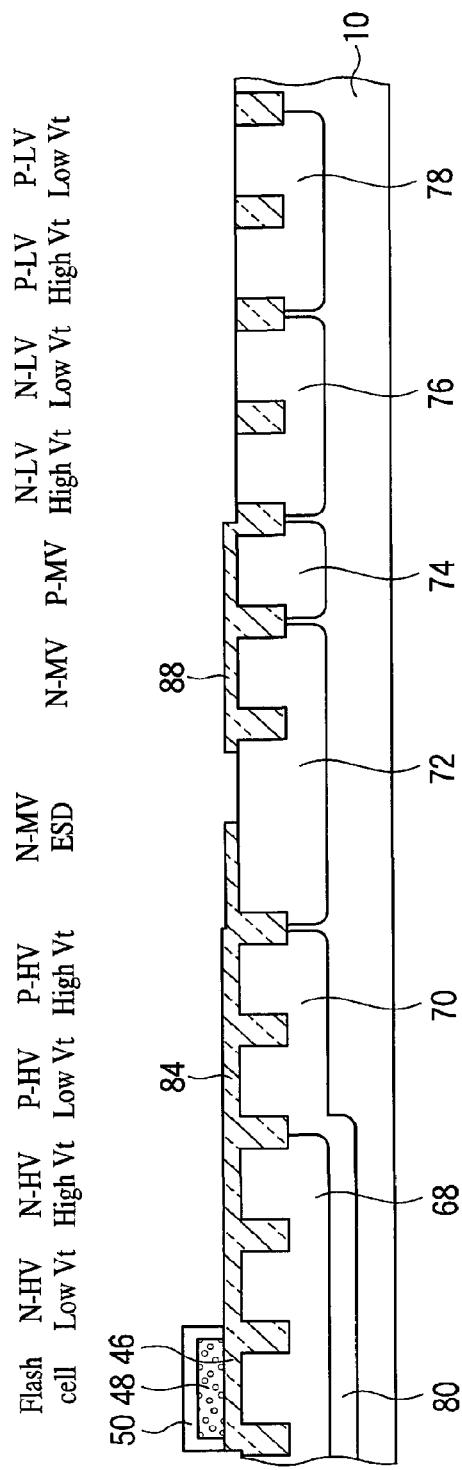
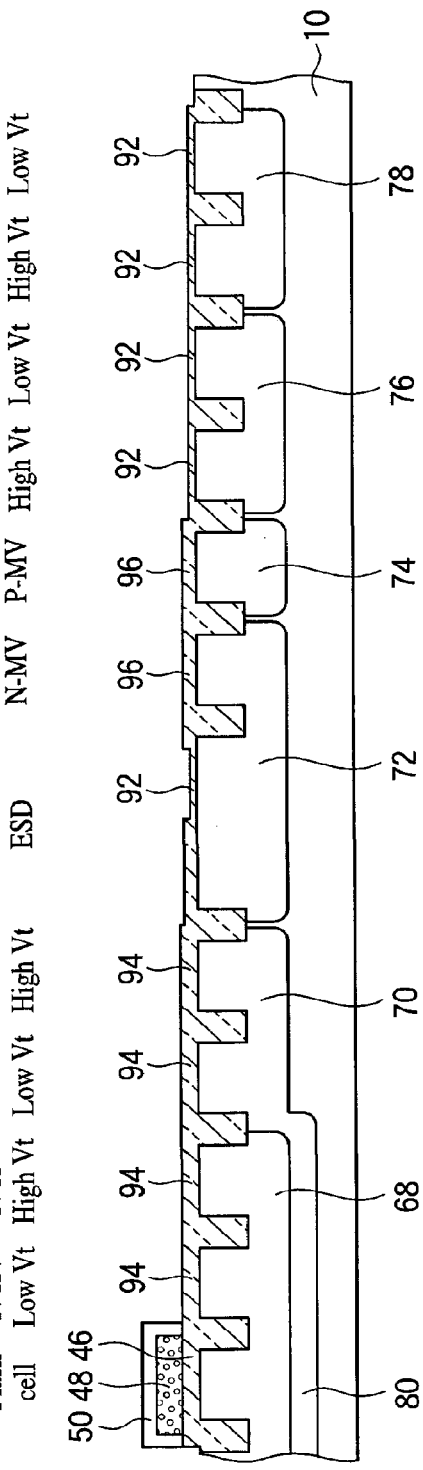
FIG. 32A
FIG. 32B

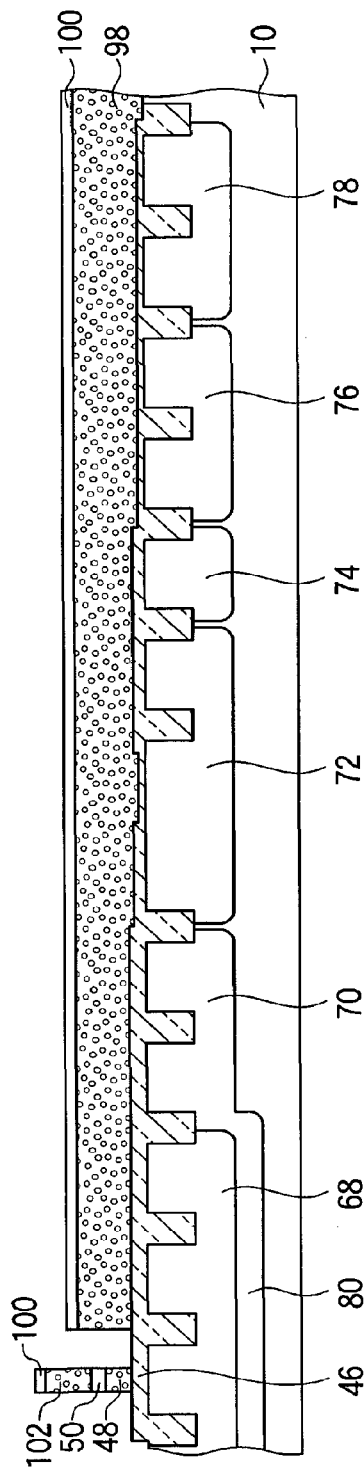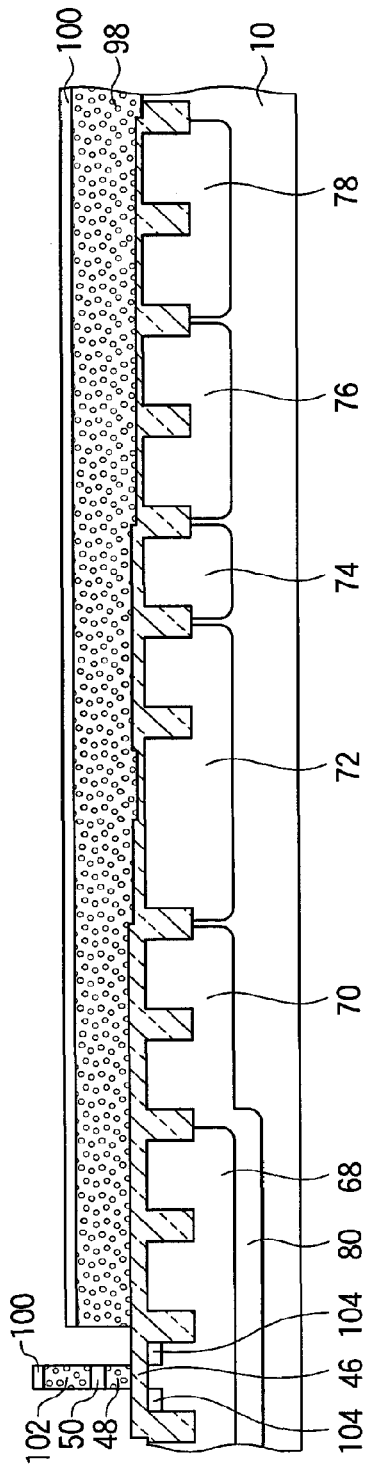

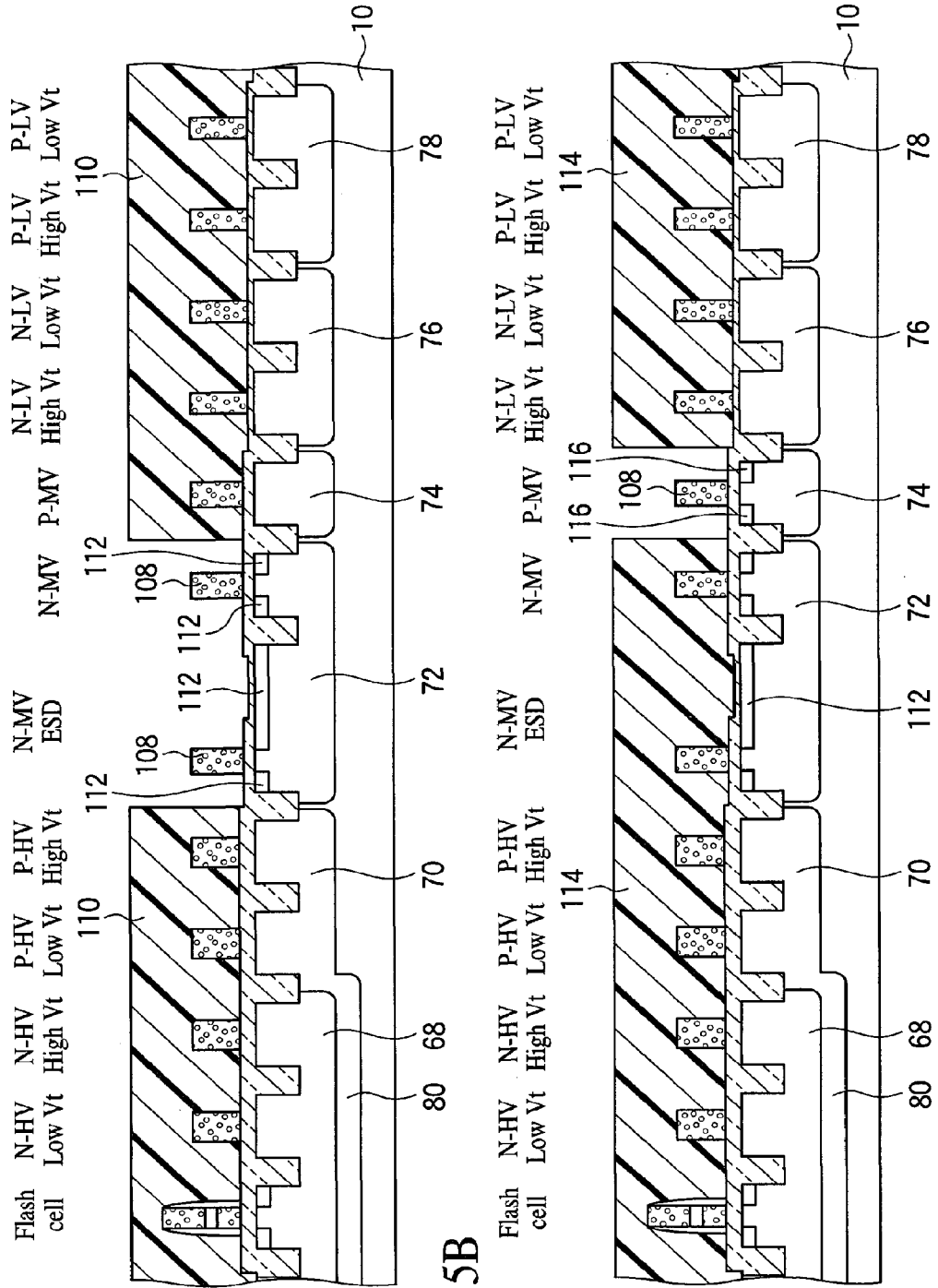

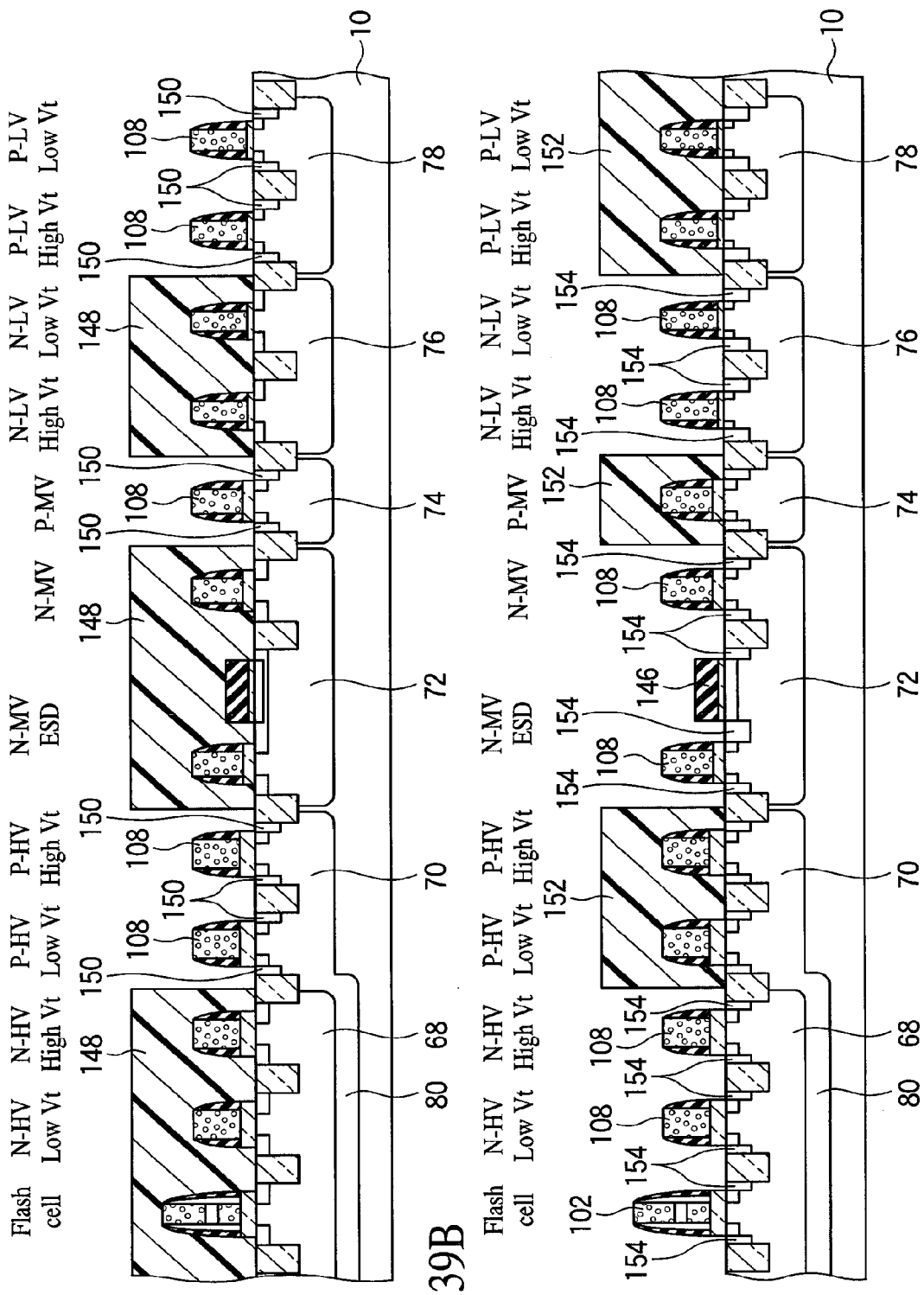

SEMICONDUCTOR DEVICE AND METHOD OF MANUFACTURING THE SAME

CROSS REFERENCE TO RELATED APPLICATIONS

This application is a continuing application of U.S. patent application Ser. No. 11/944,073, filed Nov. 21, 2007, which is a by-pass continuation of PCT/JP2005/009348, filed May 23, 2005, the entire contents of each of which are incorporated herein by reference.

BACKGROUND OF THE INVENTION

The present invention relates to a semiconductor device and a method of manufacturing the same, more specifically, a semiconductor device including an ESD protection element comprising a MIS transistor including a ballast resistor, and a method of manufacturing the semiconductor device.

The semiconductor devices generally include ESD protection elements for protecting the semiconductor elements from voltage surges due to external ESD (ElectroStatic Discharge), etc. As an ESD protection element is known an ESD protection element using a MIS transistor having a ballast resistor, which functions also as an input/output circuit. Usually, in the MIS transistor including the ballast resistor, the ballast resistor is formed of an impurity doped region continuous to the source/drain region of the MIS transistor.

As one method for realizing the ballast resistor of an impurity doped layer is known the technique called salicide block method (refer to, e.g., Japanese published unexamined patent application No. 2003-133433). In this technique, when the so-called salicide (self-aligned silicide) process is made, the impurity doped layer in the regions for ballast resistors to be formed in is beforehand masked so as not to silicidize the ballast resistor forming regions. Thus, the silicidation on the impurity doped layer is hindered, and the ballast resistors of the impurity doped layer can be formed.

The resistance value of the ballast resistor is an important parameter for determining the ESD breakdown voltage of the ESD protection element, and the breakdown voltage, not only when too low but also when too high, causes discharge ability decrease, heat increase, etc. and must be set at a suitable resistance value.

To this end, conventionally, an impurity doped layer to be the LDD regions of the source/drain is formed in a ballast resistor forming region, and additionally, an impurity doped layer for the resistance value control is formed in the ballast resistor forming region, whereby a ballast resistor having a prescribed resistance value is formed.

However, in the conventional method of manufacturing the semiconductor device described above, the ballast resistor is formed of the impurity doped layer for the LDD regions of the MIS transistor and the impurity doped layer for the resistance value control of the ballast resistor. For this, a series of steps of forming the impurity doped layer must be added, and the manufacturing process is complicated. Structures and manufacturing methods which can control the resistance value of the ballast resistor to be a prescribed value without complicating the manufacturing process have been required.

SUMMARY OF THE INVENTION

An object of the present invention is to provide a semiconductor device including an ESD protection element of MIS transistor including a ballast resistor and a method of manufacturing the semiconductor device, which can realize the ballast resistor of a prescribed resistance value without complicating the manufacturing steps and can suppress the fluctuation of the ballast resistance value and the ESD breakdown voltage.

According to one aspect of the present invention, there is provided a semiconductor device comprising: a first MIS transistor formed over a semiconductor substrate and including a first gate insulating film, a first gate electrode formed on the first gate insulating film and a first source/drain regions formed in the semiconductor substrate; a second MIS transistor formed over the semiconductor substrate and including a second gate insulating film thicker than the first gate insulating film, a second gate electrode formed on the second gate insulating film, second source/drain regions formed in the semiconductor substrate and a ballast resistor formed in the semiconductor substrate and connected to one of the second source/drain regions; a salicide block insulating film formed over the ballast resistor with an insulating film thinner than the second gate insulating film interposed therebetween; and a silicide film formed on the first source/drain regions and on the second source/drain regions.

According to another aspect of the present invention, there is provided a method of manufacturing a semiconductor device comprising a first MIS transistor in a first region of a semiconductor substrate, and a second MIS transistor including a ballast resistor in a second region of the semiconductor substrate, comprising the steps: thermally oxidizing the semiconductor substrate to form a first insulating film in the first region and the second region; removing the first insulating film in the first region, and in a region for the ballast resistor in the second region; thermally oxidizing the semiconductor substrate to form a first gate insulating film in the first region and the region for the ballast resistor, and additionally oxidizing the first insulating film in the second region other than the region for the ballast resistor to form a second gate insulating film; forming a first gate electrode on the first gate insulating film and a second gate electrode on the second gate insulating film; implanting an impurity into the semiconductor substrate in the first region and the region for the ballast resistor with the first gate electrode as a mask to form a first impurity doped layer; and implanting an impurity into the semiconductor substrate in the second region with the second gate electrode as a mask to form a second impurity doped layer, the ballast resistor of the first impurity doped layer and the second impurity doped layer being formed in the region for the ballast resistor.

According to the present invention, the ballast resistor of the ESD protection element is formed of an impurity doped layer forming the extension regions of a first transistor including a first gate insulating film, and an impurity doped layer forming the extension region of a second transistor including a second gate insulating film thicker than the first gate insulating film, whereby no additional ion implantation step specialized for forming the ballast resistor is necessary. Accordingly, the ballast resistor can be realized without complicating the manufacturing steps. The impurity doped layers forming the ballast resistor are formed by the ion implantation made through the thin insulating film formed concurrently with the first gate insulating film of the first transistor, whereby the ballast resistance value and the ESD breakdown voltage can be more stabilized.

BRIEF DESCRIPTION OF THE DRAWINGS

FIG. 2 is a diagrammatic sectional view showing the structure of the semiconductor device according to a first embodiment of the present invention.

FIGS. 3A-3B, 4A-4B, 5A-5B, 6A-6B and 7A-7B are sectional views showing the method of manufacturing the semiconductor device according to the first embodiment of the present invention.

FIGS. 10A-10B, 11A-11B, 12A-12B, 13A-13B, 14A, 15A-15B, 16A-16B, 17A-17B, 18A-18B, 19A-19B and 20A-20B are sectional views showing the method of manufacturing the semiconductor device according to the second embodiment of the present invention.

FIGS. 23A-23B, 24A-24B, 25A-25B, 26A-26B, 27A-27B, 28A-28B, 29A-29B, 30A-30B, 31A, 32A-32B, 33A-33B, 34A-34B, 35A-35B, 36A-36B, 37A-37B, 38A-38B, 39A-39B, 40A-40B are sectional views showing the method of manufacturing the semiconductor device according to the third embodiment of the present invention.

DETAILED DESCRIPTION OF THE INVENTION

A First Embodiment

The semiconductor device and the method of manufacturing the same according to a first embodiment of the present invention will be explained with reference to FIGS. 1 to 7B.

Figure 1:
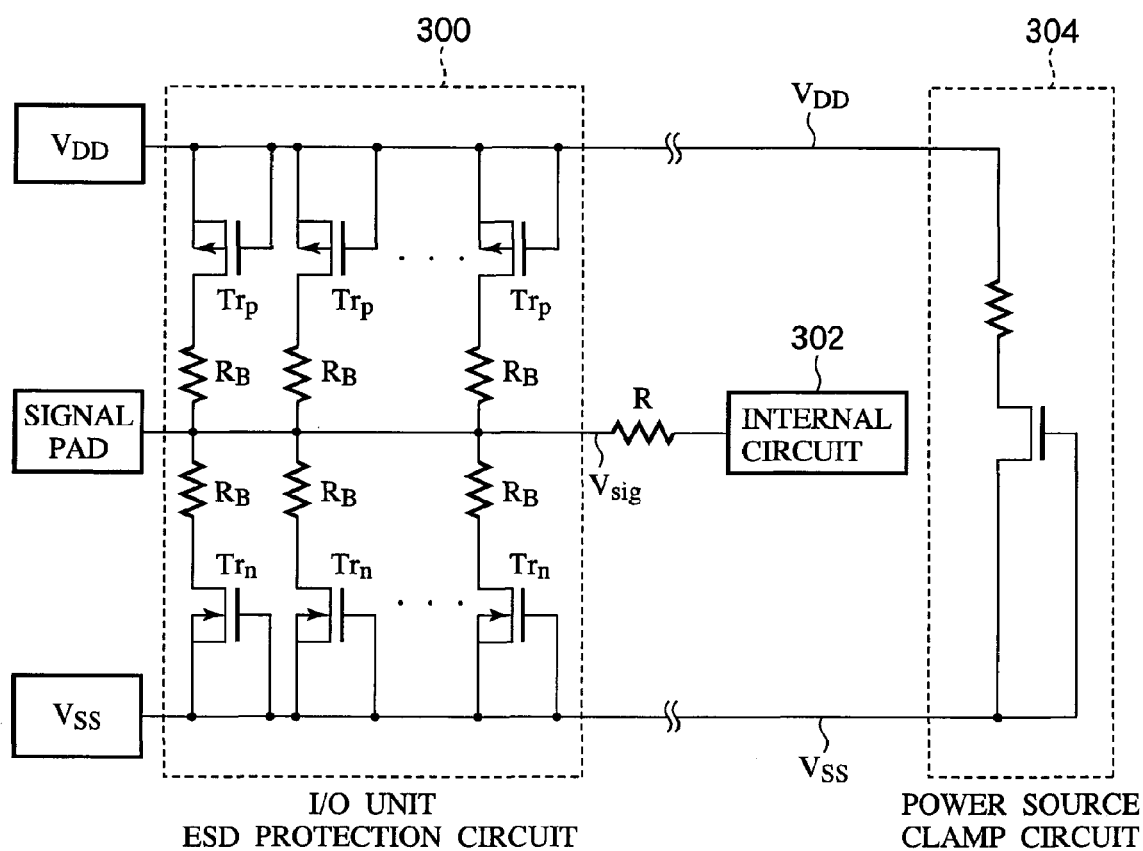
FIG. 1 is a circuit diagram of one example of the ESD protection circuit using MIS transistors including ballast resistors.

FIG. 1 is a circuit diagram of one example of the ESD protection circuit using MIS transistors including ballast resistors. FIG. 2 is a diagrammatic sectional view showing the structure of the semiconductor device according to the present embodiment. FIG. 3A-7B are sectional views showing the method of manufacturing the semiconductor device according to the present embodiment.

First, the ESD protection circuit using MIS transistors including ballast resistors will be explained with reference to FIG. 1. FIG. 1 shows one example of the ESD protection circuit of the I/O unit.

Between a $V_{DD}$ line and a signal line $V_{sig}$, a plurality of p-channel MIS transistors $Tr_p$ each having a ballast resistor $R_B$ are parallelly connected. The p-channel MIS transistor $Tr_p$ having the ballast resistor $R_B$ is a p-channel MIS transistor $Tr_p$ having one of the source/drain regions serially connected to the ballast resistor $R_B$. The ballast resistor $R_B$ is connected to the p-channel MIS transistor $Tr_p$ on the side of the signal line $V_{sig}$, and the gate terminals and the substrate terminals of the p-channel MIS transistors $Tr_p$ are connected to the $V_{DD}$ line.

Between a $V_{SS}$ line and the signal line $V_{sig}$, a plurality of n-channel MIS transistors $Tr_N$ each having a ballast resistor $R_B$ are parallelly connected. The n-channel MIS transistor $Tr_N$ having the ballast resistor $R_B$ is an n-channel MIS transistor $Tr_N$ having one of the source/drain regions serially connected to the ballast resistor $R_B$. The ballast resistor $R_B$ is connected to the n-channel MIS transistor $Tr_N$ on the side of the signal line $V_{sig}$, and the gate terminals and the substrate terminals of the n-channel MIS transistors $Tr_N$ are connected to the $V_{SS}$ line.

Thus, a plurality of MIS transistors including the ballast resistors forms the ESD protection circuit 300.

The signal line $V_{sig}$ is connected to a prescribed internal circuit 302 via the ESD protection circuit 300 and a resistor R. The $V_{DD}$ line and the $V_{SS}$ line are connected to a power source clamp circuit 304 for stabilizing the source voltage.

Next, the structure of the semiconductor device according to the present embodiment will be explained with reference to FIG. 2.

On a silicon substrate 10, a device isolation film 12 for defining active regions is formed. In FIG. 2, the active regions defined by the device isolation film 12 are, from the right side, a logic circuit (N-LV) forming region, an input/output circuit (N-MV) forming region, and an input/output circuit functioning also as ESD protection element (N-MV ESD) forming region.

In the N-MV ESD forming region and the N-MV forming region of the silicon substrate 10, a p-well 72 is formed. In the N-LV forming region of the silicon substrate 10, a p-well 76 is formed.

In the N-LV forming region, a low voltage transistor including a gate electrode 108 formed over the silicon substrate 10 with a gate insulating film 92 interposed therebetween, and source/drain regions 154 having extension regions (or LDD regions) 122 formed in the silicon substrate 10 on both sides of the gate electrode 108 is formed. The low voltage transistor is for forming the logic circuit and is driven at a low voltage of, e.g., 1.2 V.

In the N-MV forming region, a middle voltage transistor including a gate electrode 108 formed over the silicon substrate 10 with the gate insulating film 92 interposed therebetween, and source/drain regions 154 having extension regions (or LDD regions) 112 formed in the silicon substrate 10 on both sides of the gate electrode 108 is formed. The middle voltage transistor is for forming the input/output circuit and is driven at a middle voltage of, e.g., 2.5 V or 3.3 V. The gate insulating film 96 of the middle voltage transistor is thicker than the gate insulating film 92 of the low voltage transistor.

In the N-MV ESD forming region, the ESD protection element including a middle voltage transistor and a ballast resistor is formed. The middle voltage transistor and the ballast resistor correspond respectively to the MIS transistor $Tr_N$ and the ballast resistor $R_B$ in FIG. 1. The middle voltage transistor includes a gate electrode 108 formed over the silicon substrate 10 with the gate insulating film 96 interposed therebetween, and source/drain regions 154 having extension regions (or LDD regions) 112 formed in the silicon substrate 10 on both sides of the gate electrode 108 is formed. The ballast resistor is formed of an impurity doped layer 120 serially connected to the source/drain region 154 of the middle voltage transistor. The impurity doped layer 120 is formed of the combination of the impurity doped layer forming the extension regions 122 of the low voltage transistor and the impurity doped layer forming the extension regions 112 of the middle voltage transistor.

On the gate electrodes 108 and the source/drain regions 154 of the respective transistors, a silicide film 156 is formed. On the impurity doped layer 120 forming the ballast resistor, a salicide block 146 is formed with the gate insulating film 96 interposed therebetween, and the silicide film is not formed.

The gate insulating film 96 formed below the salicide block 146 has the same film thickness as that formed below a sidewall spacer 144 formed on the side walls of the gate electrodes 108 of the middle voltage transistors.

As described above, the semiconductor device according to the present embodiment has a feature that the ballast resistor of the ESD protection element is formed of the combination of the impurity doped layer forming the extension regions 122 of the low voltage transistor and the impurity doped layer forming the extension regions 112 of the middle voltage transistor. The ballast resistor is formed of the combination of the extension regions of two transistors having the source/drain regions of different impurity profiles, whereby no additional ion implantation step which is characteristic of forming the ballast resistor is necessary, which can simplify the manufacturing process.

Next, the method of manufacturing the semiconductor device according to the present embodiment will be explained with reference to FIGS. 3A to 7B.

Figure 3A:
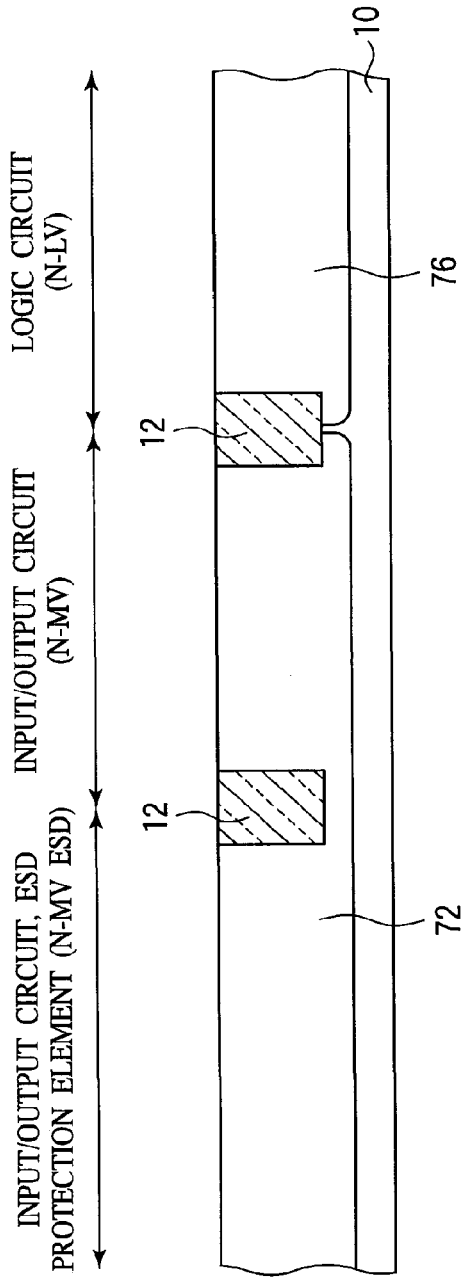

First, in the silicon substrate 10, the device isolation film 12 for defining the active regions is formed by, e.g., STI (Shallow Trench Isolation) method (FIG. 3A). In FIGS. 3A to 7B, the active regions defined by the device isolation film 12 are, form the right, the N-LV forming region, the N-MV forming region and the N-MV ESD forming region.

Then, by ion implantation, the p-well 72 is formed in the N-MV ESD forming region and the N-MV forming region of the silicon substrate 10, and in the N-LV forming region, the p-well 76 is formed. The p-well 72 is for the middle voltage transistor, and the p-well 76 is for the low voltage transistor.

Figure 3B:
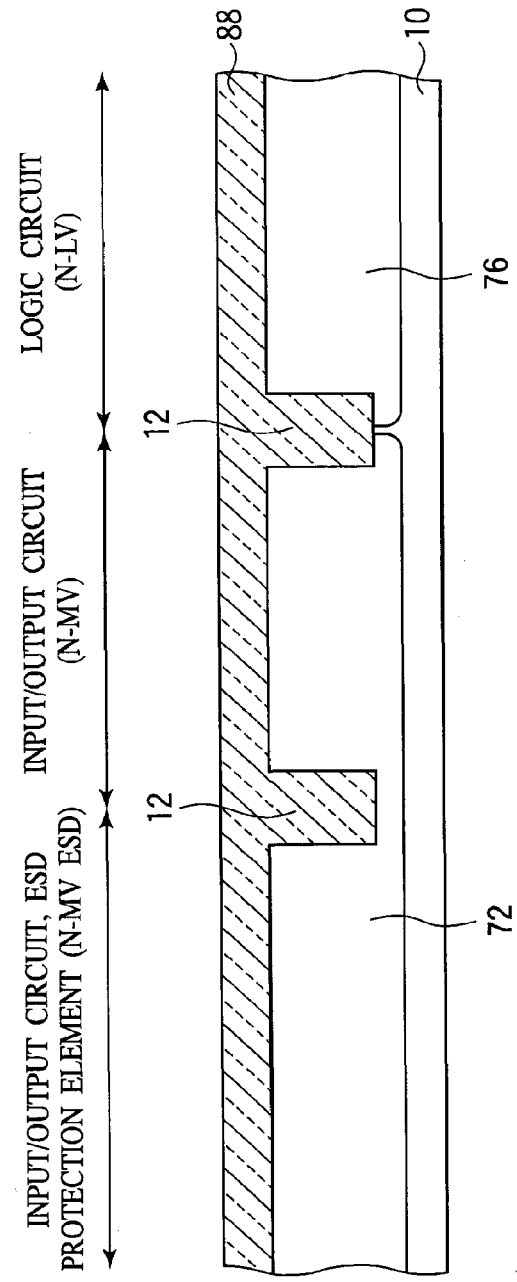

Next, on the active regions, a 6 nm-thickness silicon oxide film 88, for example, is formed by, e.g., thermal oxidation method (FIG. 3B).

Next, by photolithography and wet etching, the silicon oxide film 88 in the N-LV forming region is removed (FIG. 4A).

Then, on the active region of the N-LV forming region, the gate insulating film 92 of, e.g., a 2.2 nm-thickness silicon oxide film is formed by, e.g., thermal oxidation method. In this thermal oxidation step, the film thickness of the silicon oxide film 88 is also increased, and the gate insulating film 96 of total thickness of an 8 nm-thickness is formed on the active regions of the N-MV forming region and the N-MV ESD forming region (FIG. 4B).

Then, by CVD method, a polycrystalline silicon film, for example, is deposited and then is patterned by photolithography and dry etching to form the gate electrode 108 of the low voltage transistor in the N-LV forming region and the gate electrodes 108 of the middle voltage transistors in the N-MV forming region and the N-MV ESD forming region (FIG. 5A). By the over-etching in patterning the polycrystalline silicon film, the gate insulating films 92, 96 are a little etched, and the film thicknesses of the gate insulating films 92, 96 formed in the regions other than the regions where the gate electrodes 108 are formed become thinner than that formed in the regions immediately below the gate electrodes 108.

Then, by photolithography, a photoresist film 110 exposing the N-MV forming region and the N-MV ESD forming region and covering the N-LV forming region is formed.

Next, with the gate electrodes 108 and the photoresist film 110 as the mask, ion implantation is made to form the extension regions 112 of the middle voltage transistors (N-MV) in the N-MV forming region and the N-MV ESD forming region (FIG. 5B).

Next, by, e.g., ashing, the photoresist film 110 is removed.

Next, by photolithography, a photoresist film 118 exposing a ballast resistor forming region in the N-MV ESD forming region and the N-LV forming region, and covering the rest region is formed.

Next, with the gate electrodes 108 and the photoresist film 118 as the mask, ion implantation is made to form the extension regions 122 in the ballast resistor forming region in the N-MV ESD forming region and the N-LV forming region. Thus, in the ballast resistor forming region, the impurity doped layer 120 for the ballast resistor, which are formed of the extension regions 112, 122 is formed (FIG. 6A).

Next, by, e.g., ashing, the photoresist film 118 is removed.

Then, over the entire surface, a silicon oxide film 136 is deposited by, e.g., thermal CVD method.

Next, by photolithography, over the silicon oxide film 136, a photoresist film 138 covering the ballast resistor forming region and exposing the rest region is formed (FIG. 6B).

Next, with the photoresist film 138 as a mask, the silicon oxide film 136 is etched back to form the sidewall spacer 144 of the silicon oxide film 136 on the side walls of the gate electrodes 108 while forming the salicide block 146 of the silicon oxide film 136 in the ballast resistor forming region.

Next, by, e.g., asking, the photoresist film 136 is removed (FIG. 7A).

Then, with the gate electrodes 108, the sidewall spacer 144 and the salicide block 146 as the mask, ion implantation is made to form the source/drain regions 154 in the silicon substrate 10 on both sides of the gate electrodes 108.

Then, by the known salicide (self-aligned silicide) process, the tops of the gate electrodes 108 and the source/drain regions 154 are selectively silicidized to form the silicide film 156 on the gate electrodes 108 and the source/drain regions 154. At this time, in the ballast resistor forming region, where the salicide block 146 is existed, the silicide film 156 is not formed.

Next, over the silicon substrate 10 with the transistors, etc. formed on, the insulating film 158 is formed, and then electrode plugs 160, interconnections 162, etc are formed, and the structure up to the first level metal interconnection is completed (FIG. 7B).

As described above, according to the present embodiment, the ballast resistor of the ESD protection element is formed of the impurity doped layer forming the extension regions of the source/drain regions of the low voltage transistor and the impurity doped layer forming the extension regions of the source/drain regions of the middle voltage transistor, whereby no ion implantation step specialized for forming the ballast resistor is necessary. Accordingly, the ballast resistor can be realized without complicating the manufacturing process.

A Second Embodiment

The semiconductor device and the method of manufacturing the same according to a second embodiment of the present invention will be explained with reference to FIGS. 8 to 21B. The same members of the present embodiment as those of the semiconductor device and the method of manufacturing the same according to the first embodiment shown in FIGS. 2 to 7B are represented by the same reference numbers not to repeat or to simplify their explanation.

Figure 8:
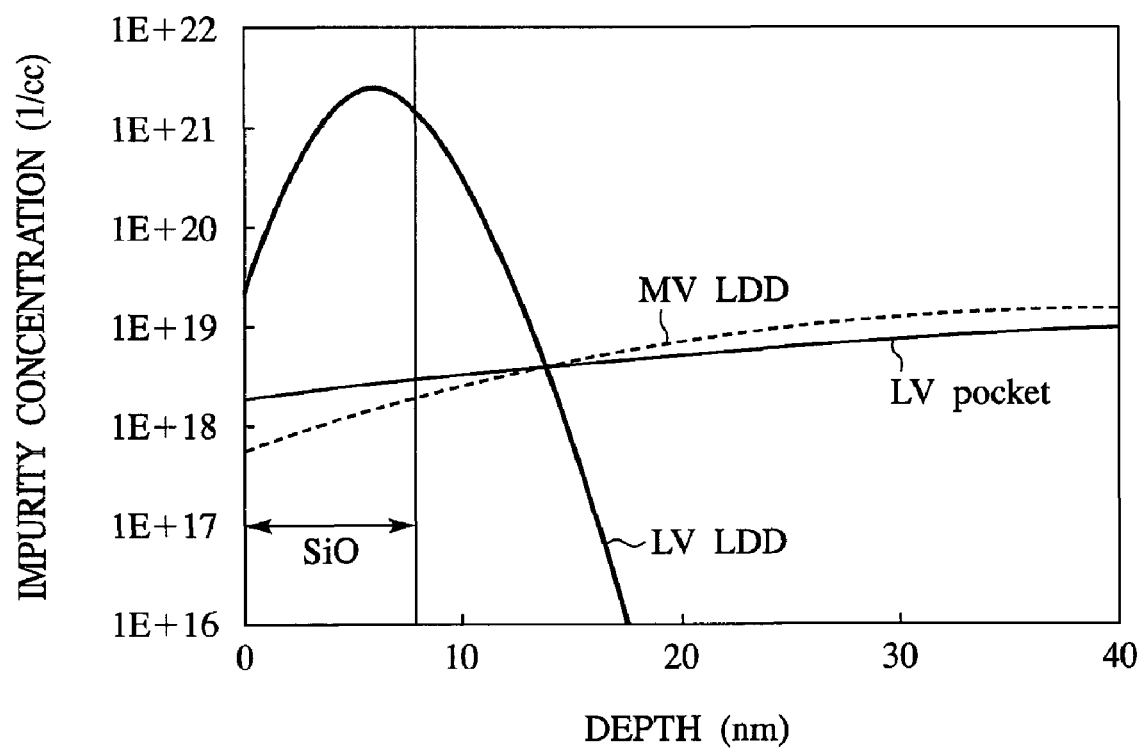
FIG. 8 is a graph showing the depth-wise distribution of the impurity concentration of the extension region.
Figure 9:
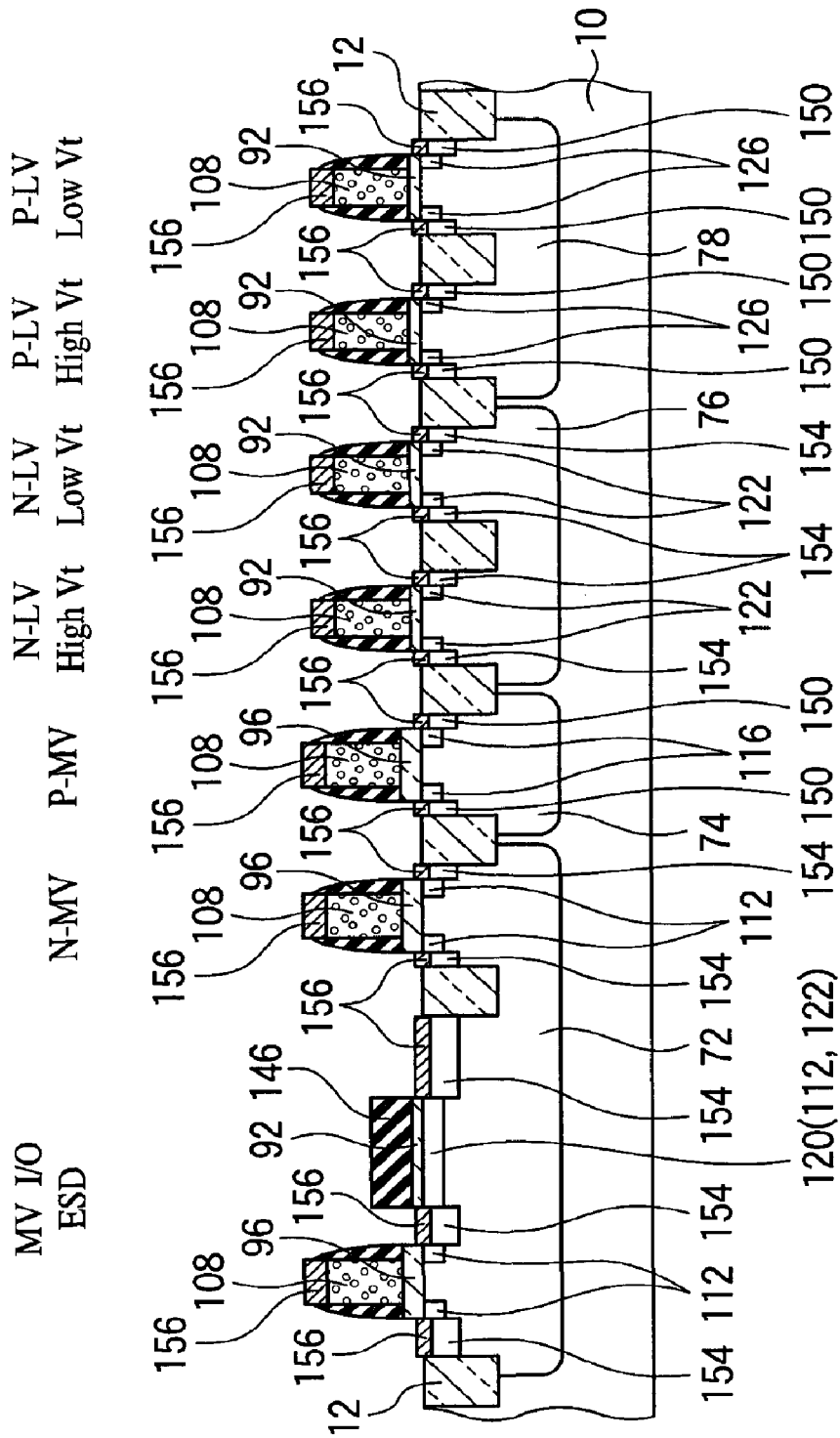
FIG. 9 is a diagrammatic sectional view showing the structure of the semiconductor device according to a second embodiment of the present invention.
Figure 21A:
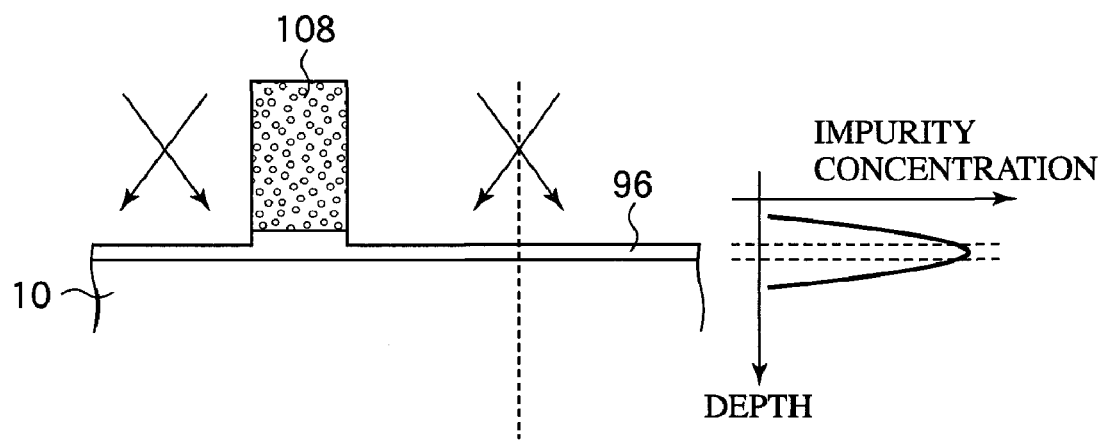
FIGS. 21A and 21B are views showing the effects of the semiconductor device and the method of manufacturing the same according to the second embodiment of the present invention.
Figure 21B:
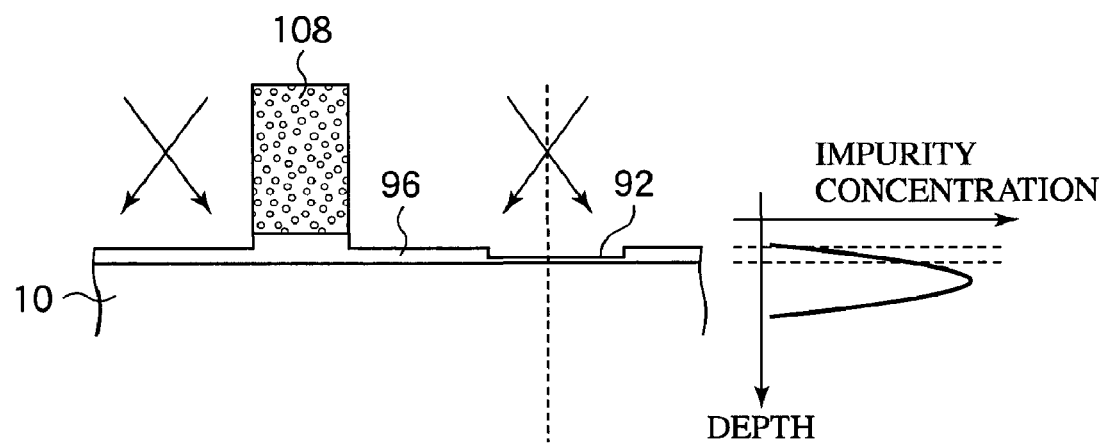

FIG. 8 is a graph showing the depth-wise distribution of the impurity concentration of the extension region. FIG. 9 is a diagrammatic sectional view showing the structure of the semiconductor device according to the present embodiment. FIGS. 10A-20B are sectional views showing the method of manufacturing the semiconductor device according to the present embodiment. FIGS. 21A and 21B are views showing the effects of the semiconductor device and the method of manufacturing the same according to the present embodiment.

In the first embodiment, the ballast resistor of the ESD protection element is formed of the impurity doped layer forming the extension regions of the low voltage transistor and the impurity doped layer forming the extension regions of the middle voltage transistors. This is because the resistance value of the ballast resistor formed of only the impurity doped layer forming the extension regions of the middle voltage transistors is too high. However, depending on, e.g., the structure of the source/drain regions, the semiconductor device and the method of manufacturing the same according to the first embodiment cannot often provide a sufficient value of the ballast resistor.

FIG. 8 is a graph of one example of the depth-wise distribution of the impurity doped layer forming the extension regions of the low voltage transistor and the impurity doped layer forming the extension regions of the middle voltage transistors, which are ion implanted into ballast resistor forming region. In the graph, "MV LDD" is the impurity doped layer forming the extension regions of the middle voltage transistors, "LV LDD" is the impurity doped layer forming the extension regions of the low voltage transistor, and "LV pocket" is the impurity doped layer forming the pocket regions of the low voltage transistor.

In the transistor for the logic circuit, etc., often pocket regions for suppressing the extension region of the depletion layer toward the channel region are formed in a region deeper than the extension regions. When the impurity doped layer forming the extension regions of the low voltage transistor and the impurity doped layer forming the extension regions of the middle voltage transistor are both ion implanted in the ballast resistor forming region, as shown in FIG. 8, the impurity doped layer forming the extension regions of the middle voltage transistor is compensated by the impurity doped layer forming the pocket regions of the low voltage transistor. In this case, the resistance value of the ballast resistor is decided mainly by the impurity doped layer forming the extension regions of the low voltage transistor.

However, the extension regions of the low voltage transistor are extremely shallow, and its impurity concentration in the silicon substrate strongly depends on the film thickness of the gate insulating film. That is, depending on fluctuations of the residual film thickness of the gate insulating film at the time of forming the gate electrode, the impurity concentration to be implanted into the ballast resistor forming region varies. Consequently, the fluctuation of the formed ballast resistor is large, which makes it difficult to ensure the ESD immunity stably sufficient.

In the present embodiment, a semiconductor device and a method of manufacturing the same which can improve the above-described disadvantage will be described.

First the structure of the semiconductor device according to the present embodiment will be described with reference to FIG. 9.

In a silicon substrate 10, a device isolation film 12 for defining active regions is formed. In FIG. 9, the active regions defined by the device isolation film 12 are, sequentially from the left, an ESD protection element (MV I/O ESD) forming region, an n-channel middle voltage transistor (N-MV) forming region, a p-channel middle voltage transistor (P-MV) forming region, an n-channel low voltage/high threshold voltage transistor (N-LV High Vt) forming region, an n-channel low voltage/low threshold voltage transistor (N-LV Low Vt) forming region, a p-channel low voltage/high threshold voltage transistor (P-LV High Vt) forming region and a p-channel low voltage/low threshold voltage transistor (P-LV Low Vt) forming region.

In the ESD protection element (MV I/O ESD) forming region and the n-channel middle voltage transistor (N-MV) forming region of the silicon substrate 10, a p-well 72 is formed. In the p-channel middle voltage transistor (P-MV) forming region, an n-well 74 is formed. In the n-channel low voltage/high threshold voltage transistor (N-LV High Vt) forming region and the n-channel low voltage/low threshold voltage transistor (N-LV Low Vt) forming region, a p-well 76 is formed. In the p-channel low voltage/high threshold voltage transistor (P-LV High Vt) forming region and the p-channel low voltage/low threshold voltage transistor (P-LV Low Vt) forming region, an n-well 78 is formed.

In the n-channel middle voltage transistor (N-MV) forming region, an n-channel middle voltage transistor including a gate electrode 108 formed over the silicon substrate 10 with a gate insulating film 96 interposed therebetween, and source/drain regions 154 having extension regions (or LDD regions) 112 formed in the silicon substrate 10 on both sides of the gate electrode 108 is formed.

In the p-channel middle voltage transistor (P-MV) forming region, a p-channel middle voltage transistor including a gate electrode 108 formed over the silicon substrate 10 with the gate insulating film 96 interposed therebetween, and source/drain regions 150 having extension regions (or LDD regions) 116 formed in the silicon substrate 10 on both sides of the gate electrode 108 is formed.

In the n-channel low voltage/high threshold voltage transistor (N-LV High Vt) forming region and the n-channel low voltage/low threshold voltage transistor (N-LV Low Vt) forming region, n-channel low voltage transistors each including a gate electrode 108 formed over the silicon substrate 10 with the gate insulating film 92 interposed therebetween, and source/drain regions 154 having extension regions (or LDD regions) 122 formed in the silicon substrate 10 on both sides of the gate electrode 108 are formed.

In the p-channel low voltage/high threshold voltage transistor (P-LV High Vt) forming region and the p-channel low voltage/low threshold voltage transistor (P-LV Low Vt) forming region, p-channel low voltage transistors each including a gate electrode 108 formed over the silicon substrate 10 with the gate insulating film 92 interposed therebetween, and source/drains 150 having extension regions (or LDD regions) 126 formed in the silicon substrate 10 on both sides of the gate electrode 108 is formed.

In the ESD protection element (MV I/O ESD) forming region, an ESD protection element including a middle voltage transistor and a ballast resistor is formed. The middle voltage transistor includes a gate electrode 108 formed over the silicon substrate 10 with the gate insulating film 96 interposed therebetween, and source/drain regions 154 having extension regions (or LDD regions) 112 formed in the silicon substrate 120 on both sides of the gate electrode 108. The ballast resistor is formed of an impurity doped layer 120 serially connected to the source/drain region 154 of the middle voltage transistor. The impurity doped layer 120 is formed of a combination of an impurity doped layer forming the extension regions 122 of the low voltage transistor and an impurity doped layer forming the extension regions 112 of the middle voltage transistor.

On the gate electrodes 108 and the source/drain regions 150, 154 of the respective transistors, a silicide film 156 is formed. On the impurity doped layer 120 forming the ballast resistor, a salicide block 146 is formed with the gate insulating film 92 interposed therebetween, and the silicide film is not formed. The gate insulating film 92 formed below the silicide block 146 has the same film thickness as the gate insulating film 92 formed below the sidewall spacer 144 formed on the side walls of the gate electrodes 108 of the low voltage transistor.

As described above, the semiconductor device according to the present embodiment is the same as the semiconductor device according to the first embodiment in that the ballast resistor of the ESD protection element is formed of the combination of the impurity doped layer forming the extension regions 122 of the low voltage transistor and the impurity doped layer forming the extension regions 112 of the middle voltage transistor and has another feature that the gate insulating film 92 formed below the silicide block 146 has the same film thickness as the gate insulating film 92 formed below the sidewall spacer 144 formed on the side walls of the gate electrodes 108 of the low voltage transistors. This means that the impurity doped layer 120 forming the ballast resistor is formed by the ion implantation through the thin insulating film formed concurrently with forming the gate insulating film 92 of the low voltage transistor. The ballast resistor is thus formed, whereby the ballast resistance value and the ESD immunity can be more stabilized without complicating the manufacturing process.

Next, the method of manufacturing the semiconductor device according to the present embodiment will be explained with reference to FIGS. 10A to 21B.

First, in the silicon substrate 10, the device isolation film 12 for defining the active regions is formed by, e.g., STI method (FIG. 10A). First, by, e.g., thermal oxidation method, a 10 nm-thickness silicon oxide film, for example, is grown. Then, a 100 nm-thickness silicon nitride film, for example, is grown by CVD method. Then, by lithography and dry etching, the silicon nitride film, the silicon oxide film and the silicon substrate 10 are sequentially etched to from trenches of, e.g., a 300 nm-depth in the silicon substrate 10. Next, the silicon substrate 10 is thermally oxidized to form a silicon oxide film in the inside walls of the trenches. Then, by, e.g., high density-plasma CVD method, a 550 nm-thickness silicon oxide film, for example, is grown. Next, by CMP method, the silicon oxide film is planarized until the silicon nitride film is exposed to form the device isolation film 12 of the silicon oxide film buried in the trenches.

In FIGS. 10A to 20B, the active regions defined by the device isolation film 12 are, sequentially from the left, the ESD protection element (MV I/O ESD) forming region, the n-channel middle voltage transistor (N-MV) forming region, the p-channel middle voltage transistor (P-MV) forming region, the n-channel low voltage/high threshold voltage transistor (N-LV High Vt) forming region, the n-channel low voltage/low threshold voltage transistor (N-LV Low Vt) forming region, the p-channel low voltage/high threshold voltage transistor (P-LV High Vt) forming region and the p-channel low voltage/low threshold voltage transistor (P-LV Low Vt) forming region.

Next, after the silicon nitride film and the silicon oxide film used in forming the device isolation film 12 has been removed, the silicon substrate 10 is thermally oxidized to grow, e.g., a 10 nm-thickness silicon oxide film 14 as a sacrificial oxidation film.

Then, by photolithography, a photoresist film 20 exposing the ESD protection element (MV I/O ESD) forming region, the n-channel middle voltage transistor (N-MV) forming region and the n-channel low voltage transistor (N-LV High Vt, N-LV Low Vt) forming regions and covering the rest region is formed.

Then, with the photoresist film 20 as the mask, ion implantation is made to form impurity doped layers 22, 24 for forming p-well in the ESD protection element (MV I/O ESD) forming region, the n-channel middle voltage transistor (N-MV) forming region and the n-channel low voltage transistor (N-LV High Vt, N-LV Low Vt) forming regions (FIG. 10A). The impurity doped layer 22 is formed, e.g., by ion implanting boron ions ($B^+$) under the conditions of a 420 keV acceleration energy and a $4\times10^{13}$ $cm^{-2}$ dose. The impurity doped layer 24 is formed by, e.g., ion implanting boron ions under the conditions of a 100 keV acceleration energy and a $2.0\times10^{12}$ $cm^{-2}$ dose. The impurity doped layer 24 is an impurity doped layer for forming the channel stop.

Next, by, e.g., ashing, a photoresist film 20 is removed.

Next, by photolithography, a photoresist film 30 exposing the p-channel middle voltage transistor (P-MV) forming region and the p-channel low voltage transistor (P-LV High Vt, P-LV Low Vt) forming regions and covering the rest region is formed.

Figure 11A:
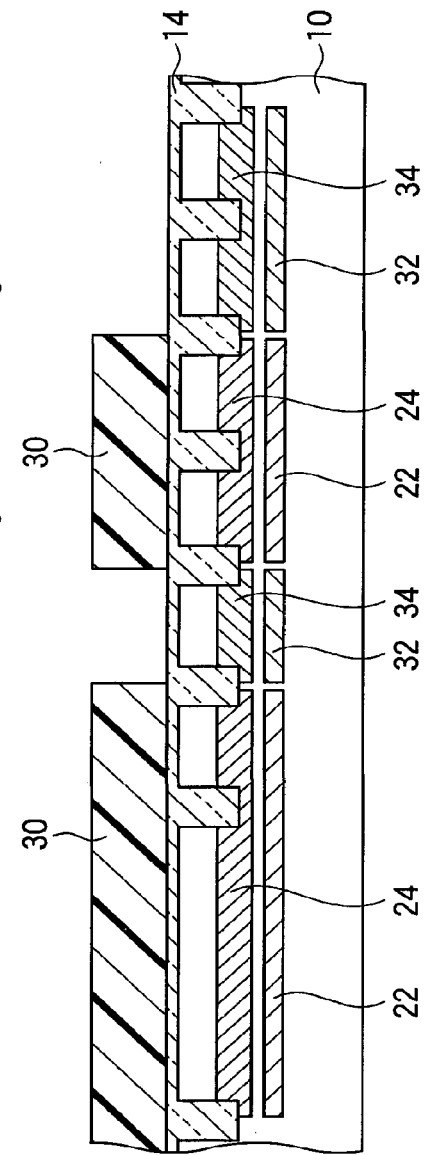

Next, with the photoresist film 30 as the mask, ion implantation is made to form an impurity doped layers 32, for forming n-well in the p-channel middle voltage transistor (P-MV) forming region and the p-channel low voltage transistor (P-LV High Vt, P-LV Low Vt) forming regions (FIG. 11A). The impurity doped layer 32 is formed, e.g., by ion implanting phosphorus ions ($P^+$) under the conditions of a 600 keV acceleration energy and a $1.5\times10^{13}$ $cm^{-2}$ dose. The impurity doped layer 34 is formed, e.g., by ion implanting phosphorus ions under the conditions of a 240 keV acceleration energy and a $3.0\times10^{12}$ $cm^{-2}$ dose.

Next, by, e.g., ashing, the photoresist film 30 is removed.

Next, by photolithography, a photoresist film 60 exposing the n-channel low voltage/high threshold voltage transistor (N-LV High Vt) forming region and covering the rest region is formed.

Figure 11B:
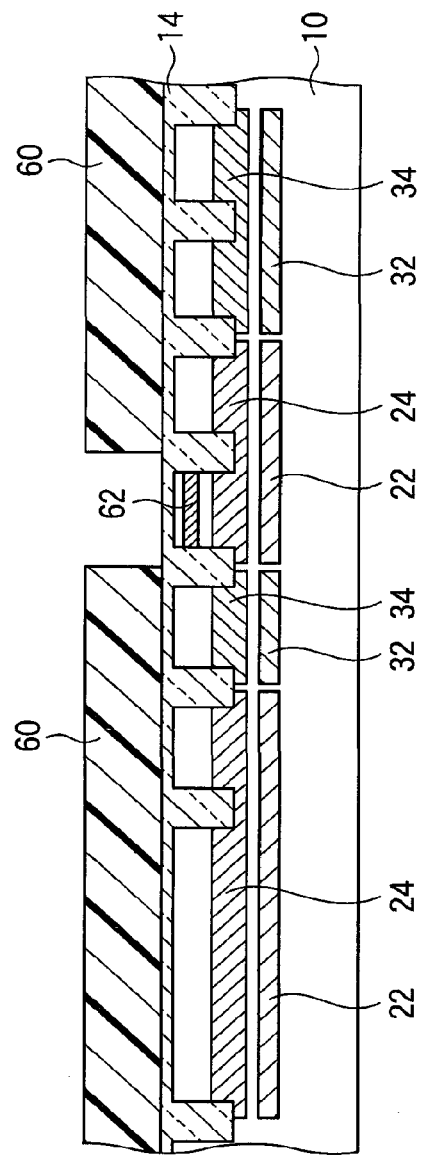

Then, with the photoresist film 60 as the mask, ion implantation is made to form an impurity doped layer 62 for controlling the threshold voltage in the n-channel low voltage/high threshold voltage transistor (N-LV High Vt) forming region (FIG. 11B). The impurity doped layer 62 is formed, e.g., by ion implanting boron ions under the conditions of a 10 keV acceleration energy and a $5\times10^{12}$ $cm^{-2}$ dose.

Next, by, e.g., ashing, the photoresist film 60 is removed.

Next, by photolithography, a photoresist film 64 exposing the p-channel low voltage/high threshold voltage transistor (P-LV High Vt) forming region and covering the rest region is formed.

Figure 12A:
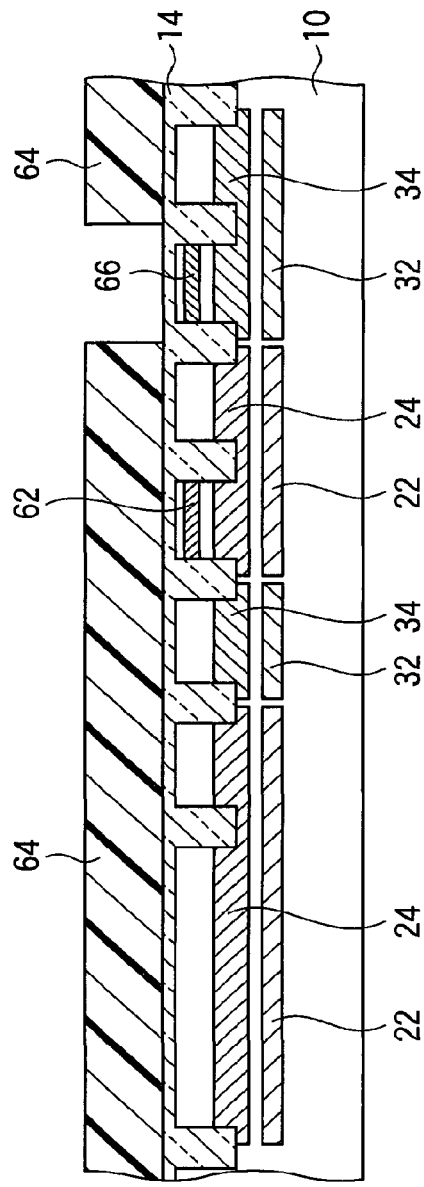

Then, with the photoresist film 64 as the mask, ion implantation is made to form an impurity doped layer 66 for controlling the threshold voltage in the p-channel low voltage/high threshold voltage transistor (P-LV High Vt) forming region (FIG. 12A). The impurity doped layer 66 is formed, e.g., by ion implanting arsenic ions ($As^+$) under the conditions of a 100 keV acceleration energy and a $5\times10^{12}$ $cm^{-2}$ dose.

Next, by, e.g., ashing, the photoresist film 64 is removed.

Then, by photolithography, a photoresist film 52 exposing the ESD protection element (MV I/O ESD) forming region and the n-channel middle voltage transistor (N-MV) forming region, and covering the rest region is formed.

Figure 12B:
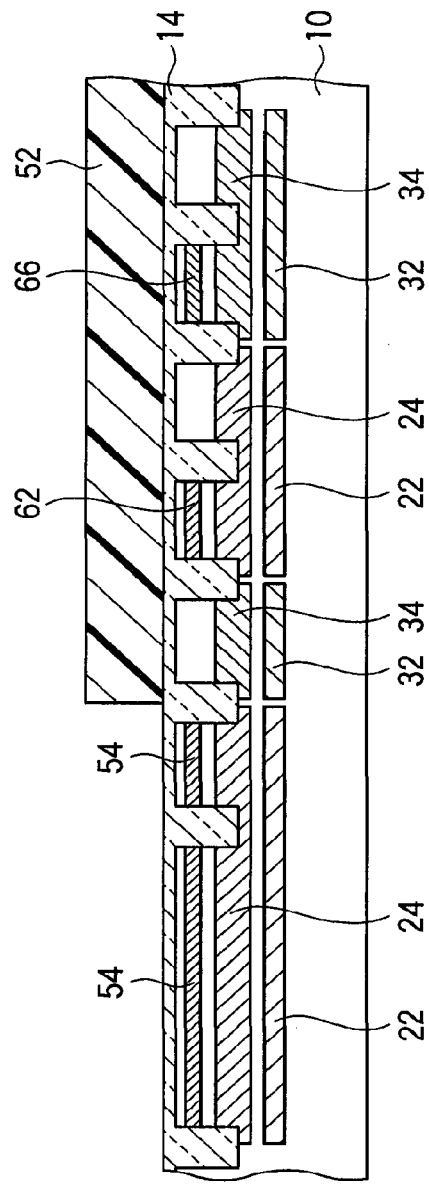

Next, with the photoresist film 52 as the mask, ion implantation is made to form an impurity doped layer 54 for controlling the threshold voltage in the ESD protection element (MV I/O ESD) forming region and the n-channel middle voltage transistor (N-MV) forming region (FIG. 12B). The impurity doped layer 54 is formed, e.g., by ion implanting boron ions under the conditions of a 30 keV acceleration energy and a $5.0 \times 10^{12}$ cm$^{-2}$ dose.

Next, by, e.g., ashing, the photoresist film 52 is removed.

Next, by photolithography, a photoresist film 56 exposing the p-channel middle voltage transistor (P-MV) forming region and covering the rest region is formed.

Figure 13A:
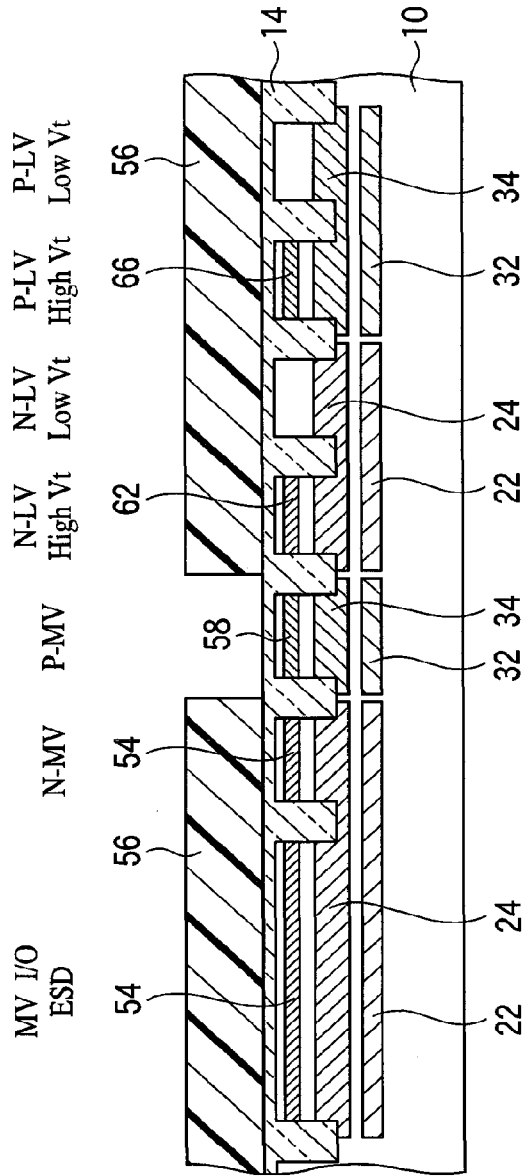

Then, with the photoresist film 56 as the mask, ion implantation is made to form an impurity doped layer 58 for controlling the threshold voltage in the p-channel middle voltage transistor (P-MV) forming region (FIG. 13A). The impurity doped layer 58 is formed, e.g., by ion implanting arsenic ions under the conditions of a 150 keV acceleration energy and a $3 \times 10^{12}$ cm$^{-2}$ dose.

Next, by, e.g., asking, the photoresist film 56 is removed.

Figure 13B:
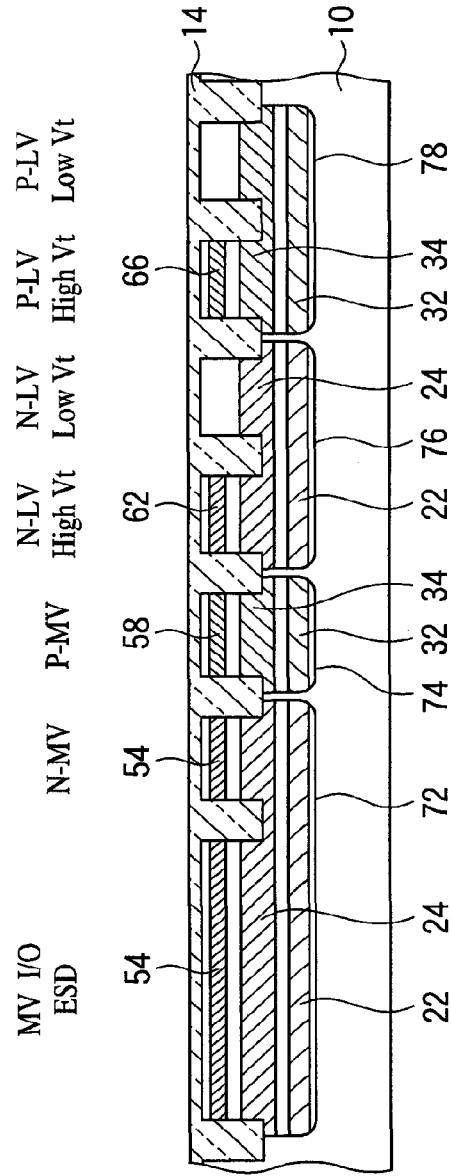

Thus, the p-well 72 formed in the ESD protection element (MV I/O ESD) forming region and the n-channel middle voltage transistor (N-MV) forming region and including the impurity doped layers 22, 24, 54, the n-well 74 formed in the p-channel middle voltage transistor (P-MV) forming region and including the impurity doped layers 32, 34, 58, the p-well 76 formed in the n-channel low voltage transistor (N-LV High Vt, N-LV Low Vt) forming regions and including the impurity doped layers 22, 24, 62, and the n-well 78 formed in the p-channel low voltage transistor (P-LV High Vt, P-LV Low Vt) forming regions and including the impurity doped layers 32, 34, 66 are formed (FIG. 13B).

Next, by, e.g., wet etching using hydrofluoric acid aqueous solution, the silicon oxide film 14 is removed.

Then, thermal oxidation is made, e.g., at 850° C. to form, e.g., a 6 nm-thickness silicon oxide film 88.

Figure 14A:
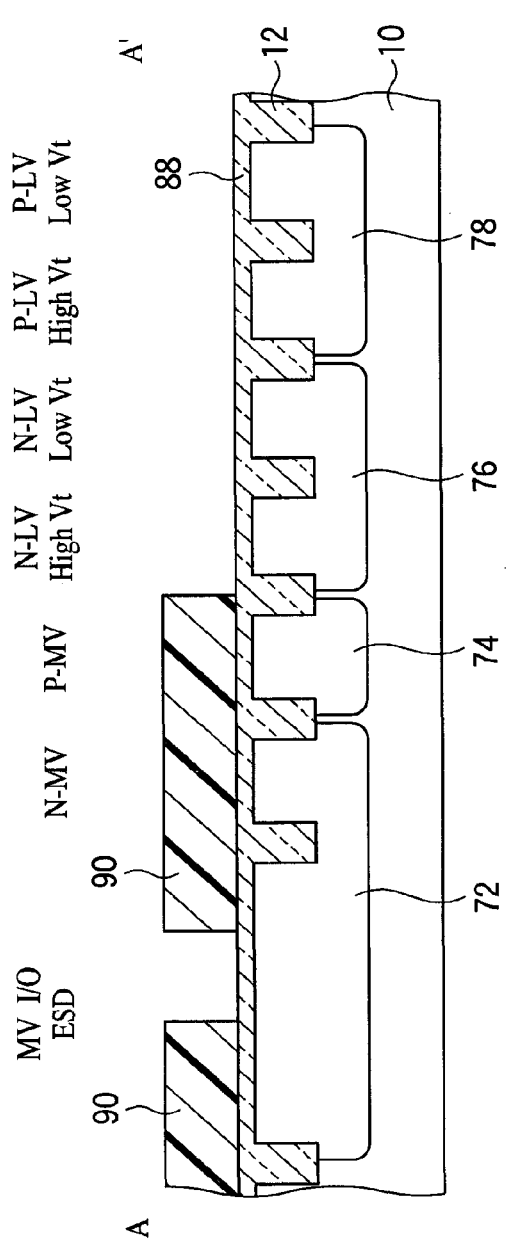
Figure 14B:
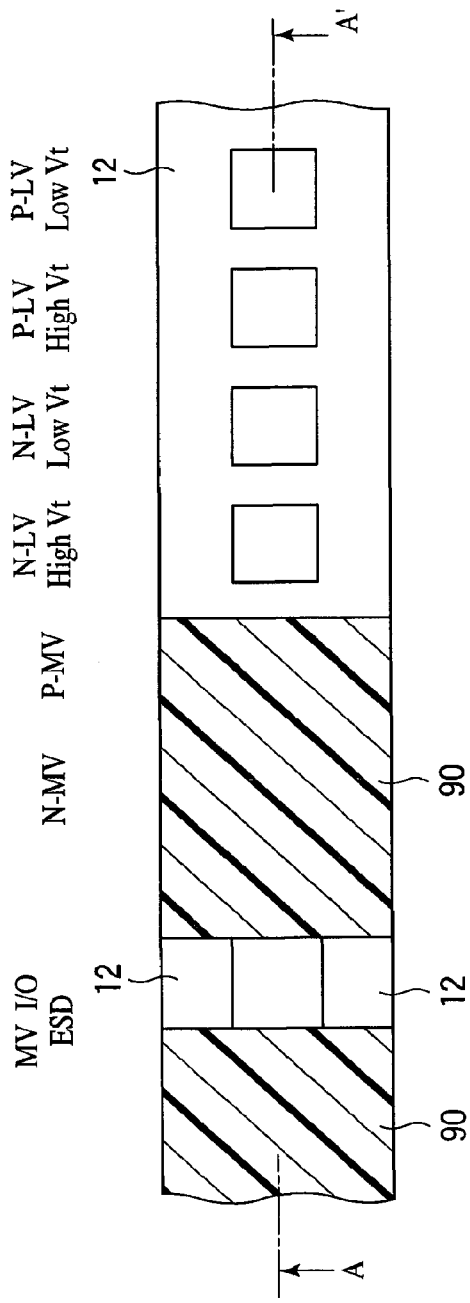
FIG. 14B is a plan view showing the method of manufacturing the semiconductor device according to the second embodiment of the present invention.

Then, by photolithography, a photoresist film 90 covering the middle voltage transistors (N-MV, P-MV) forming regions and exposing the ballast resistor forming region of the ESD protection element (MV I/O ESD) and the low voltage transistor (N-LV Low Vt, N-LV High Vt, P-LV Low Vt, P-LV High Vt) forming regions is formed (FIGS. 14A and 14B).

Next, by, e.g., wet etching using hydrofluoric acid aqueous solution, the silicon oxide film 88 is etched with the photoresist film 90 as the mask to thereby remove the silicon oxide film 88 in the ballast resistor forming region of the ESD protection element (MV I/O ESD) and the low voltage transistor (N-LV Low Vt, N-LV High Vt, P-LV Low Vt, P-LV High Vt) forming regions.

Next, by, e.g., asking, the photoresist film 90 is removed (FIG. 15A).

Then, thermal oxidation of, e.g., 850° C. is made to form the gate insulating film 92 of a 2.2 nm-thickness silicon oxide film on the active regions in the ballast resistor forming region of the ESD protection element (MV I/O ESD) and the low voltage transistor (N-LV Low Vt, N-LV High Vt, P-LV Low Vt, P-LV High Vt) forming regions. In this thermal oxidation step, the film thickness of the silicon oxide film 88 is increased, and in the region of the ESD protection element (MV I/O ESD) forming region other than the ballast resistor forming region thereof and in the middle voltage transistor (N-MV, P-MV) forming regions, the gate insulating film 96 is formed in an 8 nm-thickness (FIG. 15B).

Figure 16A:
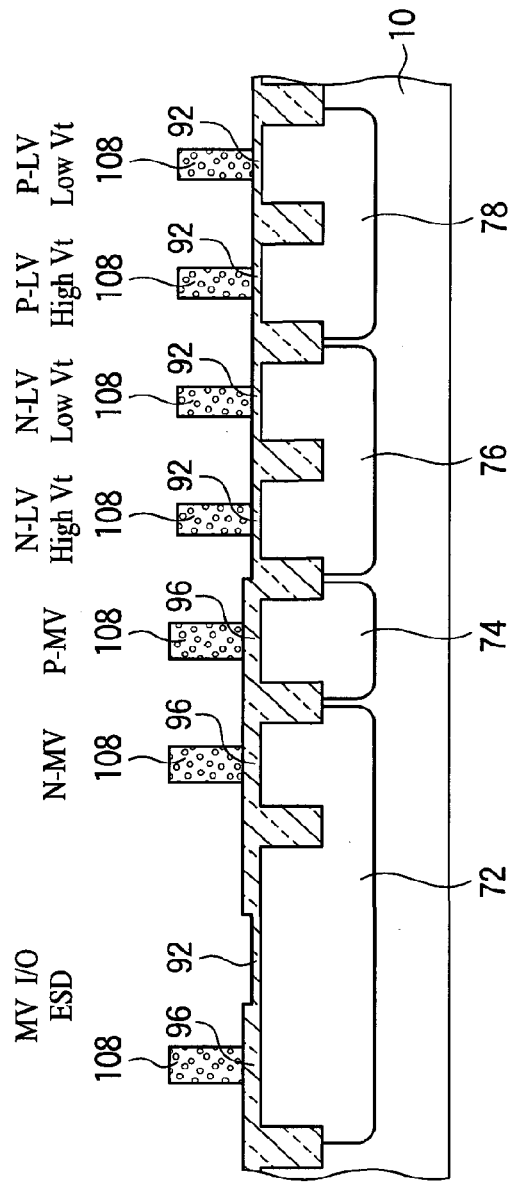
Figure 16B:
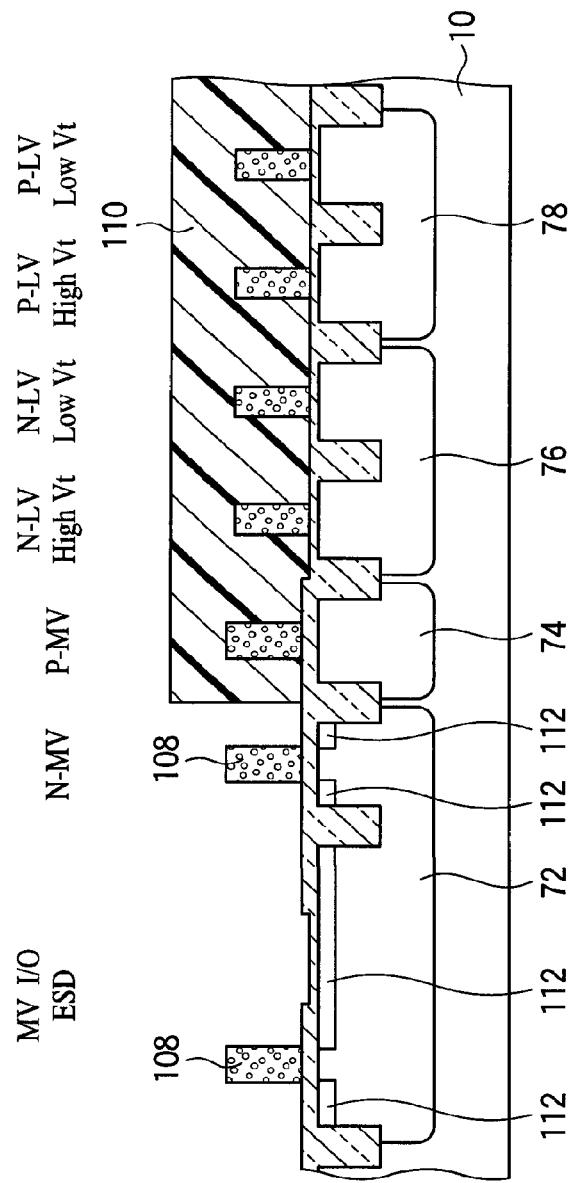

Then, a 180 nm-thickness polycrystalline silicon film, for example, is deposited by CVD method, and by photolithography and dry etching, the polycrystalline silicon film is patterned to form the gate electrodes 108 of the polycrystalline silicon film in the ESD protection element (MV I/O ESD) forming region, the middle voltage transistor (N-MV, P-MV) forming regions and the low voltage transistor (N-LV Low Vt, N-LV High Vt, P-LV Low Vt, P-LV High Vt) forming regions (FIG. 16A). Although not shown, by the over-etching in patterning the polycrystalline silicon film, often the gate insulating films 92, 96 are a little etched, and in such case, the gate insulating films 92, 96 in the regions except the regions where the gate electrodes 108 have been formed have smaller film thicknesses than that in regions immediately below the gate electrodes 108.

Then, by photolithography, a photoresist film 110 exposing the ESD protection element (MV I/O ESD) forming region and the n-channel middle voltage transistor (N-MV) forming region and covering the rest region is formed.

Next, with the gate electrodes 108 and the photoresist film 110 as the mask, ion implantation is made to form the extension regions 112 of the ESD protection element (MV I/O ESD) and the n-channel middle voltage transistor (N-MV) (FIG. 16A). The extension regions 112 are formed, e.g., by ion implanting phosphorus ions under the conditions of a 35 keV acceleration energy and a $4 \times 10^{13}$ cm$^{-2}$ dose.

Then, by, e.g., ashing, the photoresist film 110 is removed.

Next, by photolithography, a photoresist film 114 exposing the p-channel middle voltage transistor (P-MV) forming region and covering the rest region is formed.

Next, with the gate electrodes 108 and the photoresist film 114 as the mask, ion implantation is made to form the extension regions 116 of the p-channel middle voltage transistor (P-MV) (FIG. 17A). The extension regions 116 are formed, e.g., by ion implanting boron difluoride ions (BF$_2^+$) under the conditions of a 10 keV acceleration energy and a $4 \times 10^{13}$ cm$^{-2}$ dose.

Next, by, e.g., ashing, the photoresist film 114 is removed.

Then, by photolithography, a photoresist film 118 exposing the ballast resistor forming region of the ESD protection element (MV I/O ESD) and the n-channel low voltage transistor (N-LV Low Vt, N-LV High Vt) forming regions and covering the rest region is formed.

Next, with the gate electrodes 108 and the photoresist film 118 as the mask, ion implantation is made to form the extension regions 122 in the ballast resistor forming region of the ESD protection element (MV I/O ESD) and the n-channel low voltage transistor (N-LV High Vt, N-LV Low Vt) forming regions. The extension regions 122 are formed, e.g., by ion implanting in 4 directions tilted by 28 degrees to the substrate normal arsenic ions with a 3 keV acceleration energy and in a $1.2 \times 10^{15}$ cm$^{-2}$ dose and boron difluoride ions (BF$_2^+$) with an keV acceleration energy and in a $6.0 \times 10^{12}$ cm$^{-2}$ dose. Thus, the extension regions 122 have pocket regions. In the ballast resistor forming region, the impurity doped layer 12 for forming the ballast resistor is formed of the extension regions 112, 122 (FIG. 17B).

At this time, on the ballast resistor forming region, the gate insulating film 92 of the low voltage transistor, which is thinner than the gate insulating film 96 of the middle voltage transistor, is formed. The gate insulating film 92 of the low voltage transistor originally has a 2.2 nm-film thickness and is very thin in comparison with the 7 nm-thickness gate insulating film 96 of the middle voltage transistor. Often, the gate insulating film 92 in these regions is etched in patterning the polycrystalline silicon film and becomes thinner. Accordingly, fluctuations of the film thickness of the gate insulating film 92 on the ballast resistor forming region can be very small.

Accordingly, fluctuations of the residual film thickness of the gate insulating film 92 in the ballast resistor forming region can be suppressed very small, and fluctuations of the impurity concentration of the extension regions 122 in the ballast resistor forming region with the gate insulating film 92 formed therebetween can be largely suppressed.

Because of the extension regions of the low voltage transistors, which are very shallow, when the extension regions 122 are formed through the gate insulating film 96 of the middle voltage transistor as in the method of manufacturing the semiconductor device according to the first embodiment, the peak of the impurity concentration is positioned in the gate insulating film 96 (refer to FIG. 21A).

However, as in the method of manufacturing the semiconductor device according to the present embodiment, the extension regions 122 are formed through the gate insulating film 92 of the low voltage transistor, whereby the peak of the impurity concentration is positioned in the silicon substrate 10 (refer to FIG. 21B), and fluctuations of the impurity concentration corresponding to fluctuations of the gate insulating film 92 can be suppressed small.

Thus, the ESD protection element having sufficient ESD immunity can be stably formed.

In the ESD protection element (MV I/O ESD) forming region, it is preferable to form the extension regions selectively in the ballast resistor forming region. When the extension regions 122 with pocket regions are formed, there is a possibility that, as shown in FIG. 8, the extension regions 122 of the middle voltage transistors might be extinguished by the pocket regions of the low voltage transistors, and the extension regions 112 could not be formed in a prescribed concentration.

Next, by, e.g., ashing, the photoresist film 118 is removed.

Next, by photolithography, a photoresist film 124 exposing the p-channel low voltage transistor (P-LV Low Vt, P-LV High Vt) forming regions and covering the rest region is formed.

Figure 18A:
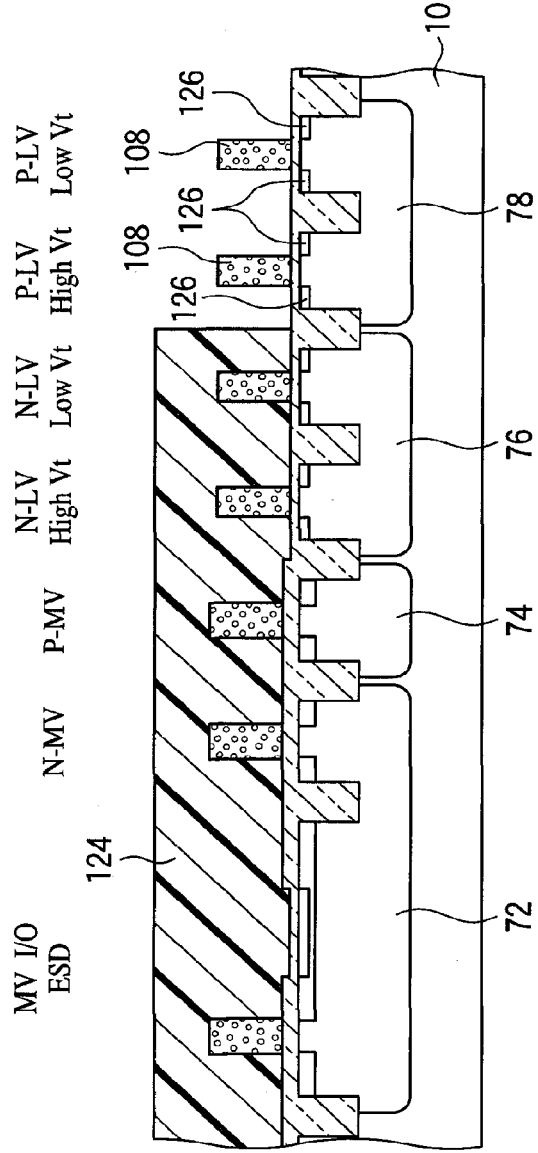

Then, with the gate electrodes 108 and the photoresist film 124 as the mask, ion implantation is made to form the extension regions 126 of the p-channel low voltage/high threshold voltage transistor (P-LV High Vt) and the p-channel low voltage/low threshold voltage transistor (P-LV Low Vt) (FIG. 18A). The extension regions 126 are formed, e.g., by ion implanting in 4 directions tilted by 28 degrees to the substrate normal boron ions with a 0.5 keV acceleration energy and in a $5.7 \times 10^{14}$ cm$^{-2}$ dose and arsenic ions with a 120 keV acceleration energy and in a $7.0 \times 10^{12}$ cm$^{-2}$ dose, and the extension regions have pocket regions.

Next, by, e.g., ashing, the photoresist film 124 is removed.

Next, over the entire surface, a 130 nm-thickness silicon oxide film 136, for example, is deposited by, e.g., thermal CVD method.

Figure 18B:
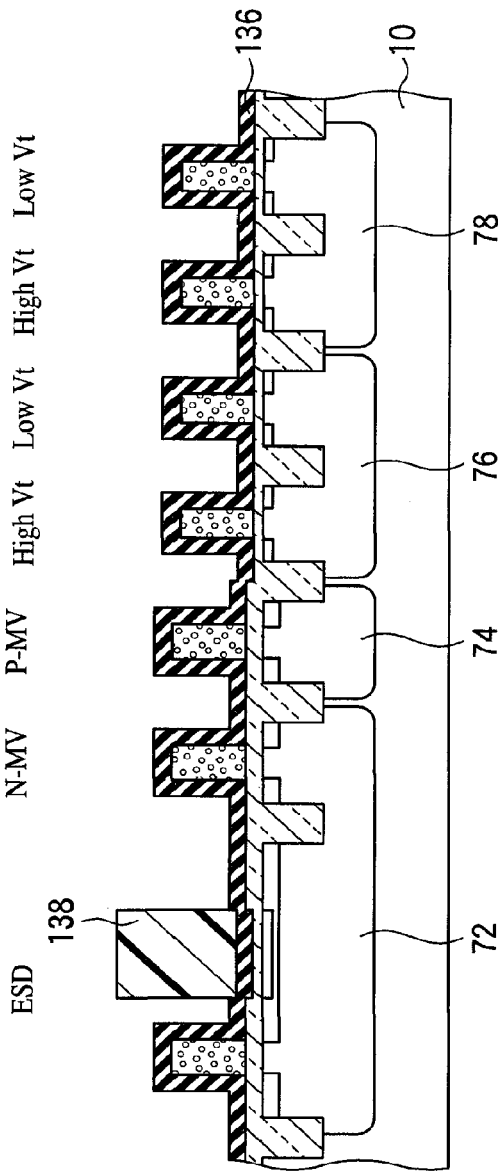

Then, by photolithography, a photoresist film 138 covering the ballast resistor forming region and exposing the rest region is formed on the silicon oxide film 136 (FIG. 18B).

Next, with the photoresist film 138 as the mask, the silicon oxide film 136 is etched back to form the sidewall spacer 144 of the silicon oxide film 136 on the side walls of the gate electrodes 108 and the salicide block 146 of the silicon oxide film 136 in the ballast resistor forming region.

Next, by, e.g., ashing, the photoresist film 138 is removed (FIG. 19A).

The gate insulating film 92 below the salicide block 146 in the ballast resistor forming region has been formed concurrently with the gate insulating film 92 of the low voltage transistors. The gate insulating film 92 is often a little etched by the over-etching in patterning the polycrystalline silicon film. Accordingly, the film thickness of the gate insulating film 92 below the salicide block 146 is not more than the film thickness thereof of the low voltage transistors.

In consideration of the over-etching in patterning the polycrystalline silicon film, the silicon oxide film 136 to be the sidewall spacer 144 and the salicide block 146 is formed over the gate insulating film 92 whose film thickness has been decreased. Accordingly, the film thickness of the gate insulating film 92 below the salicide block 146 in the ballast resistor forming region becomes the same as the film thickness of the gate insulating film 92 below the sidewall spacer 144 formed on the side walls of the gate electrodes 108 of the low voltage transistors.

Then, by photolithography, a photoresist film 148 exposing the p-channel transistor (P-MV, P-LV High Vt, P-LV Low Vt) forming regions and covering the rest region is formed.

Then with the photoresist film 148, the gate electrodes 108 and the sidewall spacer 144 as the mask, ion implantation is made to form the source/drain regions 150 in the p-channel transistor (P-MV, P-LV High Vt, P-LV Low Vt) forming regions (FIG. 19B). At this time, by this ion implantation, the gate electrodes 108 of the p-channel transistors (P-MV, P-LV High Vt, P-LV Low Vt) are doped to be p-type. The source/drain regions 150 are formed, e.g., by ion implanting boron ions under the conditions of a 5 keV acceleration energy and a $4.0 \times 10^{15}$ cm$^{-2}$ dose.

Next, by, e.g., asking, the photoresist film 148 is removed.

Next, by photolithography, a photoresist film 152 exposing the ESD protection element (MV I/O ESD) forming region and the n-channel transistor (N-MV, N-LV High Vt, N-LV Low Vt) forming regions and covering the rest region is formed.

Next, with the photoresist film 152, the gate electrodes 108, the sidewall spacer 144 and the salicide block 146 as the mask, ion implantation is made to form the source/drain regions 154 in the ESD protection element (MV I/O ESD) forming region and the n-channel transistor (N-MV, N-LV High Vt, N-LV Low Vt) forming regions (FIG. 20A). Concurrently with this, by this ion implantation, the gate electrodes 108 of the n-channel transistors (N-MV, N-LV High Vt, N-LV Low Vt) are doped to be n-type. The source/drain regions 154 are formed, e.g., by ion implanting phosphorus ions under the conditions of a 10 keV acceleration energy and a $6.0 \times 10^{15}$ cm$^{-2}$ dose.

Then, by, e.g., asking, the photoresist film 152 is removed.

Next, by the known salicide process, the tops of the gate electrodes 108 and the source/drain regions 150, 154 are selectively silicidized to form the silicide film 156 on the gate electrodes 108 and the source/drain regions 150, 154. At this time, in the ballast resistor forming region, because of the salicide block 146, the silicide film 156 is not formed.

Thus, over the silicon substrate 10, the ESD protection element and the six kinds of transistors are completed.

Next, over the silicon substrate 10 with the transistors, etc. formed on, after the insulating film 156 has been grown, electrode plugs 160, interconnections 162, etc. are formed, and the structure up to the first level metal interconnection is completed (FIG. 20B).

As described above, according to the present embodiment, the ballast resistor of the ESD protection element is formed of the impurity doped layer forming the extension regions of the source/drain regions of the low voltage transistors, and the impurity doped layer forming the extension regions of the source/drain regions of the middle voltage transistors, whereby it is unnecessary to add the ion implantation step special to form the ballast resistor. Thus the ballast resistor can be realized without complicating the manufacturing steps.

The impurity doped layers forming the ballast resistor are formed by the ion implantation made through the thin insulating film formed concurrently with the gate insulating film 92 of the low voltage transistors, whereby the ballast resistance value and the ESD immunity can be more stabilized.

A Third Embodiment

The semiconductor device and method of manufacturing the same according to a third embodiment of the present invention will be explained with reference to FIGS. 22 to 40B. The same members of the present embodiment as those of the semiconductor device and the method of manufacturing the same according to the first and the second embodiments are represented by the same reference numbers not to repeat or to simplify their explanation.

Figure 22:
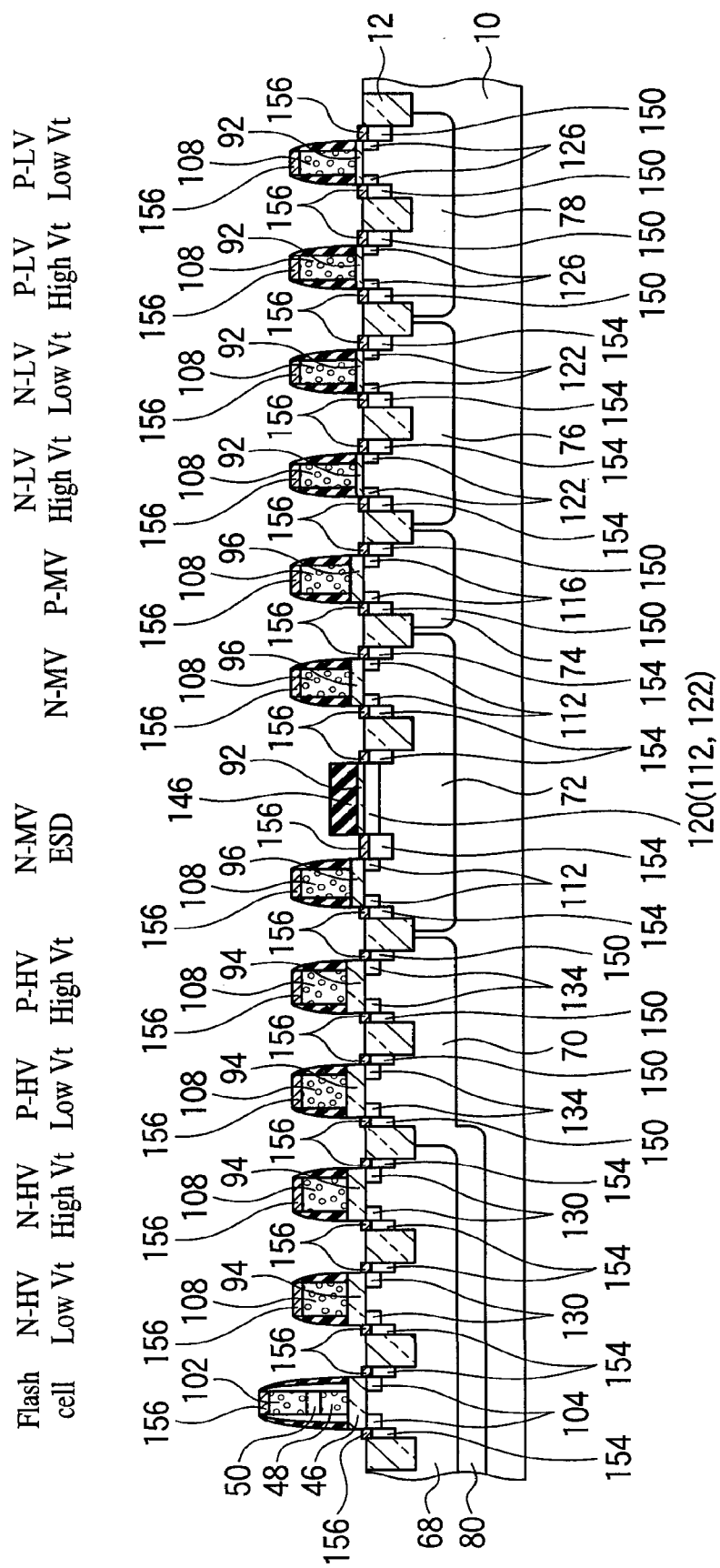
FIG. 22 is a diagrammatic sectional view showing the structure of the semiconductor device according to a third embodiment of the present invention.

FIG. 22 is a diagrammatic sectional view showing the structure of the semiconductor device according to the present embodiment. FIGS. 23A to 40B are sectional views showing the method of manufacturing the semiconductor device according to the present embodiment.

In the present embodiment, the present invention is applied to a semiconductor combined with a flash memory.

First, the structure of the semiconductor device according to the present embodiment will be explained with reference to FIG. 22.

In a silicon substrate 10, a device isolation film 12 for defining active regions is formed. In FIG. 22, the active regions defined by the device isolation film 12 are, sequentially from the left, a flash memory cell (Flash Cell) forming region, an n-channel high voltage/low threshold voltage transistor (N-HV Low Vt) forming region, an n-channel high voltage/high threshold voltage transistor (N-HV High Vt) forming region, a p-channel high voltage/low voltage transistor (P-HV Low Vt) forming region, p-channel high voltage/high threshold voltage transistor (P-HV High Vt) forming region, an ESD protection element (N-MV ESD) forming region, an n-channel middle voltage transistor (N-MV) forming region, a p-channel middle voltage transistor (P-MV) forming region, an n-channel low voltage/high threshold voltage transistor (N-LV High Vt) forming region, an n-channel low voltage/low threshold voltage transistor (N-LV Low Vt) forming region, a p-channel low voltage/high threshold voltage transistor (P-LV High Vt) forming region and a p-channel low voltage/low threshold voltage transistor (P-LV Low Vt) forming region.

In the flash memory cell (Flash Cell) forming region, the n-channel high voltage/low threshold voltage transistor (N-HV Low Vt) forming region and the n-channel high voltage/high threshold voltage transistor (N-HV High Vt) forming region of the silicon substrate 10, a p-well 68 is formed. In the p-channel high voltage/low threshold voltage transistor (P-HV Low Vt) forming region and the p-channel high voltage/high threshold voltage transistor (P-HV High Vt) forming region, an n-well 70 is formed. The p-well 68 is a double well enclosed by the n-well 70, and an n-well 80 formed in the flash memory cell (Flash Cell) forming region, the n-channel high voltage/low threshold voltage transistor (N-HV Low Vt) forming region and the n-channel high voltage/high threshold voltage transistor (N-HV High Vt) forming region. In the ESD protection element (N-MV ESD) forming region and the n-channel middle voltage transistor (N-MV) forming region, a p-well 72 is formed. In the p-channel middle voltage transistor (P-MV) forming region, an n-well 74 is formed. In the n-channel low voltage/high threshold voltage transistor (N-LV High Vt) forming region and the n-channel low voltage/low threshold voltage transistor (N-LV Low Vt) forming region, a p-well 76 is formed. In the p-channel low voltage/high threshold voltage transistor (P-LV High Vt) forming region and the p-channel low voltage/low threshold voltage transistor (P-LV Low Vt) forming region, an n-well 78 is formed.

In the flash memory cell (Flash Cell) forming region, a memory cell transistor including a floating gate 48 formed over the silicon substrate 10 with a tunnel oxide film 46 interposed therebetween, a control gate electrode 102 formed over the floating gate 48 with an ONO film 50 interposed therebetween, source/drain regions 104, 154 formed in the silicon substrate 10 on both sides of e control gate electrode 102 is formed. The flash memory cell (Flash Cell) is a flash EPROM of the stacked gate structure and memorizes prescribed information in the floating gate as charges.

In the n-channel high voltage/high threshold voltage transistor (N-HV High Vt) forming region and the n-channel high voltage/low threshold voltage transistor (N-HV Low Vt) forming region, an n-channel high voltage transistor including a gate electrode 108 formed over the silicon substrate 10 with a gate insulating film 94 interposed therebetween, and source/drain regions 154 including extension regions (or LDD regions) 130 formed in the silicon substrate 10 on both sides of the gate electrode 108 is formed.

In the p-channel high voltage/high threshold voltage transistor (P-HV High Vt) forming region and the p-channel high voltage/low threshold voltage transistor (P-HV Low Vt) forming region, a p-channel high voltage transistor including a gate electrode 108 formed over the silicon substrate 10 with a gate insulating film 94 interposed therebetween, and source/drain regions 150 including extension regions (or LDD regions) 134 formed in the silicon substrate 10 on both sides of the gate electrode 108 is formed.

The n-channel high voltage/low threshold voltage transistor (N-HV Low Vt), the n-channel high voltage/high threshold voltage transistor (N-HV High Vt), the p-channel high voltage/low threshold voltage transistor (P-HV Low Vt) and the p-channel high voltage/high threshold voltage transistor (P-HV High Vt) are transistors forming the control circuit of the flash memory cell, and voltages which are, e.g., 5 V when the flash memory cell is read and a little less than 10 V when the flash memory cell is written or erased are applied to them. The high voltage transistors, to which such high voltages are applied, has the gate insulating film made thicker than the low voltage transistors and the middle voltage transistors.

In the n-channel middle voltage transistor (N-MV) forming region, a middle voltage transistor including a gate electrode 108 formed over the silicon substrate 10 with the gate insulating film 96 interposed therebetween, and source/drain regions 154 including extension regions (or LDD regions) 112 formed in the silicon substrate 10 on the sides of the gate electrode 108 is formed.

In the p-channel middle voltage transistor (P-MV) forming region, a p-channel middle voltage transistor including a gate electrode 108 formed over the silicon substrate 10 with the gate insulating film 96 interposed therebetween, and source/drain regions 150 including extension regions (or LDD regions) 116 formed in the silicon substrate 10 on both sides of the gate electrode 108 is formed.

In the n-channel low voltage/high threshold voltage transistor (N-LV High Vt) forming region and the n-channel low voltage/low threshold voltage transistor (N-LV Low Vt) forming region, an n-channel low voltage transistor including a gate electrode 108 formed over the silicon substrate 10 with the gate insulating film 92 interposed therebetween, and source/drain regions 154 including extension regions (or LDD regions) 122 formed in the silicon substrate 10 on both sides of the gate electrode 108 is formed.

In the p-channel low voltage/high threshold voltage transistor (P-LV High Vt) forming region and the p-channel low voltage/low threshold voltage transistor (P-LV Low Vt) forming region, a p-channel low voltage transistor including a gate electrode 108 formed over the silicon substrate 10 with the gate insulating film 92 interposed therebetween, and source/drain regions 150 including extension regions (or LDD regions) 126 formed in the silicon substrate 10 on both sides of the gate electrode 108 is formed.

In the ESD protection element (N-MV ESD) forming region, an ESD protection element including a middle voltage transistor and a ballast resistor is formed. The middle voltage transistor includes a gate electrode 108 formed over the silicon substrate 10 with the gate insulating film 96 interposed therebetween, and source/and drain regions 154 including extension regions (or LDD regions) 112 formed in the silicon substrate 10 on both sides of the gate electrode 108. The ballast resistor is formed of an impurity doped layer 120 serially connected to the source/drain region 154 of the middle voltage transistor. The impurity doped layer 120 is formed of the combination of the impurity doped layer forming the extension regions 122 of the low voltage transistor, and the impurity doped layer forming the extension regions 112 of the middle voltage transistor.

On the gate electrodes 108 and the source/drain regions 150, 154 of the respective transistors, a silicide film 156 is formed. Over the impurity doped layer 120 forming the ballast resistor, a salicide block 146 is formed with the gate insulating film 92 interposed therebetween, and the silicide film is not formed. The gate insulating film 92 below the salicide block 146 has the same film thickness as that below the sidewall spacer 144 formed on the side walls of the gate electrodes 108 of the low voltage transistor.

As described above, the semiconductor device according to the present embodiment has a feature that the ballast resistor of the ESD protection element is formed of the impurity doped layer forming the extension regions 122 of the low voltage transistors and the impurity doped layer forming the extension regions 112 of the middle voltage transistors, and a feature that the gate insulating film 92 below the silicide block 146 has the same film thickness as that below the sidewall spacer 144 formed on the side walls of the gate electrodes 108 of the low voltage transistors, and is the same as the semiconductor device according to the second embodiment except that the former includes the flash cell and the high voltage transistors. The ballast resistor is thus formed, whereby the ballast resistance value and the ESD immunity can be stabilized without complicating the manufacturing steps.

Next, the method of manufacturing the semiconductor device according to the present embodiment will be explained with reference to FIGS. 23A to 40B.

Figure 23A:
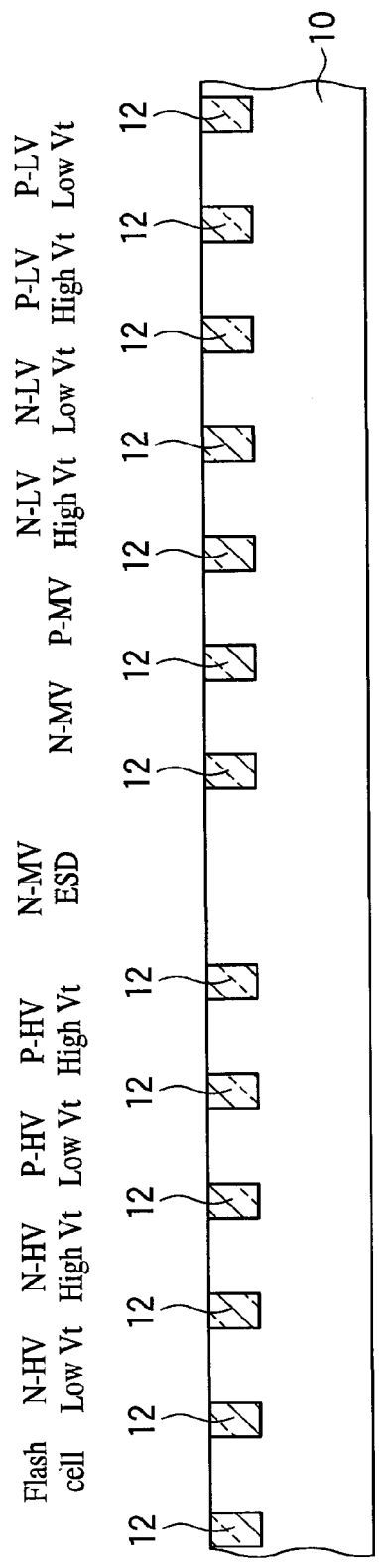

First, in the silicon substrate 10, the device isolation film 12 is formed by, e.g., STI method (FIG. 23A). For example, first, by thermal oxidation, a 10 nm-thickness silicon oxide film, for example, is grown. Next, by CVD method, a 100 nm-thickness silicon nitride film, for example, is grown. Next, by lithography and dry etching, the silicon nitride film, the silicon oxide film and the silicon substrate 10 are sequentially etched to form trenches of, e.g., a 30 nm-depth in the silicon substrate 10. Next, the silicon substrate is thermally oxidized to form silicon oxide film in the inside walls of the trenches. Then, by high density plasma CVD method, for example, a 550 nm-thickness silicon oxide film, for example, is grown. Then, by CMP method, the silicon oxide film is planarized until the silicon nitride film is exposed to thereby form the device isolation film 12 of the silicon oxide film buried in the trenches.

In FIGS. 23A to 40B, the active regions defined by the device isolation film 12 are, sequentially from the left, the flash memory cell (Flash Cell) forming region, the n-channel high voltage/low threshold voltage transistor (N-HV Low Vt) forming region, the n-channel high voltage/high threshold voltage transistor (N-HV High Vt) forming region, the p-channel high voltage/low threshold voltage transistor (P-HV Low Vt) forming region, the p-channel high voltage/high threshold voltage transistor (P-HV High Vt) forming region, the ESD protection element (N-MV ESD) forming region, the n-channel middle voltage transistor (N-MV) forming region, the p-channel middle voltage transistor (P-MV) forming region, the n-channel low voltage/high threshold voltage transistor (N-LV High Vt) forming region, the n-channel low voltage/low threshold voltage transistor (N-LV Low Vt) forming region, the p-channel low voltage/high threshold voltage transistor (P-LV High Vt) forming region and the p-channel low voltage/low threshold voltage transistor (P-LV Low Vt) forming region.

Then, after the silicon nitride film and the silicon oxide film used in forming the device isolation film 12 has been removed, the silicon substrate 10 is thermally oxidized to grow, e.g., a 10 nm-thickness silicon oxide film 14 as the sacrificial oxidation film.

Next, by photolithography, a photoresist film 16 exposing the flash memory cell (Flash Cell) forming region and the n-channel high voltage transistor (N-HV High Vt, N-HV Low Vt) forming regions and covering the rest region is formed.

Figure 23B:
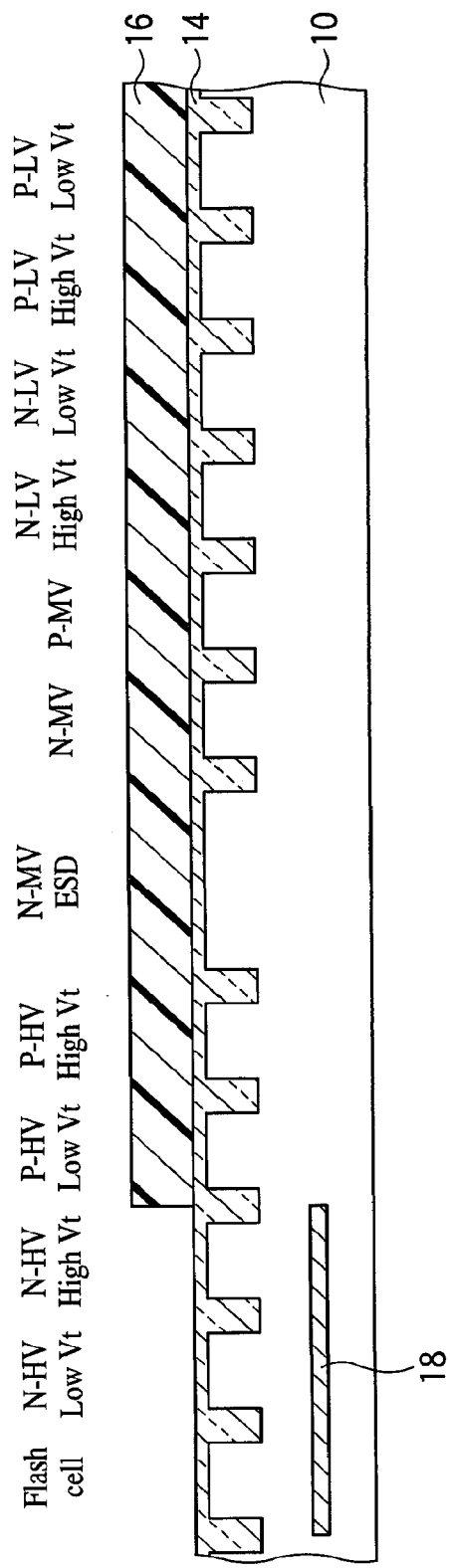

Next, with the photoresist film 16 as the mask, ion implantation is made to form an n-type buried impurity doped layer 18 in the flash memory cell (Flash Cell) forming region and the n-channel high voltage transistor (N-HV High Vt, N-HV Low Vt) forming regions (FIG. 23B). The n-type buried impurity doped layer 18 is formed, e.g., by ion implanting phosphorus ions under the conditions of a 2 MeV acceleration energy and a $2 \times 10^{13}$ cm$^{-2}$ dose.

Next, by, e.g., asking, the photoresist film 16 is removed.

Next, by photolithography, a photoresist film 20 exposing the flash memory cell (Flash Cell) forming region, the n-channel high voltage transistor (N-HV High Vt, N-HV Low Vt) forming regions, the ESD protection element (N-MV ESD) forming region, the n-channel middle voltage transistor (N-MV) forming region, the n-channel low voltage transistor (N-LV High Vt, N-LV Low Vt) forming regions and covering the rest region is formed.

Figure 24A:
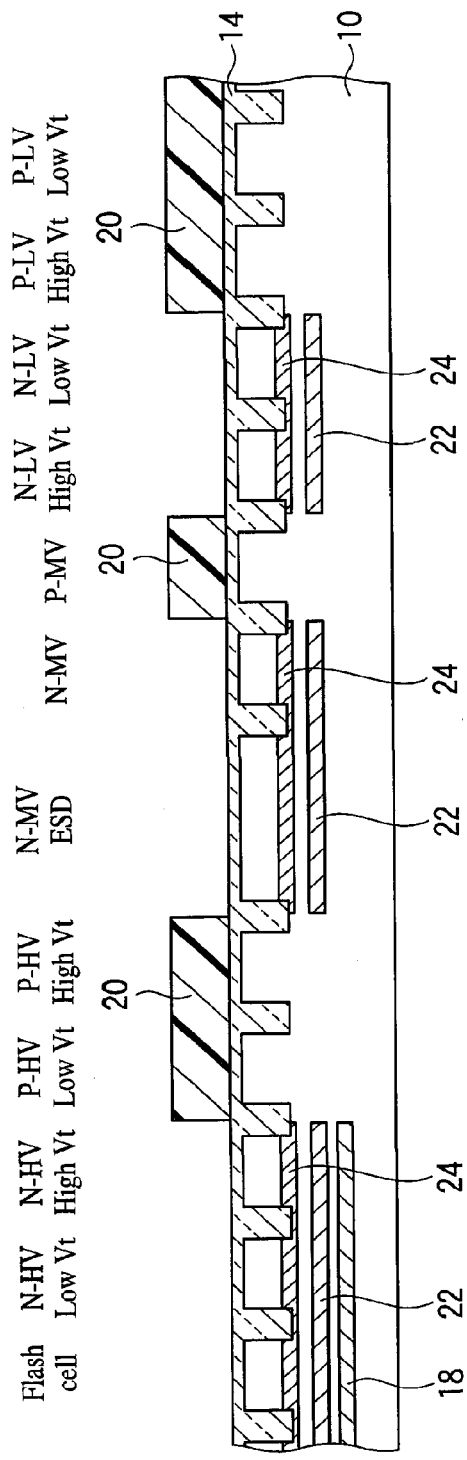

Then, with the photoresist film 20 as the mask, ion implantation is made to form the impurity doped layers 22, 24 for forming the p-well in the flash memory cell (Flash Cell) forming region, the n-channel high voltage transistor (N-HV High Vt, N-HV Low Vt) forming regions, the ESD protection element (N-MV ESD) forming region, the n-channel middle voltage transistor (N-MV) forming region and the n-channel low voltage transistor (N-LV High Vt, N-LV Low Vt) forming regions (FIG. 24A). The impurity doped layer 22 is formed by, e.g., by ion implanting boron ions (B$^+$) under the conditions of a 400 keV acceleration energy and a $1.4 \times 10^{13}$ cm$^{-2}$ dose. The impurity doped layer 24 is formed, e.g., by ion implanting boron ions under the conditions of a 100 keV acceleration energy and a $3.0 \times 10^{12}$ cm$^{-2}$ dose. The impurity doped layer 24 is an impurity doped layer for forming the channel stop.

Then, by, e.g., ashing, the photoresist film 20 is removed.

Then, by photolithography, a photoresist film 26 exposing the n-channel high voltage/high threshold voltage transistor (N-HV High Vt) forming region, the ESD protection element (N-MV ESD) forming region, the n-channel middle voltage transistor (N-MV) forming region and the n-channel low voltage transistor (N-LV High Vt, N-LV Low Vt) forming regions and covering the rest region is formed.

Figure 24B:
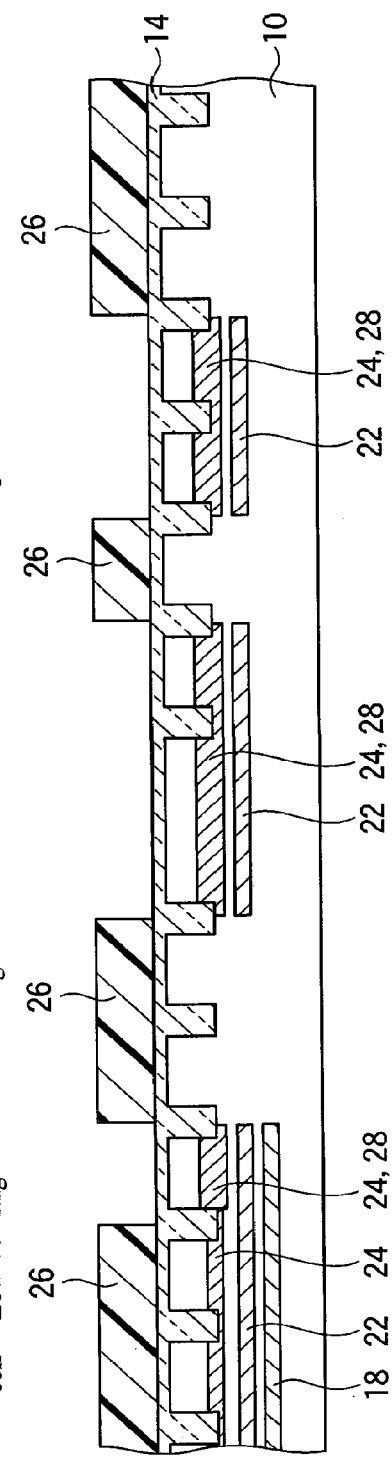

Next, with the photoresist film 26 as the mask, ion implantation is made to form the impurity doped layer 28 for forming the p-well in the n-channel high voltage/high threshold voltage transistor (N-HV High Vt) forming region, the ESD protection element (N-MV ESD) forming region, the n-channel middle voltage transistor (N-MV) forming region and the n-channel low voltage transistor (N-LV High Vt, N-LV Low Vt) forming regions (FIG. 24B). The impurity doped layer 28 is formed, e.g., by ion implanting boron ions under the conditions of a 100 keV acceleration energy and a $4\times10^{12}$ cm$^{-2}$ dose. The impurity doped layer 28 is an impurity doped layer for controlling the threshold voltage of the n-channel high voltage/high threshold voltage transistor (N-HV High Vt) and the channel stop of the n-channel low voltage transistors (N-LV High Vt, N-LV Low Vt).

Next, by, e.g., ashing, the photoresist film 26 is removed.

Next, by photolithography, a photoresist film 30 exposing the p-channel high voltage transistor (P-HV Low Vt, P-HV High Vt) forming regions, the p-channel middle voltage transistor (P-MV) forming region and the p-channel low voltage transistor (P-LV High Vt, P-LV Low Vt) forming regions and covering the rest region is formed.

Figure 25A:
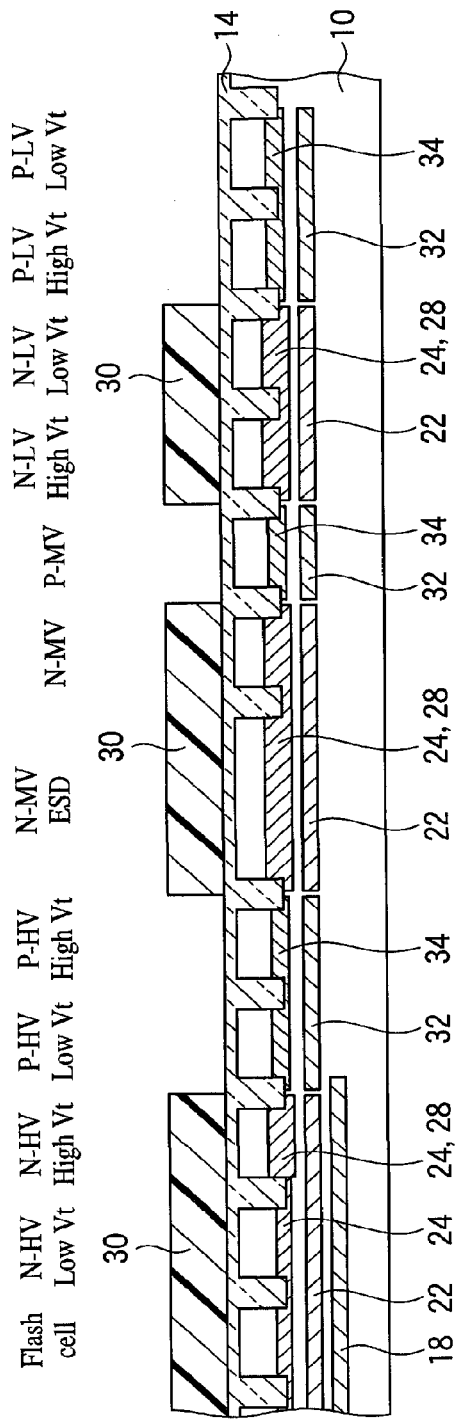

Then, with the photoresist film 30 as the mask, ion implantation is made to form an impurity doped layers 32, for the n-wells in the p-channel high voltage transistor (P-HV Low Vt, P-HV High Vt) forming regions, the p-channel middle voltage transistor (P-MV) forming region and the p-channel low voltage transistor (P-LV High Vt, P-LV Low Vt) forming regions (FIG. 25A). The impurity doped layer 32 is formed, e.g., by ion implanting phosphorus ions under the conditions of a 600 keV acceleration energy and a $1.5\times10^{13}$ cm$^{-2}$ dose. The impurity doped layer 34 is formed, e.g., by ion implanting phosphorus ions under the conditions of a 240 keV acceleration energy and a $0.9\times10^{12}$ cm$^{-2}$ dose. The impurity doped layer 34 is for controlling the threshold voltage of the p-channel high voltage/low threshold voltage transistor and can be suitably adjusted.

Then, by, e.g., asking, the photoresist film 30 is removed.

Next, by photolithography, a photoresist film 36 exposing the p-channel high voltage/high threshold voltage transistor (P-HV High Vt) forming region, the p-channel middle voltage transistor (P-MV) forming region and the p-channel low voltage transistor (P-LV High Vt, P-LV Low Vt) forming regions and covering the rest region is formed.

Figure 25B:
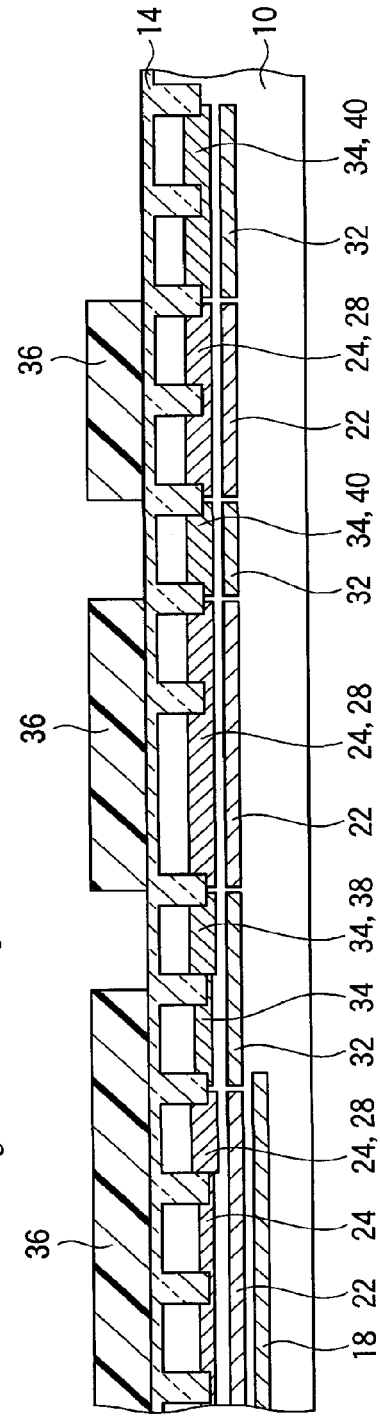

Next, with the photoresist film 36 as the mask, ion implantation is made to form an impurity doped layer 38 for controlling the threshold voltage in the p-channel high voltage/ high threshold voltage transistor (P-HV High Vt) forming region and the channel stop layer 40 in the p-channel middle voltage transistor (P-MV) forming region and the p-channel low voltage transistor (P-LV High Vt, P-LV Low Vt) forming regions (FIG. 25B). The impurity doped layer 38 and the channel stop layer 40 are formed, e.g., by ion implanting phosphorus ions under the conditions of a 240 keV acceleration energy and a $4.0\times10^{12}$ cm$^{-2}$ dose.

Then, by, e.g., asking, the photoresist film 36 is removed.

Next, by photolithography, a photoresist film 42 exposing the flash memory cell (Flash Cell) forming region and covering the rest region is formed.

Figure 26A:
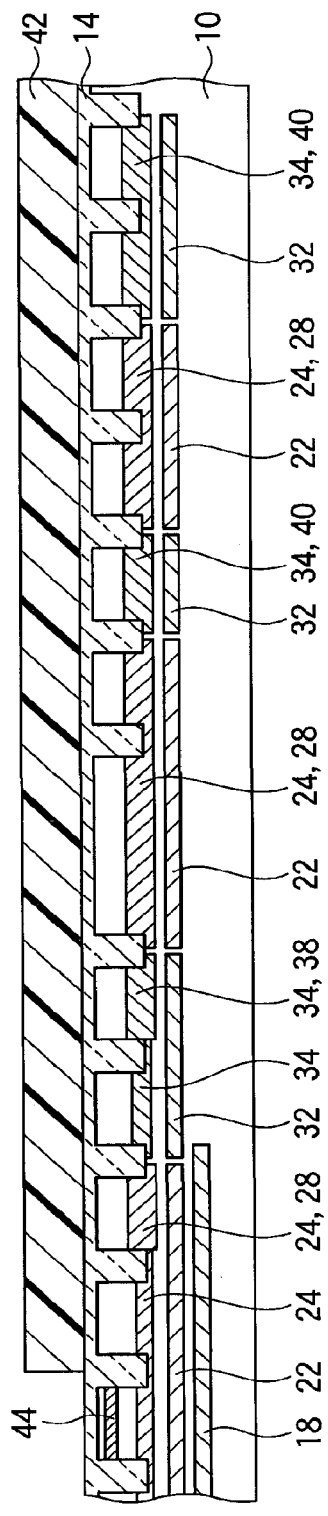

Next, with the photoresist film 42 as the mask, ion implantation is made to form an impurity doped layer 44 for controlling the threshold voltage in the flash memory cell (Flash Cell) forming region (FIG. 26A). The impurity doped layer 44 is formed, e.g., by ion implanting boron ions under the conditions of a 40 keV acceleration energy and a $6\times10^{13}$ cm$^{-2}$ dose.

Then, by, e.g., ashing, the photoresist film 42 is removed.

Then, the silicon oxide film 14 as the sacrificial oxidation film is removed with hydrofluoric acid aqueous solution.

Figure 26B:
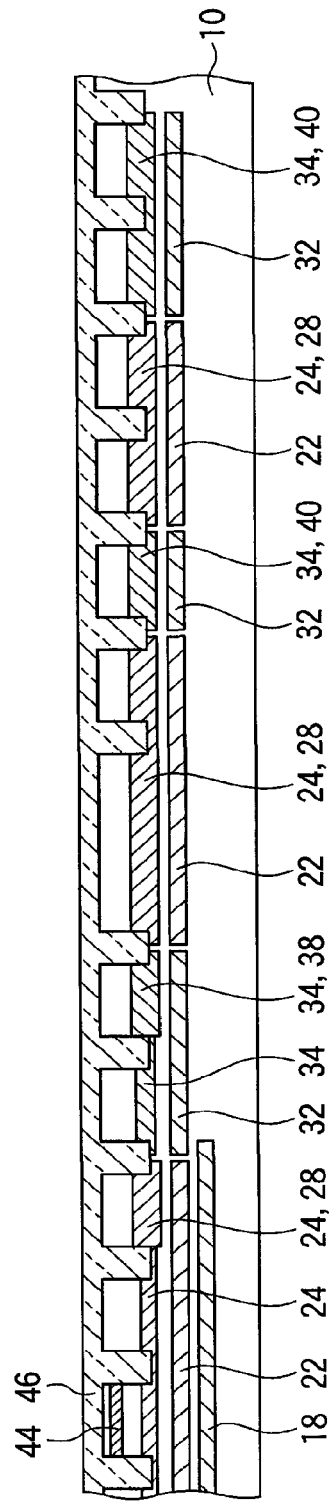

Next, thermal oxidation, for example, is made for 30 minutes at 900-1050° C. to form a 10 nm-thickness tunnel oxide film 46 on the active regions (FIG. 26B).

Then, by, e.g., CVD method, a 90 nm-thickness phosphorus doped amorphous silicon film, for example, is grown on the tunnel oxide film 46.

Then, by photolithography and dry etching, the amorphous silicon film is patterned to form the floating gate 48 of the amorphous silicon film in the flash memory cell (Flash Cell) forming region.

Figure 27A:
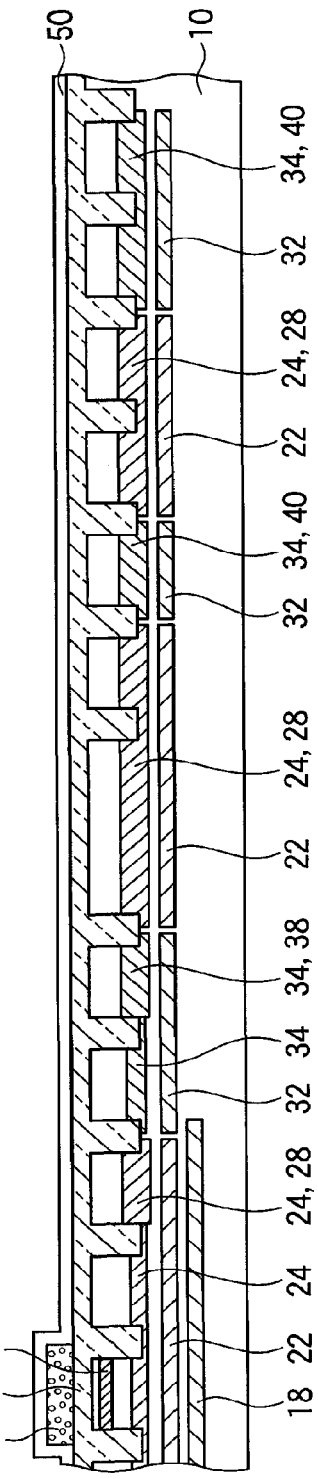

Next, over the tunnel oxide film 46 with the floating gate 48 formed on, a 5 nm-thickness silicon oxide film, for example, and a 10 nm-thickness silicon nitride film, for example, are grown by, e.g., CVD method, and then the surface of the silicon nitride film is thermally oxidized for 90 minutes at 950° C. Thus, an about 30 nm-thickness ONO film 50 of the silicon oxide film/silicon nitride film/silicon oxide film structure is formed (FIG. 27A). By the thermal processing in forming the tunnel oxide film 46 and the ONO film 50, the well impurities are diffused by above 0.1-0.2 µm, and the impurity distributions are made broad.

Then, by photolithography, a photoresist film 52 exposing the n-channel middle voltage transistor (N-MV) forming region and covering the rest region is formed.

Figure 27B:
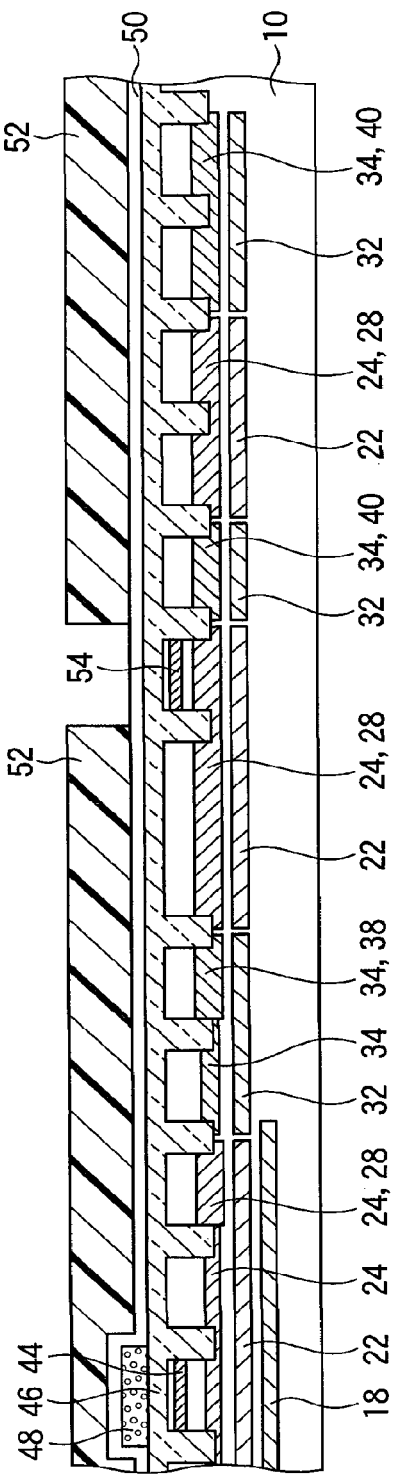

Next, with the photoresist film 52 as the mask, ion implantation is made to form an impurity doped layer 54 for controlling the threshold voltage in the n-channel middle voltage transistor (N-MV) forming region (FIG. 27B). The impurity doped layer 54 is formed, e.g., by ion implanting boron ions under the conditions of a 35 keV acceleration energy and a $5.0\times10^{12}$ cm$^{-2}$ dose.

Next, by, e.g., ashing, the photoresist film 52 is removed.

Then, by photolithography, a photoresist film 56 exposing the p-channel middle voltage transistor (P-MV) forming region and covering the rest region is formed.

Figure 28A:
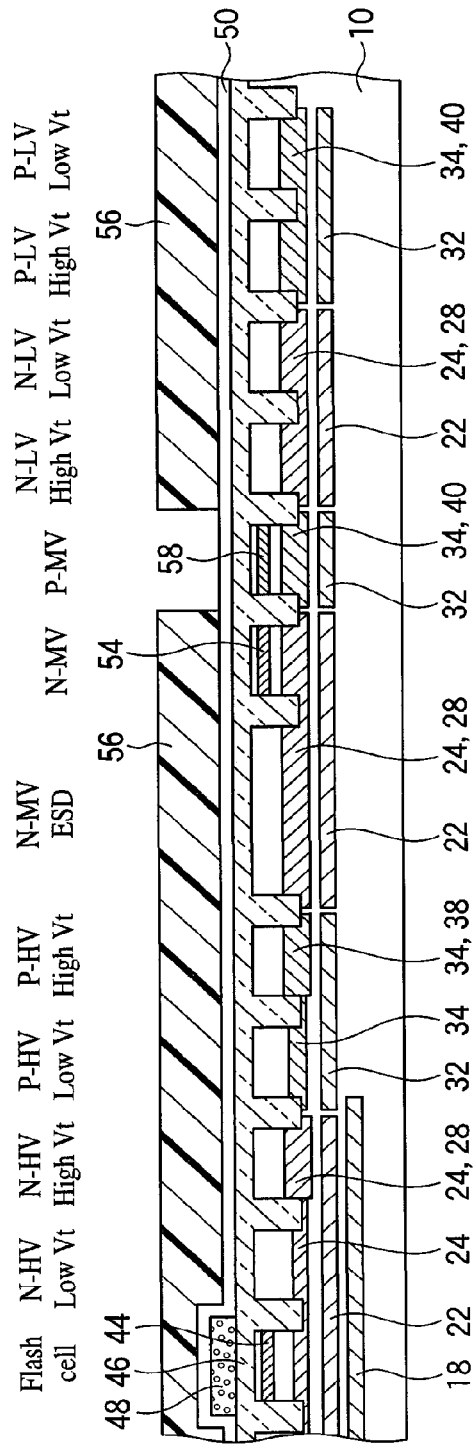

Next, with the photoresist film 56 as the mask, ion implantation is made to form an impurity doped layer 58 for controlling the threshold voltage in the p-channel middle voltage transistor (P-MV) forming region (FIG. 28A). The impurity doped layer 58 is formed, e.g., by ion implanting arsenic ions (As$^+$) under the conditions of a 150 keV acceleration energy and a $2\times10^{12}$ cm$^{-2}$ dose.

Next, by, e.g., ashing, the photoresist film 56 is removed.

Then, by photolithography, a photoresist film 60 exposing the n-channel low voltage/high threshold voltage transistor (N-LV High Vt) forming region and covering the rest region is formed.

Figure 28B:
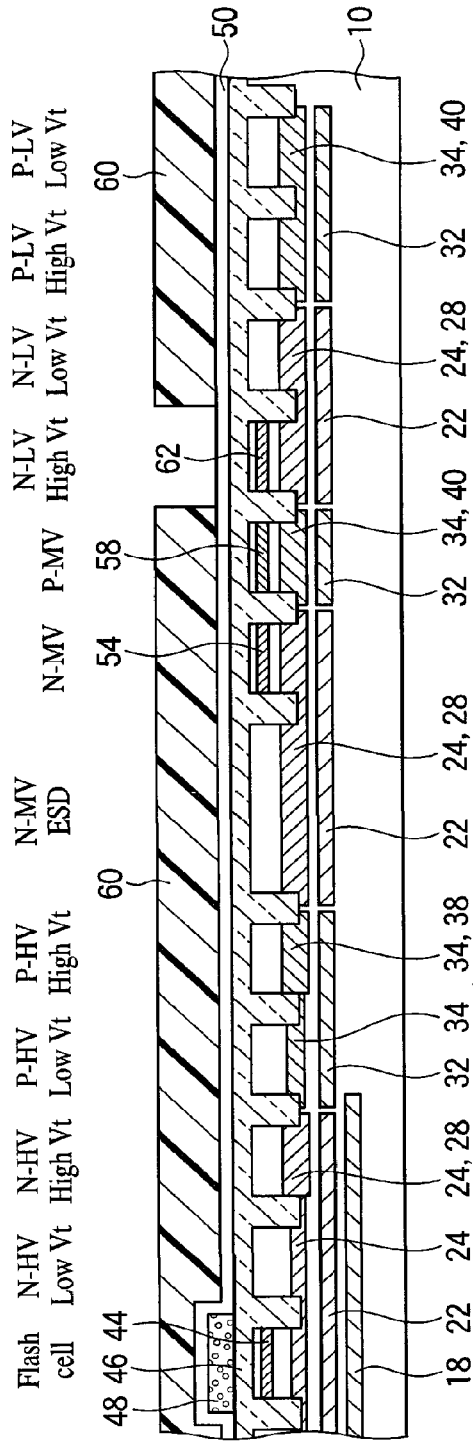

Next, with the photoresist film 60 as the mask, ion implantation is made to form an impurity doped layer 62 for controlling the threshold voltage in the n-channel low voltage/ high threshold voltage transistor (N-LV High Vt) forming region (FIG. 28B). The impurity doped layer 62 is formed, e.g., by ion implanting boron ions under the conditions of a 15 keV acceleration energy and a $7.0\times10^{12}$ cm$^{-2}$ dose.

Then, by, e.g., ashing, the photoresist film 60 is removed.

Next, by photolithography, a photoresist film 64 exposing the p-channel low voltage/high threshold voltage transistor (P-LV High Vt) forming region and covering the rest region is formed.

Figure 29A:
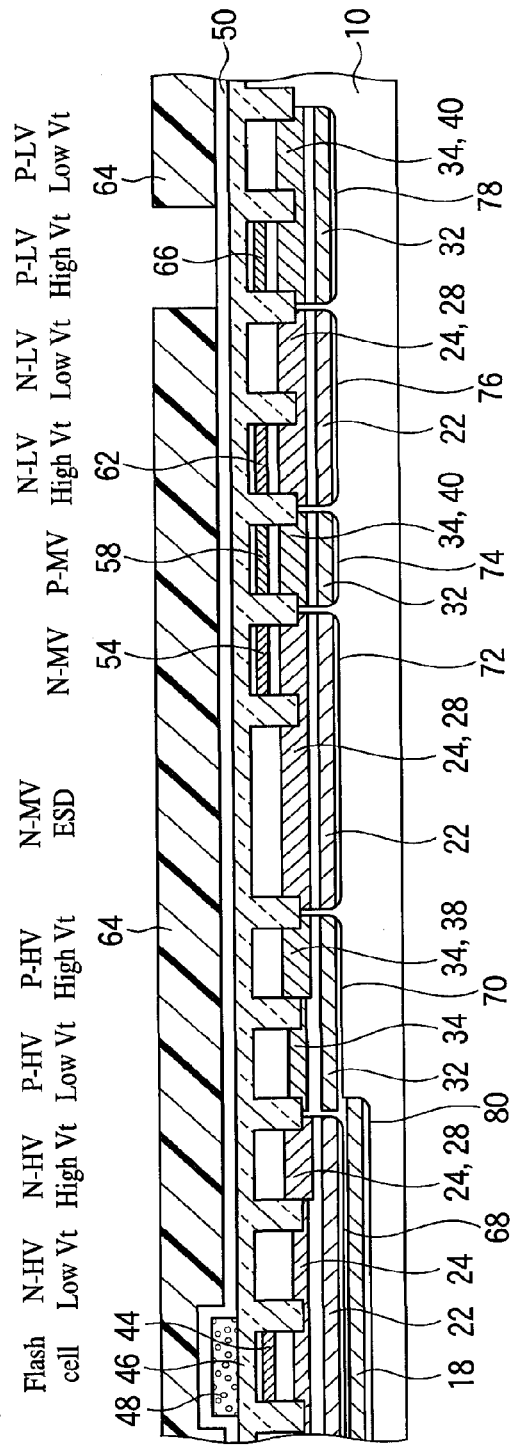

Next, with the photoresist film 64 as the mask, ion implantation is made to form an impurity doped layer 66 for controlling the threshold voltage in the p-channel low voltage/ high threshold voltage transistor (P-LV High Vt) forming region (FIG. 29A). The impurity doped layer 66 is formed, e.g., by ion implanting arsenic ions under the conditions of a 150 keV acceleration energy and a $6.0\times10^{12}$ cm$^{-2}$ dose.

Next, by, e.g., ashing, the photoresist film 64 is removed.

Thus are formed the p-well 68 formed in the flash memory cell (Flash Cell) forming region and the n-channel high voltage transistor (N-HV Low Vt, N-HV High Vt) forming regions and including the impurity doped layers 22, 24, 28, 44, the n-well 70 formed in the p-channel high voltage transistor (P-HV Low Vt, P-HV High Vt) forming regions and including the impurity doped layers 32, 34, 38, the p-well 72 formed in the ESD protection element (N-MV ESD) forming region and the n-channel middle voltage transistor (N-MV) forming region and including the impurity doped layers 22, 24, 28, 54, the n-well 74 formed in the p-channel middle voltage transistor (P-MV) forming region and including the impurity doped layers 32, 34, 58, and the channel stop layer 40, the p-well 76 formed in the n-channel low voltage transistor (N-LV High Vt, N-LV Low Vt) forming regions and including the impurity doped layers 22, 24, 28, 62, and n-well 78 formed in the p-channel low voltage transistor (P-LV High Vt, P-LV Low Vt) forming regions and including the impurity doped layers 32, 34, 66 and the channel stop layer 40. The n-well 70 functions together with the n-type buried impurity doped layer 18 as the n-well 80 enclosing the p-well 68. That is, the p-well 68 is a double well formed inside the n-well 80 (refer to FIG. 29A).

Next, by photolithography, a photoresist film 82 covering the flash memory cell (Flash Cell) forming region and exposing the rest region is formed.

Next, by, e.g., dry etching and with the photoresist film 82 as the mask, the ONO film 50 is etched to remove the ONO film 50 in the region except the flash memory cell (Flash Cell) forming region.

Figure 29B:
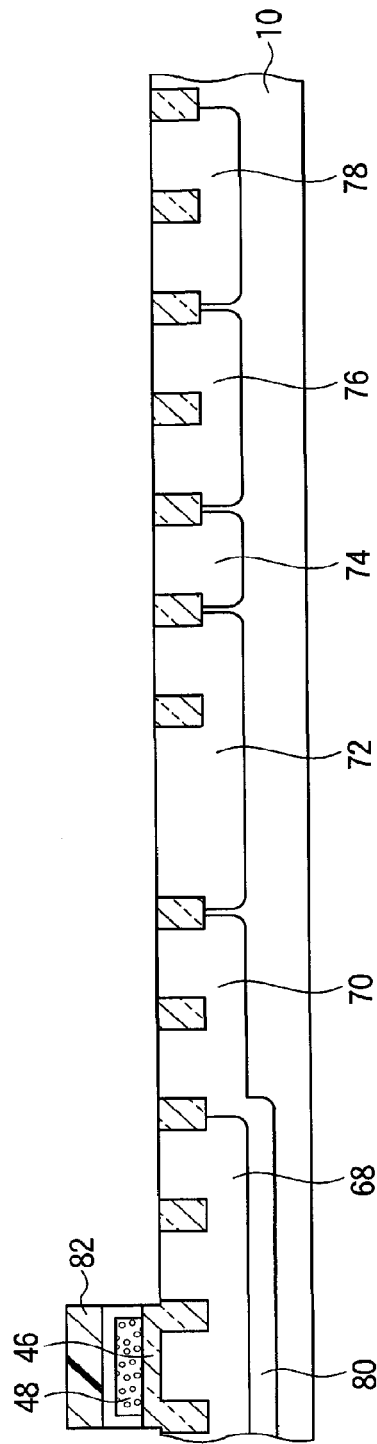

Then, by wet etching using, e.g., hydrofluoric acid aqueous solution and with the photoresist film 82 as the mask, the tunnel oxide film 46 is etched to remove the tunnel oxide film 46 in the region except the flash memory cell (Flash Cell) forming region (FIG. 29B).

Then, by, e.g., asking, the photoresist film 82 is removed.

Figure 30A:
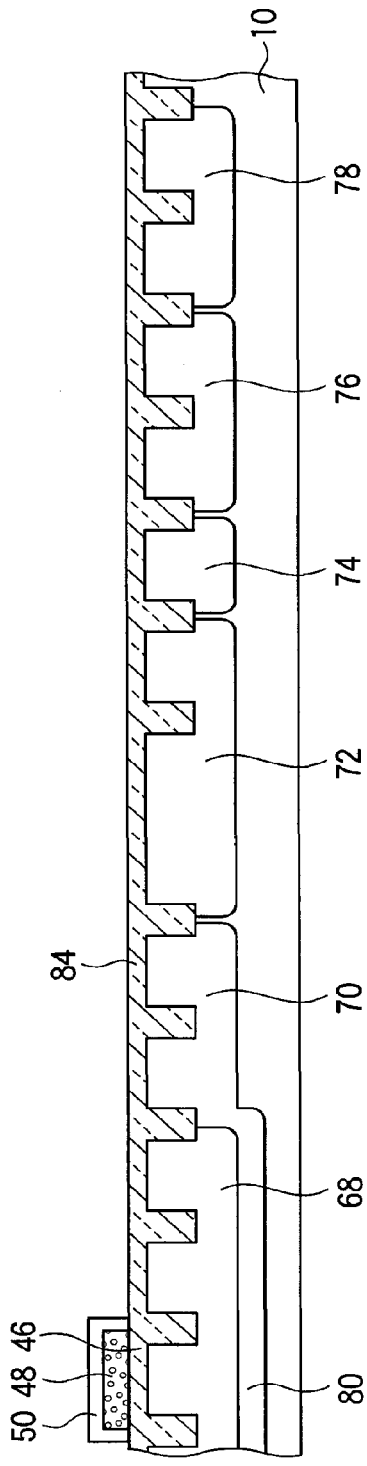

Next, thermal oxidation of 850° C., for example, is made to form a 13 nm-thickness silicon oxide film 84 on the active regions (FIG. 30A).

Next, by photolithography, a photoresist film 86 covering the flash memory cell (Flash Cell) forming region and the high voltage transistor (N-HV Low Vt, N-HV High Vt, P-HV Low Vt, P-HV High Vt) forming regions and exposing the rest region is formed.

Figure 30B:
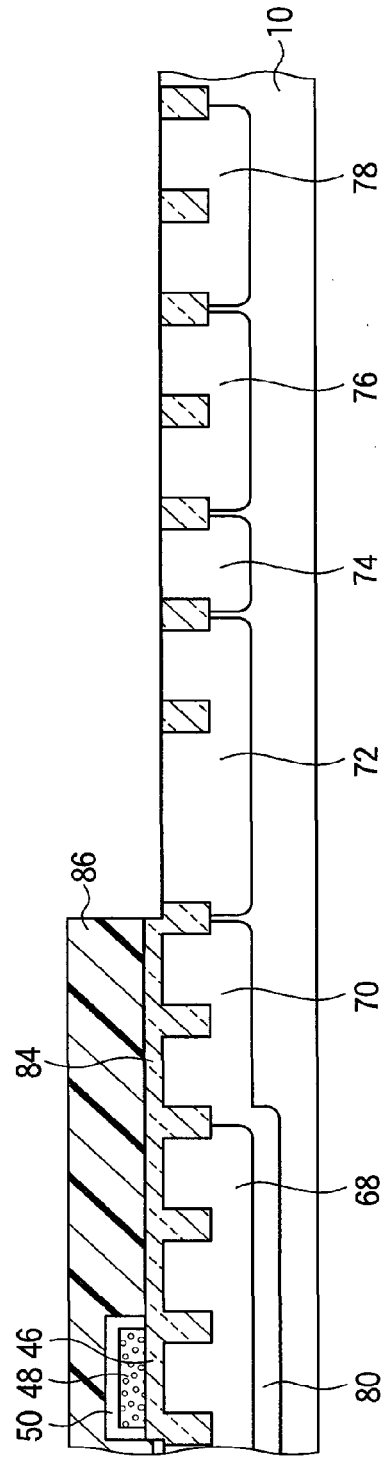

Then, by, e.g., wet etching using hydrofluoric acid aqueous solution and with the photoresist film 86 as the mask, the silicon oxide film 84 is etched to remove the silicon oxide film 84 in the ESD protection element (N-MV ESD) forming region, the middle voltage transistor (N-MV, P-MV) forming regions and the low voltage transistor (N-LV Low Vt, N-LV High Vt, P-LV Low Vt, P-LV High Vt) forming regions (FIG. 30B).

Next, by, e.g., asking, the photoresist film 86 is removed.

Then, thermal oxidation of 850° C., for example, is made to form a 6 nm-thickness silicon oxide film 88 on the active regions of the middle voltage transistor (N-MV, P-MV) forming regions and the low voltage transistor (N-LV Low Vt, N-LV High Vt, P-LV Low Vt, P-LV High Vt) forming regions. In this thermal oxidation step, the film thickness of the silicon oxide film 84 is also increased.

Figure 31A:
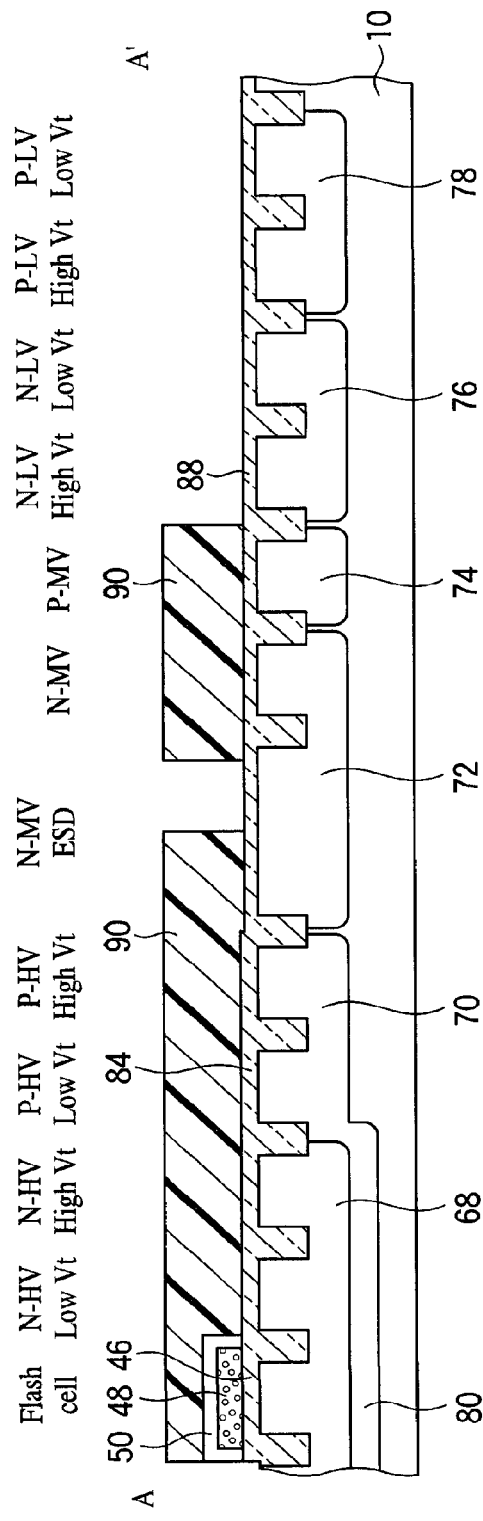
Figure 31B:
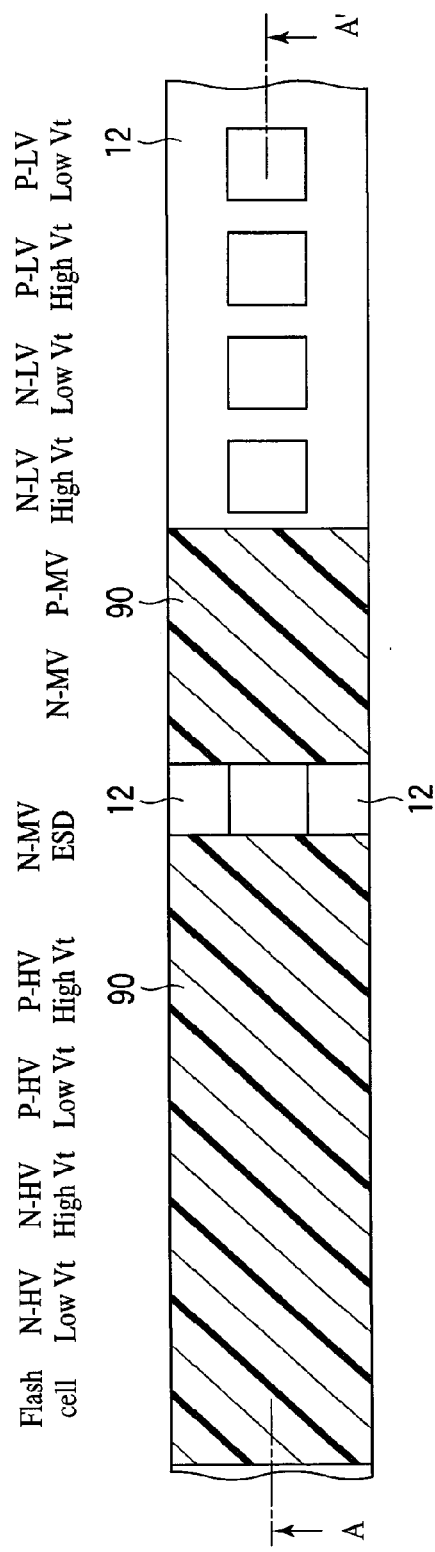
FIG. 31B is a plan view showing the method of manufacturing the semiconductor device according to the third embodiment of the present invention.

Next, by photolithography, a photoresist film 90 covering the flash memory cell (Flash Cell) forming region, the high voltage transistor (N-HV Low Vt, N-HV High Vt, P-HV Low Vt, P-HV High Vt) forming regions and the middle voltage transistor (N-MV, P-MV) forming region and exposing the ballast resistor forming region of the ESD protection element (N-MV ESD) and the low voltage transistor (N-LV Low Vt, N-LV High Vt, P-LV Low Vt, P-LV High Vt) forming regions is formed (FIGS. 31A and 31B).

Next, by, e.g., wet etching using hydrofluoric acid aqueous solution and with the photoresist film 90 as the mask, the silicon oxide film 88 is etched to remove the silicon oxide film 88 in the ballast resistor forming region of the ESD protection element (N-MV ESD) and the low voltage transistor (N-LV Low Vt, N-LV High Vt, P-LV Low Vt, P-LV High Vt) forming regions.

Next, by, e.g., asking, the photoresist film 90 is removed (FIG. 32A).

Then, thermal oxidation of 850° C., for example, is made to form the gate insulating film 92 of a 2.2 nm-thickness silicon oxide film on the active regions of the ballast resistor forming region of the ESD protection element (N-MV ESD) and the low voltage transistor (N-LV Low Vt, N-LV High Vt, P-LV Low Vt, P-LV High Vt) forming regions. In this thermal oxidation step, the film thickness of the silicon oxide films 84, 88 is increased. In the high voltage transistor (N-HV Low Vt, N-HV High Vt, P-HV Low Vt, P-HV High Vt) forming regions, the gate insulating film 94 is formed in a 16 nm-total film thickness, and in the region of the ESD protection element (N-MV ESD) forming region other than the ballast resistor forming region and the middle voltage transistor (N-MV, P-MV) forming regions, the gate insulating film 96 is formed in an 8 nm-total film thickness (FIG. 32B).

Next, by CVD method, e.g., a 180 nm-thickness polycrystalline silicon film 98 is grown.

Then, by plasma CVD method, a 30 nm-thickness silicon nitride film 100 is grown on the polycrystalline silicon film 98. The silicon nitride film 100 is for the anti-reflection and the etching mask in patterning the lower polycrystalline silicon film 98 and also functions to protect the gate electrode of the logic circuit in oxidizing the side walls of the gate electrode of the flash cell which will be described later.

Next, by photolithography and dry etching, the silicon nitride film 100, the polycrystalline silicon film 98, the ONO film 50 and the floating gate 48 in the flash memory cell (Flash Cell) forming region are patterned to form the control gate electrode 102 of the polycrystalline silicon film 98, etc. of the flash memory cell (Flash Cell) (FIG. 33A).

Then, thermal oxidation corresponding to about 10 nm is made to form a silicon oxide film (not shown) on the side walls of the control gate 102 and the floating gate 48 of the flash memory cell (Flash Cell).

Next, with the control gate electrode 102 as the mask, ion implantation is made to form the source/drain regions 104 in the silicon substrate 10 on both sides of the control gate 102 (FIG. 33B). The source/drain regions 104 are formed, e.g., by ion implanting arsenic ions with a 50 keV acceleration energy and in a $6.0 \times 10^{14}$ cm$^{-2}$ dose.

Then, thermal oxidation corresponding to about 10 nm, for example, is again made to form a silicon oxide film (not shown) on the side walls of the control gate 102 and the floating gate 48 of the flash memory cell (Flash Cell). The thermal oxidation of the side walls of the control gate electrode 102 and the floating gate 48 is mainly for improving the charge retaining characteristics of the flash memory cell (Flash Cell).

Figure 34A:
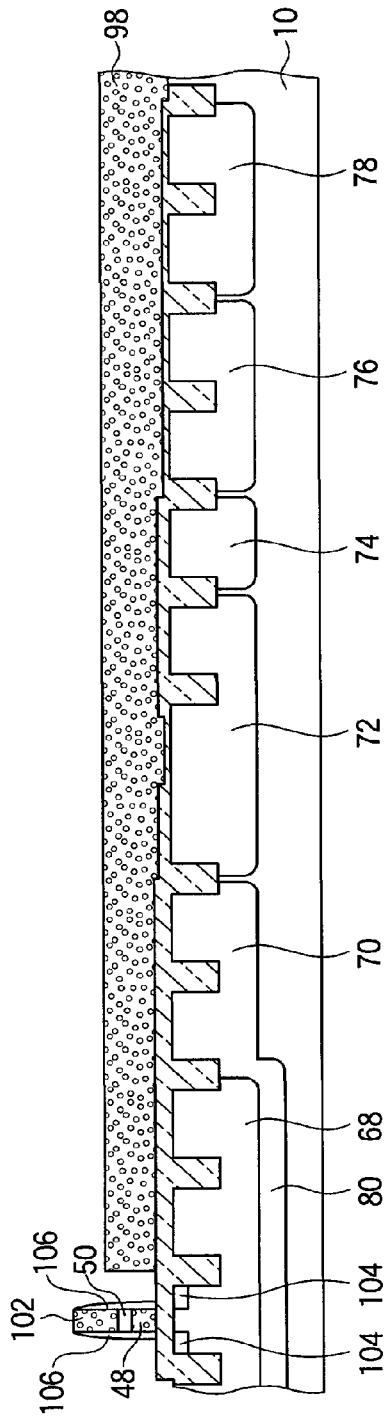

Next, over the entire surface, by, e.g., thermal CVD method, a 100 nm-thickness silicon nitride film, for example, is deposited, and this silicon nitride film and the silicon nitride film 100 are etched back to form the sidewall spacer 106 of the silicon nitride film on the side walls of the control gate electrode 102 (FIG. 34A).

Figure 34B:
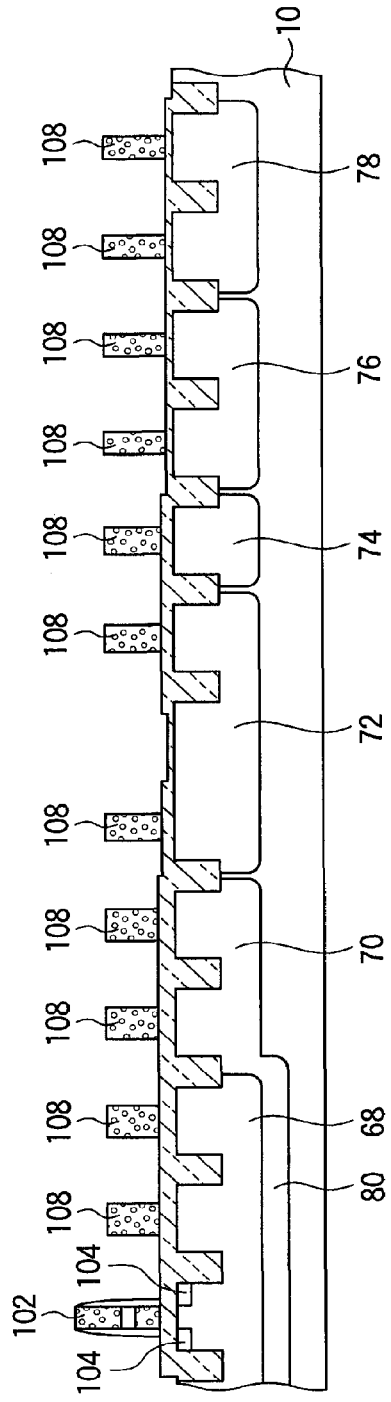

Next, by photolithography and dry etching, the polycrystalline silicon film 98 in the high voltage transistor (N-HV Low Vt, N-HV High Vt, P-HV Low Vt, P-HV High Vt) forming regions, ESD protection element (N-MV ESD)

forming region, the middle voltage transistor (N-MV, P-MV) forming regions and the low voltage transistor (N-LV Low Vt, N-LV High Vt, P-LV Low Vt, P-LV High Vt) forming regions is patterned to form the gate electrodes 108 of the polycrystalline silicon film 98 (FIG. 34B).

Next, by photolithography, a photoresist film 110 exposing the ESD protection element (N-MV ESD) forming region and the n-channel middle voltage transistor (N-MV) forming region and covering the rest region is formed.

Then, with the gate electrode 108 and the photoresist film 110 as the mask, ion implantation is made to form the extension regions 112 in the ESD protection element (N-MV ESD) forming region and the n-channel middle voltage transistor (N-MV) forming region (FIG. 35A). The extension regions 112 are formed, e.g., by ion implanting phosphorus ions under the conditions of a 35 keV acceleration energy and a $4 \times 10^{13}$ cm$^{-2}$ dose.

Next, by, e.g., ashing, the photoresist film 110 is removed.

Next, by photolithography, a photoresist film 114 exposing the p-channel middle voltage transistor (P-MV) forming region and covering the rest region is formed.

Then, with the gate electrodes 108 and the photoresist film 114 as the mask, ion implantation is made to form the extension regions 116 in the p-channel middle voltage transistor (P-MV) forming region (FIG. 35B). The extension regions 116 are formed, e.g., by ion implanting boron difluoride ions under the conditions of a 10 keV acceleration energy and a $4 \times 10^{13}$ cm$^{-2}$ dose.

Then, by, e.g., ashing, the photoresist film 114 is removed.

Next, by photolithography, a photoresist film 118 exposing the ballast resistor forming region of the ESD protection element (N-MV ESD) and the n-channel low voltage (N-LV Low Vt, N-LV High Vt) forming regions and covering the rest region is formed.

Figure 36A:
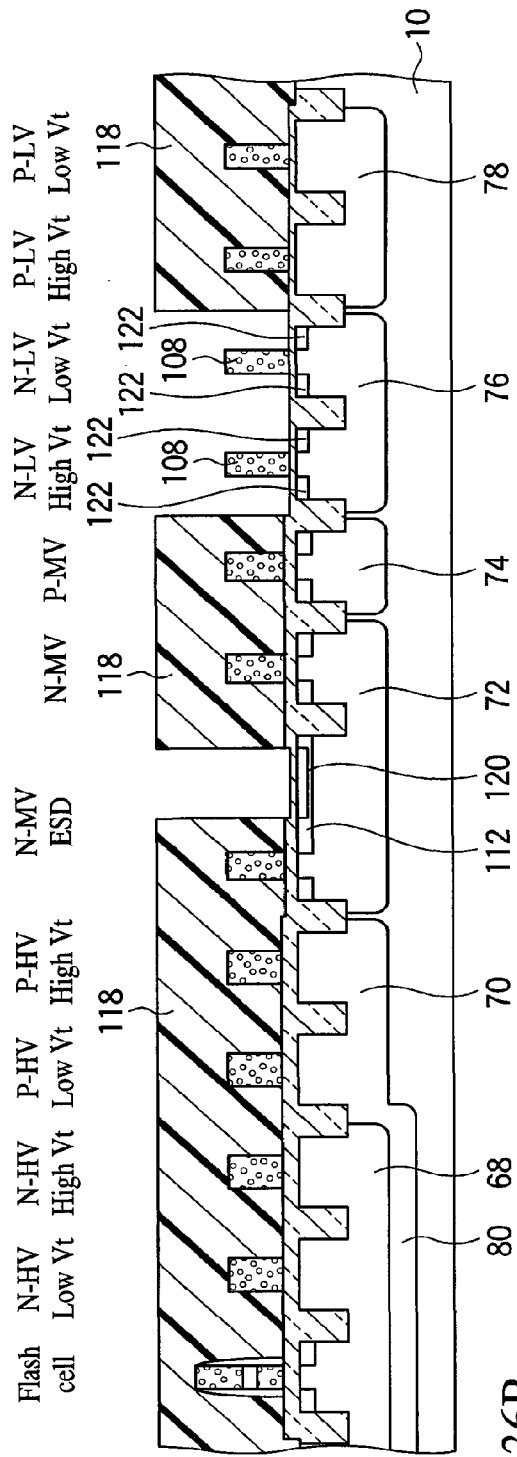

Then, with the gate electrodes 108 and the photoresist film 118 as the mask, ion implantation is made to form the extension regions 122 in the ballast resistor forming region of the ESD protection element (N-MV ESD) and the n-channel low voltage transistor (N-LV High Vt, N-LV Low Vt) forming regions. The extension regions 122 are formed by, e.g., ion implanting arsenic ions with a 3 keV acceleration energy and in a $1.2 \times 10^{15}$ cm$^{-2}$ dose and boron difluoride ions (BF$_2$$^+$) with an 80 keV acceleration energy and in an $6.0 \times 10^{12}$ cm$^{-2}$ dose in 4 directions tilted by 28 degrees to the substrate normal. Thus, extension regions 122 have pocket regions. In the ballast resistor forming region, an impurity doped layer 120 for the ballast resistor, which is formed of the extension regions 112, 122 is formed (FIG. 36A).

At this time, on the ballast resistor forming region, the gate insulating film 92 for the low voltage transistors which is thinner than the gate insulating film 96 for the middle voltage transistors is formed. The film thickness of the gate insulating film 92 for the low voltage transistors is initially 2.2 nm, which is extremely small in comparison with the 8 nm-thickness gate insulating film 96 of the middle voltage transistors. The gate insulating film 92 in this region is often etched in patterning the polycrystalline silicon film and becomes further thin. Thus, the fluctuation of the film thickness of the gate insulating film 92 on the ballast resistor forming region can be very small.

Accordingly, fluctuations of the film thickness of the residual gate insulating film 92 in the ballast resistor forming region can be suppressed very small, and fluctuations of the impurity concentration of the extension regions 122 in the ballast resistor forming region, which are formed through the gate insulating film 92, can be largely suppressed.

Because of the very thin extension regions of the low voltage transistors, when the extension regions 122 are formed through the gate insulating film 96 for the middle voltage transistors, as in the method of manufacturing the semiconductor device according to the first embodiment, the peak of the impurity concentration is positioned in the gate insulating film 96 (refer to FIG. 21A).

However, the extension regions 122 are formed through the gate insulating film 92 for the low voltage transistors are formed, as in the method of manufacturing the semiconductor device according to the present embodiment, whereby the peak of the impurity concentration is positioned in the silicon substrate 10 (refer to FIG. 21B), and fluctuations of the impurity concentration with respect to fluctuations of the gate insulating film 92 can be suppressed small.

Thus, the ESD protection element having sufficient ESD immunity can be stably formed.

Next, by, e.g., ashing, a photoresist film 118 is removed.

Next, by photolithography, a photoresist film 124 exposing the p-channel low voltage transistor (P-LV Low Vt, P-LV High Vt) forming regions and covering the rest region is formed.

Figure 36B:
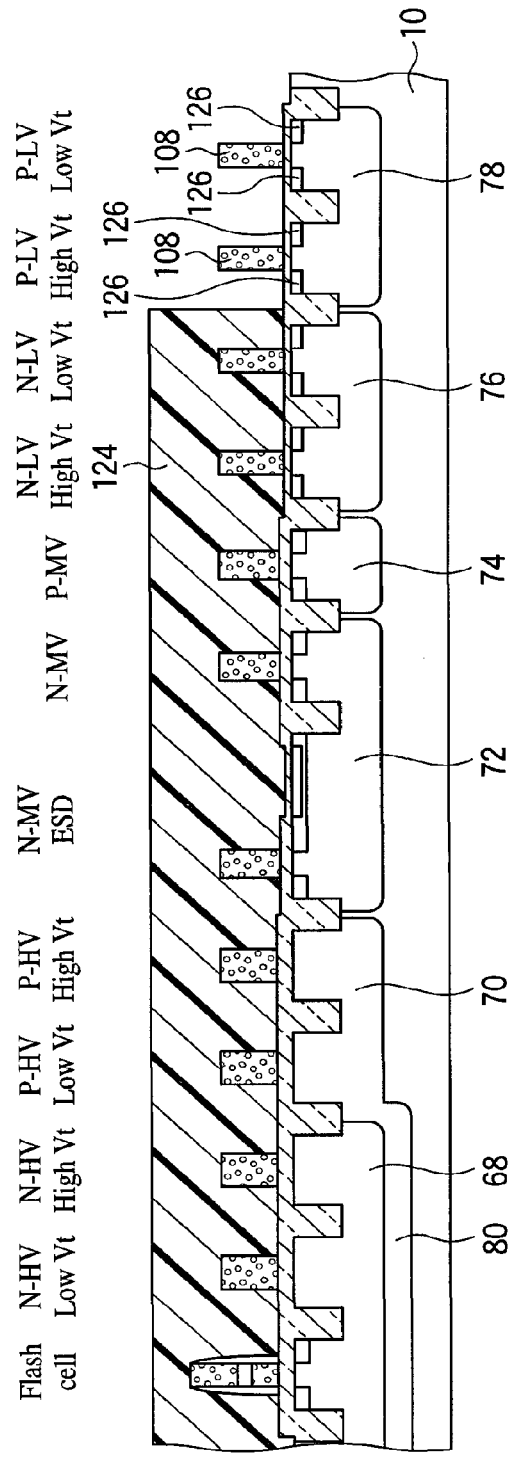

Next, with the gate electrodes 108 and the photoresist film 124 as the mask, ion implantation is made to form the extension regions 126 in the p-channel low voltage/high threshold voltage transistor (P-LV High Vt) forming region and the p-channel low voltage/low threshold voltage transistor (P-LV Low Vt) forming region (FIG. 36B). The extension regions 126 are formed, e.g., by ion implanting boron ions with a 0.5 keV acceleration energy and in a $5.7 \times 10^{14}$ cm$^{-2}$ dose and arsenic ions with a 120 keV acceleration energy and in a $7.0 \times 10^{12}$ cm$^{-2}$ dose in 4 directions tilted by 28 degrees to the substrate normal. Thus, extension regions 126 have pocket regions.

Then, by, e.g., ashing, the photoresist film 124 is removed.

Next, by photolithography, a photoresist film 128 exposing the n-channel high voltage transistor (N-HV Low Vt, N-HV High Vt) forming regions and covering the rest region is formed.

Figure 37A:
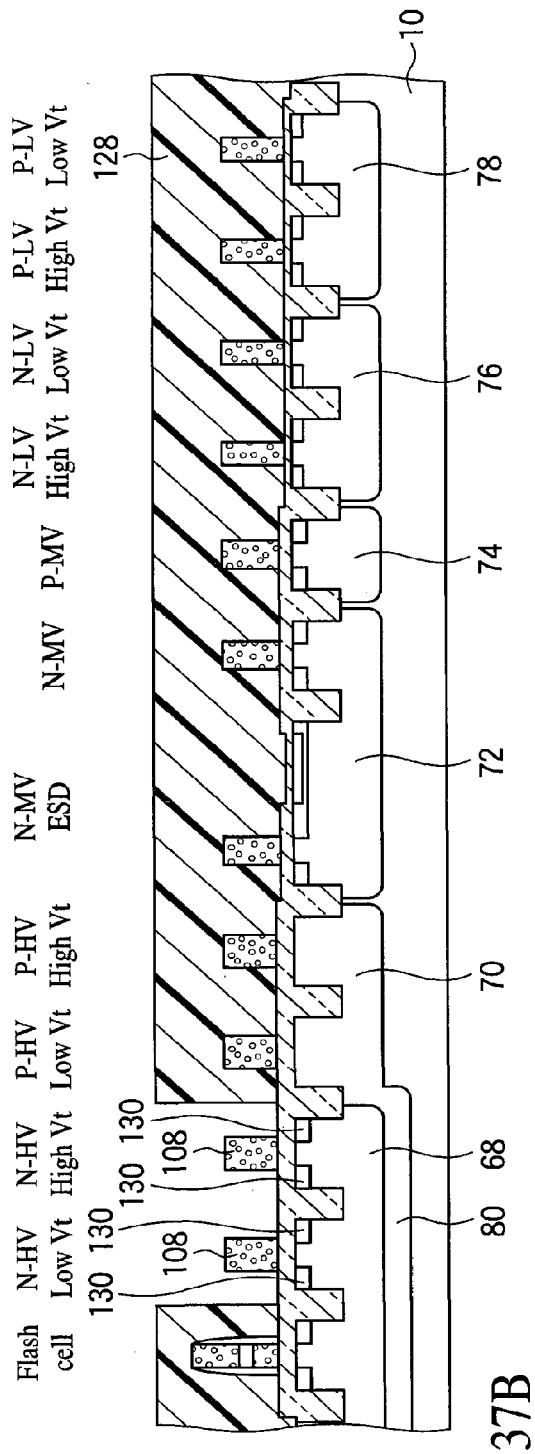

Then, with the gate electrodes 108 and the photoresist film 128 as the mask, ion implantation is made to form the extension regions 130 of the source/drain regions of the n-channel high voltage/low threshold voltage transistor (N-HV Low Vt) and the n-channel high voltage/high threshold voltage transistor (N-HV High Vt) (FIG. 37A). The extension regions 130 are formed, e.g., by ion implanting arsenic ions with a 120 keV acceleration energy and in a $6.0 \times 10^{12}$ cm$^{-2}$ dose in 4 directions tilted by 28 degrees to the substrate normal.

Next, by, e.g., ashing, the photoresist film 128 is removed.

Next, by photolithography, a photoresist film 132 exposing the p-channel high voltage transistor (P-HV Low Vt, P-HV High Vt) forming regions and covering the rest region is formed.

Figure 37B:
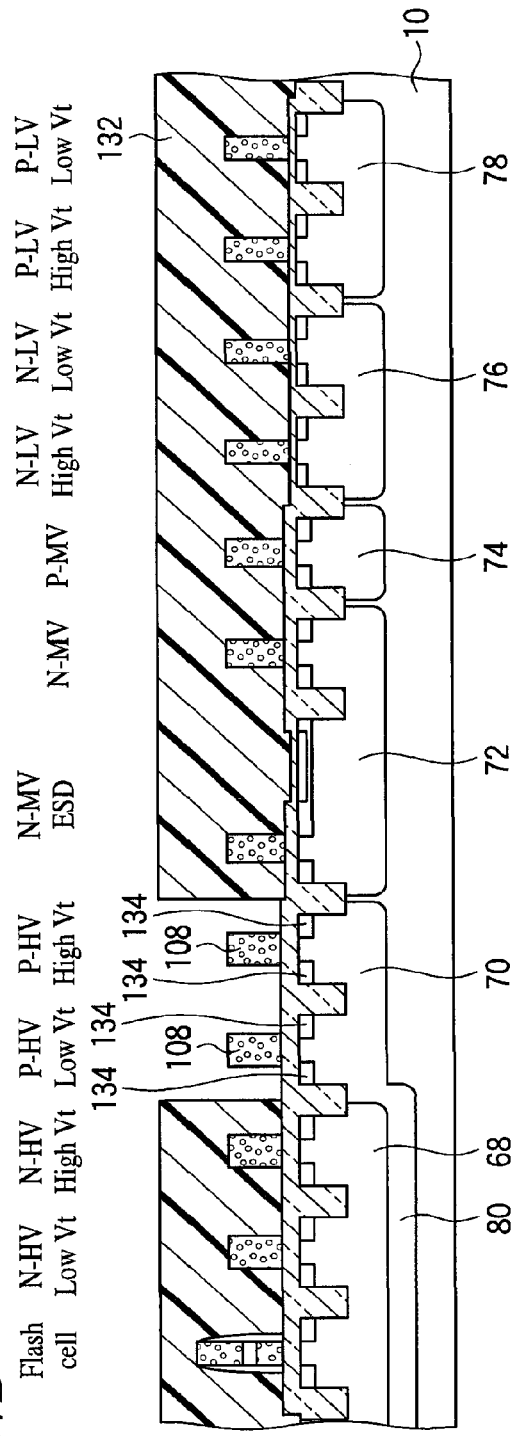

Next, with the photoresist film 132 as the mask, ion implantation is made to form the extension regions 134 of the source/drain regions of the p-channel high voltage/low threshold voltage transistor (P-HV Low Vt) and the p-channel high voltage/high threshold voltage transistor (P-HV High Vt) (FIG. 37B). The extension regions 134 are formed, by ion implanting boron difluoride ions (BF$_2$$^+$) with an 80 keV acceleration energy and in a $4.5 \times 10^{12}$ cm$^{-2}$ dose in 4 direction tilted by 28 degrees to the substrate normal.

Next, by, e.g., ashing, the photoresist film 132 is removed.

Next, over the entire surface, by, e.g., thermal CVD method, a 130 nm-thickness silicon oxide film 136, for example, is deposited.

Figure 38A:
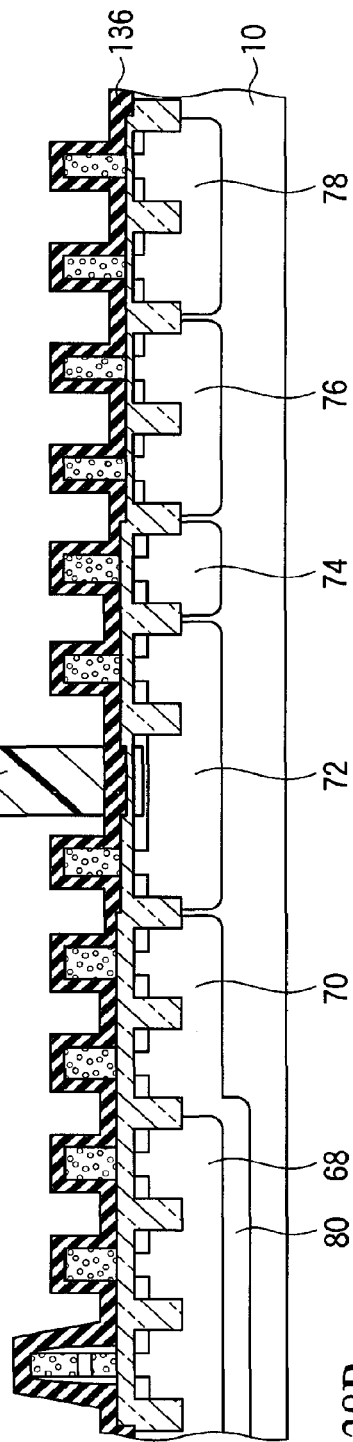

Next, by photolithography, a photoresist film 138 covering the ballast resistor forming region and exposing the rest region is formed (FIG. 38A).

Next, with the photoresist film 138 as the mask, the silicon oxide film 136 is etched back to form the sidewall spacer 144 of the silicon oxide film 136 on the side walls of the control gate electrode 102, the floating gate 48 and the gate electrodes 108, and form the salicide block 146 of the silicon oxide film 136 in the ballast resistor forming region.

The gate insulating film 92 below the salicide block 146 in the ballast resistor forming region has been formed concurrently with the gate insulating film 92 of the low voltage transistors. The gate insulating film 92 is often a little etched by the over-etching in patterning the polycrystalline silicon film. The film thickness of the gate insulating film 92 below the salicide block is not more than the film thickness of the gate insulating film 92 of the low voltage transistors.

When the over-etching in patterning the polycrystalline silicon film is considered, the silicon oxide film 136 forming the sidewall spacer 144 and salicide block 146 is formed on the gate insulating film 92 having the film thickness decreased. Accordingly, the film thickness of the gate insulating film 92 below the salicide block 146 in the ballast resistor forming region is the same as the film thickness of the gate insulating film 92 below the sidewall spacer 144 formed on the side walls of the gate electrodes 108 of the low voltage transistors.

Figure 38B:
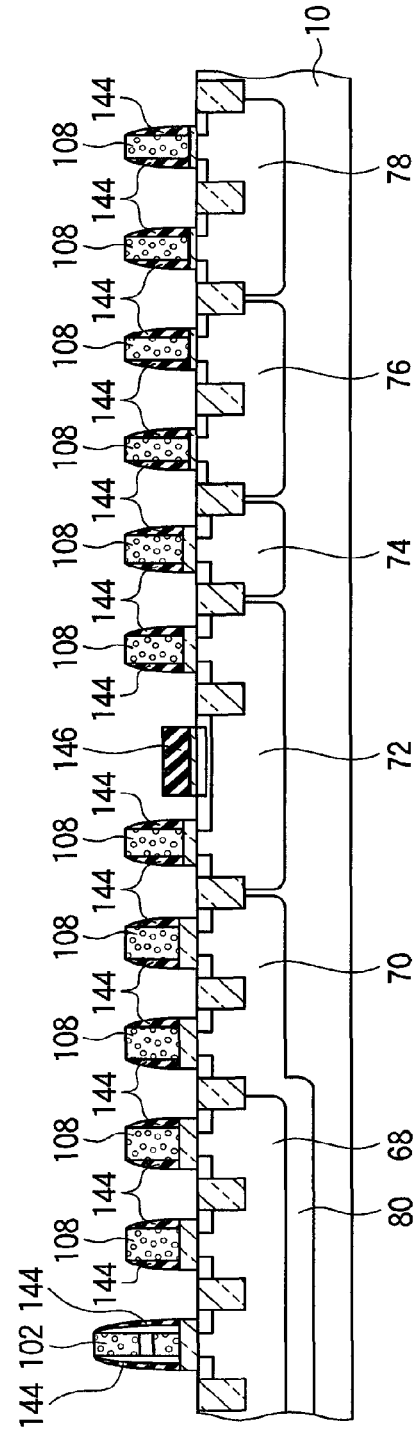

Next, by, e.g., asking, the photoresist film 128 is removed (FIG. 38B).

Next, by photolithography, a photoresist film 148 exposing the p-channel transistor (P-HV Low Vt, P-HV High Vt, P-MV, P-LV High Vt, P-LV Low Vt) forming regions and covering the rest region is formed.

Then, with the photoresist film 148, the gate electrode 108 and the sidewall spacer 144 as the mask, ion implantation is made to form the source/drain regions 150 of the p-channel transistors (P-HV Low Vt, P-HV High Vt, P-MV, P-LV High Vt, P-LV Low Vt) (FIG. 39A). Concurrently with this, by this ion implantation, the gate electrodes 108 of the p-channel transistors (P-HV Low Vt, P-HV High Vt, P-MV, P-LV High Vt, P-LV Low Vt) are doped to be p-type. The source/drain regions 150 are formed, e.g., by ion implanting boron ions under the conditions of a 5 keV acceleration energy and a $4.0 \times 10^{15}$ cm$^{-2}$.

Then, by, e.g., asking the photoresist film 148 is removed.

Next, by photolithography, a photoresist film 152 exposing the flash memory cell (Flash Cell) forming region and the n-channel transistor (N-HV Low Vt, N-HV High Vt, N-MV ESD, N-MV, N-LV High Vt, N-LV Low Vt) forming regions and covering the rest region is formed.

Next, with the photoresist film 152, the control gate electrode 102, the gate electrode 108, the sidewall spacer 144 and the salicide block 146 as the mask, ion implantation is made to form the source/drain regions 154 of the flash memory cell (Flash Cell), the n-channel transistor (N-HV Low Vt, N-HV High Vt, N-MV ESD, N-MV, N-LV High Vt, N-LV Low Vt) (FIG. 39B). Concurrently with this, by this ion implantation, the control gate electrode 102 of the flash memory cell (Flash Cell) and the gate electrodes 108 of the n-channel transistors (N-HV Low Vt, N-HV High Vt, N-MV ESD, N-MV, N-LV High Vt, N-LV Low Vt) are doped to be n-type. The source/drain regions 154 are formed, by ion implanting phosphorus ions under the conditions of a 10 keV acceleration energy and a $6.0 \times 10^{15}$ cm$^{-2}$ dose.

Next, by, e.g., asking, the photoresist film 152 is removed.

Figure 40A:
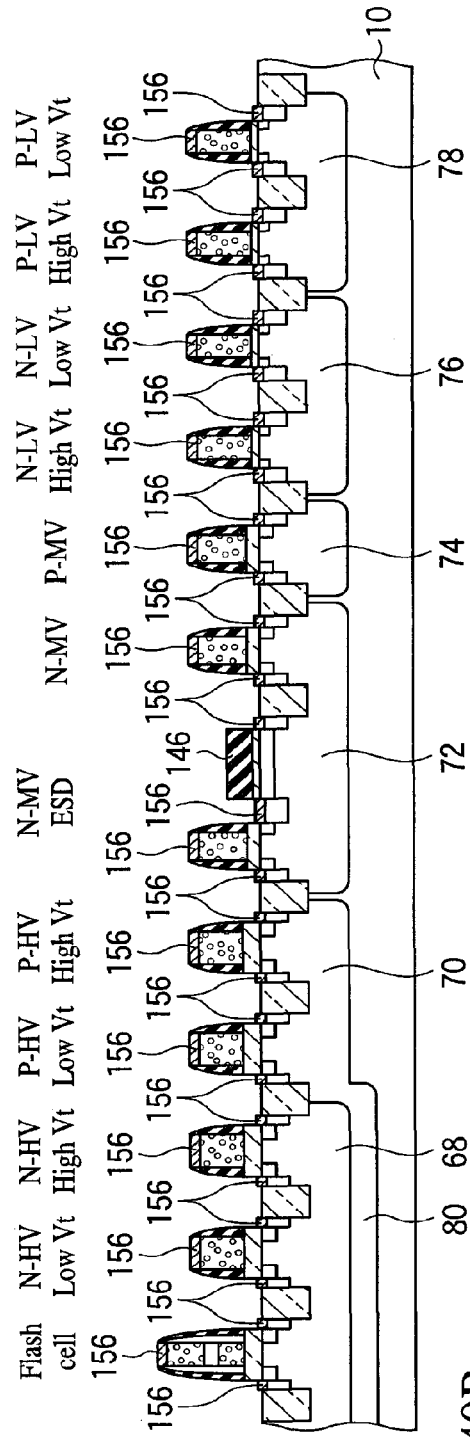

Next, by the known salicide process, the tops of the control gate 102, the gate electrodes 108 and the tops of the source/drain regions 150, 154 are selectively silicidized to form a silicide film 156 on the control gate electrode 102, the gate electrodes 108 and the source/drain regions 150, 154 (FIG. 40A). For example, first, by pre-wet processing, the silicon oxide film, etc., remaining on the active regions are removed. Next, a cobalt (Co) film and titanium nitride (TiN) film are deposited over the entire surface. Next, by rapid thermal processing, the tops of the control gate electrode 102, the gate electrodes 108 and the source/drain regions 150, 154, where the silicon is exposed, are selectively silicidized to form cobalt silicide film in the regions. Then, the unreacted cobalt film and the titanium nitride film are removed. Next, rapid thermal processing is again made to make the cobalt silicide film low resistive. Thus, the silicide film 156 of the cobalt silicide film is formed.

At this time, because of the salicide block 146 formed in the ballast resistor forming region, the silicide film 156 is not formed in the ballast resistor forming region.

Thus, over the silicon substrate 10, the ESD protection element and the eleven kinds of transistors are completed.

Figure 40B:
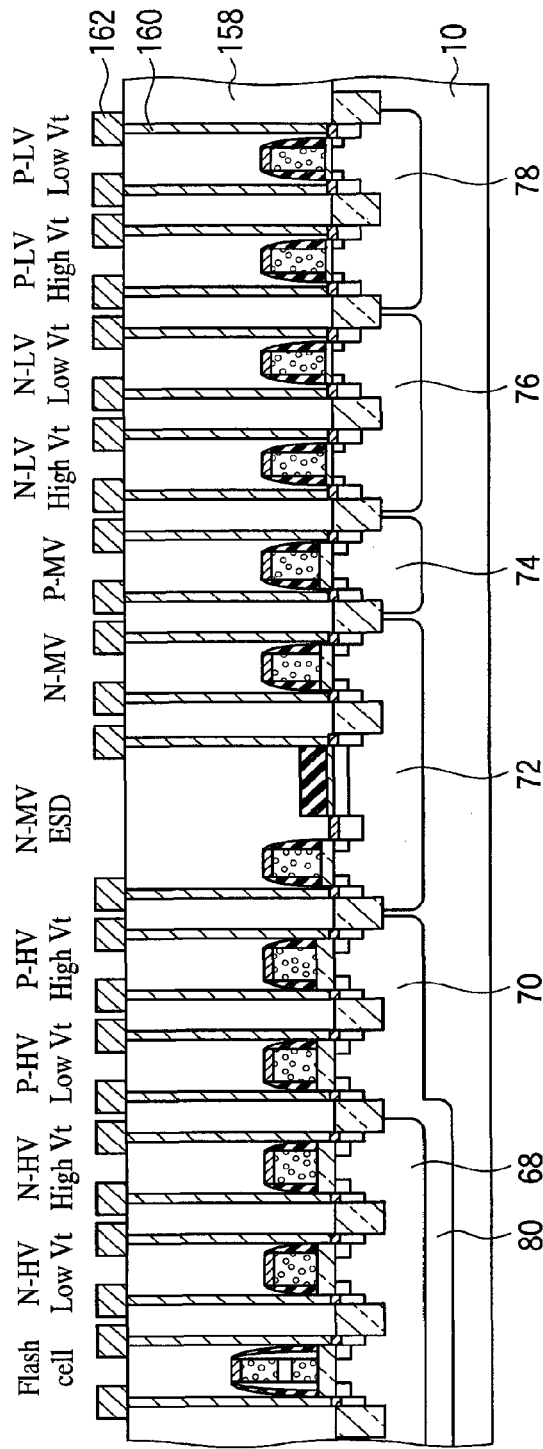

Next, over the silicon substrate 10 with the transistors, etc. formed, an insulating film 158 is grown, and then the electrode plugs 160, the interconnections 162, etc. are formed, and the structure up to the first level metal interconnection is completed (FIG. 40B).

As described above, according to the present embodiment, the ballast resistor of the ESD protection element is formed of the impurity doped layer forming the extension regions of the source/drain regions of the low voltage transistors and the impurity doped layer forming the extension regions of the source/drain regions of the middle voltage transistors, whereby no additional ion implantation step specialized for forming the ballast resistor is necessary. Thus the ballast resistor can be realized without complicating the manufacturing steps.

The impurity doped layers forming the ballast resistor are formed by ion implantation through the thin insulating film formed concurrently with the gate insulating film 92 of the low voltage transistors, whereby the ballast resistance value and the ESD immunity can be more stabilized.

Modified Embodiments

The present invention is not limited to the above-described embodiments and can cover other various modifications.

For example, in the above-described embodiments, the silicide film 156 is formed on the control gate electrode 102, on the gate electrodes 108 and on the source/drain regions 150, 154 but may not be formed on the control gate electrode 102 and on the gate electrodes 108.

In the case that salicide process is not used, it is not necessary to form the salicide block 146. In this case, when source/drain regions 154 are formed, the ballast resistor forming region may be covered by the photoresist film 152.

In the above-described embodiments, the present invention is applied to the ESD protection element comprising an n-channel MIS transistor including a ballast resistor but is applicable to the ESD protection element comprising a p-channel MIS transistor including a ballast resistor.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

INDUSTRIAL APPLICABILITY

The semiconductor device and the method of manufacturing the same according to the present invention realize an ESD protection element including a prescribed ballast resistor without complicating the manufacturing steps and can suppress the fluctuations of the ballast resistance value and the ESD immunity. The present invention is very useful to improve the device characteristics and the manufacturing yield of the semiconductor device comprising an ESD protection element of a MIS transistor including a ballast resistor.

What is claimed is:

1. A semiconductor device comprising:
   a first MIS transistor formed over a semiconductor substrate and including a first gate insulating film, a first gate electrode formed on the first gate insulating film, and first source/drain regions formed in the semiconductor substrate and including LDD regions or extension regions formed in alignment with the first gate electrode;
   a ballast resistor formed in the semiconductor substrate and connected to one of the first source/drain regions; and
   a salicide block insulating film formed over the ballast resistor with an insulating film thinner than the first gate insulating film interposed therebetween,
   wherein an impurity concentration of the ballast resistor beneath the insulating film is higher than an impurity concentration of the LDD regions or the extension regions of the first source/drain regions.

2. The semiconductor device according to claim 1, further comprising:
   a second MIS transistor formed over the semiconductor substrate and including a second gate insulating film thinner than the first gate insulating film, a second gate electrode formed on the second gate insulating film, and a second source/drain regions formed in the semiconductor substrate,
   wherein the insulating film is not more than a film thickness of the second gate insulating film.

3. The semiconductor device according to claim 2, wherein
   the first source/drain regions include a first impurity doped layer forming the LDD regions or the extension regions,
   the second source/drain regions include a second impurity doped layer formed in alignment with the second gate electrode, and
   the ballast resistor is formed of a third impurity doped layer formed concurrently with the first impurity doped layer, and a fourth impurity doped layer formed concurrently with the second impurity doped layer.

4. The semiconductor device according to claim 3, wherein the second impurity doped layer is LDD regions or extension regions of the second source/drain regions.

5. The semiconductor device according to claim 2,
   further comprising: a sidewall spacer formed on a side wall of the second gate electrode,
   a film thickness of the insulating film being the same as a film thickness of the second gate insulating film formed below the sidewall spacer.

* * * * *